United States Patent
Adib et al.

(10) Patent No.: US 10,837,103 B2
(45) Date of Patent: *Nov. 17, 2020

(54) SCRATCH-RESISTANT MATERIALS AND ARTICLES INCLUDING THE SAME

(71) Applicant: CORNING INCORPORATED, Corning, NY (US)

(72) Inventors: Kaveh Adib, Corning, NY (US); Robert Alan Bellman, Painted Post, NY (US); Charles Andrew Paulson, Painted Post, NY (US); James Joseph Price, Corning, NY (US)

(73) Assignee: Corning Incorporated, Corning, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/696,559

(22) Filed: Sep. 6, 2017

(65) Prior Publication Data

US 2017/0369992 A1 Dec. 28, 2017

Related U.S. Application Data

(62) Division of application No. 14/812,562, filed on Jul. 29, 2015, now Pat. No. 9,790,593.

(60) Provisional application No. 62/120,466, filed on Feb. 25, 2015, provisional application No. 62/068,853, filed on Oct. 27, 2014, provisional application No. 62/032,073, filed on Aug. 1, 2014.

(51) Int. Cl.
| | | |
|---|---|---|
| *C23C 16/30* | (2006.01) | |
| *C23C 16/36* | (2006.01) | |
| *C23C 16/40* | (2006.01) | |
| *C23C 16/34* | (2006.01) | |
| *C23C 16/32* | (2006.01) | |

(52) U.S. Cl.
CPC ............ *C23C 16/308* (2013.01); *C23C 16/30* (2013.01); *C23C 16/325* (2013.01); *C23C 16/345* (2013.01); *C23C 16/36* (2013.01); *C23C 16/402* (2013.01)

(58) Field of Classification Search
CPC ..... C23C 16/308; C23C 16/30; C23C 16/345; C23C 16/36; C23C 16/325; C23C 16/402
USPC ...................................................... 428/446
See application file for complete search history.

(56) References Cited

U.S. PATENT DOCUMENTS

| | | | |
|---|---|---|---|
| 3,922,068 A | 11/1975 | Uetsuki | |
| 3,934,691 A | 1/1976 | Itoh et al. | |
| 3,989,350 A | 11/1976 | Cohen et al. | |
| 4,033,667 A | 7/1977 | Fleming, Jr. | |
| 4,137,365 A | 1/1979 | Wydeven et al. | |
| 4,298,366 A | 11/1981 | Dabby et al. | |
| 4,310,595 A | 1/1982 | Beall et al. | |
| 4,423,925 A | 1/1984 | Dabby et al. | |
| 4,495,684 A | 1/1985 | Sander et al. | |
| 4,519,966 A | 5/1985 | Aldinger et al. | |
| 4,537,814 A | 8/1985 | Itoh et al. | |
| 4,568,140 A | 2/1986 | Van Der Werf et al. | |
| 4,571,519 A | 2/1986 | Kawabata et al. | |
| 4,826,734 A | 5/1989 | Jackson et al. | |
| 4,851,095 A | 7/1989 | Scobey et al. | |
| 4,995,684 A | 2/1991 | Tustison et al. | |
| 5,178,911 A | 1/1993 | Gordon et al. | |
| 5,234,769 A | 8/1993 | Shevlin | |
| 5,268,217 A | 12/1993 | Kimock et al. | |
| 5,300,951 A | 4/1994 | Yamazaki | |
| 5,332,888 A | 7/1994 | Tausch et al. | |
| 5,390,274 A | 2/1995 | Toyoda et al. | |
| 5,393,574 A | 2/1995 | Sulzbach | |
| 5,478,634 A | 12/1995 | Setoyama et al. | |
| 5,503,912 A | 4/1996 | Setoyama et al. | |
| 5,508,092 A | 4/1996 | Kimock et al. | |
| 5,567,363 A | 10/1996 | Jung et al. | |
| 5,635,245 A | 6/1997 | Kimock et al. | |
| 5,637,353 A | 6/1997 | Kimock et al. | |

(Continued)

FOREIGN PATENT DOCUMENTS

| | | | |
|---|---|---|---|
| AU | 766773 B2 | 10/2003 | |
| CN | 101019043 A | 8/2007 | |

(Continued)

OTHER PUBLICATIONS

Hui Lin Chang et al. "Characteristics of Si—C—N films deposited by microwave plasma CVD on Si wafers with various buffer layer materials", Diamond and Related Material,&npsp;2001, vol. 10, pp. 1910-1915, (Year: 2001).*

Xiangdong Xu et al. "Chemical control of physical properties in silicon nitride filnns",Applied Physics A: Materials Science & Processing, 2012, vol. III, pp. 867-876. (Year: 2012).*

(Continued)

*Primary Examiner* — Michael Bernshteyn

(57) ABSTRACT

Embodiments of this disclosure pertain to a coating material comprising silicon and/or aluminum, hydrogen and any two or more of oxygen, nitrogen, carbon, and fluorine. The coating material exhibits a hardness of about 17 GPa or greater and an optical band gap of about 3.5 eV or greater. In some embodiments, the coating material includes, in atomic %, silicon and/or aluminum in an amount of about 40 or greater, hydrogen in an amount in the range from about 1 to about 25, nitrogen in an amount of about 30 or greater, oxygen in an amount in the range from about 0 to about 7.5, and carbon in an amount in the range from about 0 to about 10. The coating material may optionally include fluorine and/or boron. Articles including the coating material are also described and exhibit an average transmittance of about 85% or greater over an optical wavelength regime in the range from about 380 nm to about 720 nm and colorlessness.

20 Claims, 28 Drawing Sheets

(56) References Cited

U.S. PATENT DOCUMENTS

| | | |
|---|---|---|
| 5,643,638 A | 7/1997 | Otto et al. |
| 5,718,773 A | 2/1998 | Shiozaki et al. |
| 5,719,705 A | 2/1998 | Machol |
| 5,766,783 A | 6/1998 | Utsumi et al. |
| 5,772,862 A | 6/1998 | Ando et al. |
| 5,773,148 A | 6/1998 | Charrue et al. |
| 5,846,650 A | 12/1998 | Ko et al. |
| 5,938,898 A | 7/1999 | Ando et al. |
| 5,935,716 A | 8/1999 | McCurdy et al. |
| 6,074,730 A | 6/2000 | Laird et al. |
| 6,077,569 A | 6/2000 | Knapp et al. |
| 6,088,166 A | 7/2000 | Lee |
| 6,114,043 A | 9/2000 | Joret |
| 6,129,980 A | 10/2000 | Tsukada et al. |
| 6,132,650 A | 10/2000 | Nakamura |
| 6,165,598 A | 12/2000 | Nelson |
| 6,166,125 A | 12/2000 | Sugiyama et al. |
| 6,172,812 B1 | 1/2001 | Haaland et al. |
| 6,174,599 B1 | 1/2001 | Phillippe et al. |
| 6,217,272 B1 | 4/2001 | Felsenthal et al. |
| 6,238,781 B1 | 5/2001 | Anderson et al. |
| 6,250,758 B1 | 6/2001 | Yoshihara et al. |
| 6,267,915 B1 | 7/2001 | Park et al. |
| 6,303,225 B1 | 10/2001 | Veerasamy |
| 6,337,771 B1 | 1/2002 | Chu et al. |
| 6,344,288 B1 | 2/2002 | Oyama et al. |
| 6,355,344 B1 | 3/2002 | Rondeau et al. |
| 6,395,333 B2 | 5/2002 | Veerasamy |
| 6,416,872 B1 | 12/2002 | Arbab et al. |
| 6,495,251 B1 | 12/2002 | Arbab et al. |
| 6,503,557 B1 | 1/2003 | Joret |
| 6,524,714 B1 | 2/2003 | Neuman et al. |
| 6,535,333 B1 | 3/2003 | Piepel et al. |
| 6,570,709 B2 | 5/2003 | Katayama et al. |
| 6,572,990 B1 | 6/2003 | Oyama et al. |
| 6,583,935 B1 | 6/2003 | Saif et al. |
| 6,596,368 B1 | 7/2003 | Liebig et al. |
| 6,605,358 B1 | 8/2003 | Stachowiak |
| 6,652,974 B1 | 11/2003 | Krisko |
| 6,707,610 B1 | 3/2004 | Woodard et al. |
| 6,730,352 B2 | 5/2004 | Stachowiak |
| 6,746,775 B1 | 6/2004 | Boire et al. |
| 6,783,253 B2 | 8/2004 | Thomsen et al. |
| 6,813,096 B2 | 11/2004 | Ohta |
| 6,838,179 B1 | 1/2005 | Legrand |
| 6,875,468 B2 | 4/2005 | Kunz et al. |
| 6,908,480 B2 | 6/2005 | Jayaraman |
| 6,924,037 B1 | 8/2005 | Joret et al. |
| 6,950,236 B2 | 9/2005 | Hokazono et al. |
| 6,998,177 B2 | 2/2006 | Krzyzak et al. |
| 7,005,188 B2 | 2/2006 | Anderson et al. |
| 7,018,727 B2 | 3/2006 | Dzick |
| 7,055,954 B2 | 6/2006 | Marechal |
| 7,156,533 B2 | 1/2007 | Hoeing |
| 7,166,360 B2 | 1/2007 | Coustet et al. |
| 7,189,456 B2 | 3/2007 | King |
| 7,229,684 B2 | 6/2007 | Enniss et al. |
| 7,332,213 B2 | 2/2008 | Mimura et al. |
| 7,351,447 B2 | 4/2008 | Nishida et al. |
| 7,378,146 B1 | 5/2008 | Hedrick et al. |
| 7,381,469 B2 | 6/2008 | Moelle et al. |
| 7,405,005 B2 | 7/2008 | Watanabe |
| 7,426,328 B2 | 9/2008 | Zhou et al. |
| 7,498,058 B2 | 3/2009 | Harris et al. |
| 7,521,123 B2 | 4/2009 | Hattori et al. |
| 7,541,102 B2 | 6/2009 | Klippe et al. |
| 7,569,269 B2 | 8/2009 | Takada et al. |
| 7,643,719 B1 | 1/2010 | Zhou et al. |
| 7,655,298 B2 | 2/2010 | Thies et al. |
| 7,724,241 B2 * | 5/2010 | Fukui .................... G06F 3/045 345/173 |
| 7,736,728 B2 | 6/2010 | Loboda et al. |
| 7,736,824 B2 | 6/2010 | Yoshikawa et al. |
| 7,910,215 B2 | 3/2011 | Reymond et al. |
| 7,926,939 B2 | 4/2011 | Kato et al. |
| 7,978,402 B2 | 7/2011 | Sweeney et al. |
| 8,062,749 B2 | 11/2011 | Shelestak et al. |
| 8,067,094 B2 | 11/2011 | Benson et al. |
| 8,088,502 B2 | 1/2012 | Martin et al. |
| 8,118,896 B2 | 2/2012 | Can et al. |
| 8,187,671 B2 | 5/2012 | Sol |
| 8,236,433 B2 | 8/2012 | Chiu et al. |
| 8,273,801 B2 | 9/2012 | Baikerikar et al. |
| 8,304,078 B2 | 11/2012 | Varshneya |
| 8,312,739 B2 | 11/2012 | Lee et al. |
| 8,360,574 B2 | 1/2013 | Ishak et al. |
| 8,383,214 B2 | 2/2013 | Schaepkens et al. |
| 8,400,592 B2 | 3/2013 | Hirakata et al. |
| 8,409,716 B2 | 4/2013 | Schultz et al. |
| 8,425,035 B2 | 4/2013 | Von Blanckenhagen |
| 8,432,611 B1 | 4/2013 | Wach |
| 8,445,112 B2 | 5/2013 | Di Stefano |
| 8,446,673 B2 | 5/2013 | Yoshihara |
| 8,460,804 B2 | 6/2013 | Henn et al. |
| 8,508,703 B2 | 8/2013 | Lee et al. |
| 8,561,429 B2 | 10/2013 | Allan et al. |
| 8,679,631 B2 | 3/2014 | Murata |
| 8,691,351 B2 | 4/2014 | Asakura et al. |
| 8,746,880 B2 | 6/2014 | Fukagawa et al. |
| 8,753,744 B2 | 6/2014 | Borrelli et al. |
| 8,784,933 B2 | 7/2014 | Krzyak et al. |
| 8,840,257 B2 | 9/2014 | Kawagishi et al. |
| 8,842,365 B2 | 9/2014 | Koike et al. |
| 8,854,623 B2 | 10/2014 | Fontaine et al. |
| 9,014,885 B2 | 4/2015 | Barnes et al. |
| 9,023,457 B2 | 5/2015 | Carrilero et al. |
| 9,042,019 B2 | 5/2015 | Su et al. |
| 9,079,802 B2 | 7/2015 | Bellman et al. |
| 9,110,230 B2 | 8/2015 | Koch, III et al. |
| 9,249,049 B2 | 2/2016 | Fujii |
| 9,296,648 B2 | 3/2016 | Henn et al. |
| 9,335,444 B2 | 5/2016 | Hart et al. |
| 9,359,261 B2 | 6/2016 | Bellman et al. |
| 9,366,784 B2 | 6/2016 | Bellman et al. |
| 9,411,180 B2 | 8/2016 | Gollier et al. |
| 9,573,842 B2 | 2/2017 | Gollier et al. |
| 9,574,262 B2 | 2/2017 | Henn et al. |
| 9,663,400 B2 | 5/2017 | O'Malley et al. |
| 9,684,097 B2 | 6/2017 | Koch, III et al. |
| 9,701,579 B2 | 7/2017 | Gollier et al. |
| 9,726,786 B2 | 8/2017 | Hart et al. |
| 9,957,609 B2 | 5/2018 | Lee et al. |
| 2001/0002295 A1 | 5/2001 | Anderson et al. |
| 2001/0016262 A1 | 8/2001 | Toyoshima et al. |
| 2001/0017452 A1 | 8/2001 | Bernard et al. |
| 2001/0031365 A1 | 10/2001 | Anderson et al. |
| 2002/0009593 A1 | 1/2002 | Veerasamy |
| 2002/0017452 A1 | 2/2002 | Zimmermann et al. |
| 2002/0051274 A1 | 5/2002 | Kim et al. |
| 2002/0136908 A1 | 9/2002 | Komatsu et al. |
| 2003/0019363 A1 | 1/2003 | Grover et al. |
| 2003/0031879 A1 | 2/2003 | Neuman et al. |
| 2003/0035044 A1 | 2/2003 | Nakayama et al. |
| 2003/0116270 A1 * | 6/2003 | Hawa .................... G02B 1/111 156/307.1 |
| 2003/0193636 A1 | 10/2003 | Allen et al. |
| 2004/0065968 A1 | 4/2004 | Klemm et al. |
| 2004/0147185 A1 | 7/2004 | Decroupet |
| 2004/0258947 A1 | 12/2004 | Moelle et al. |
| 2005/0012569 A1 | 1/2005 | Sasaki |
| 2005/0074591 A1 | 4/2005 | Zagdoun |
| 2005/0084705 A1 | 4/2005 | Klippe et al. |
| 2005/0123772 A1 | 6/2005 | Coustet et al. |
| 2005/0196632 A1 | 9/2005 | Maschwitz et al. |
| 2005/0233091 A1 | 10/2005 | Kumar et al. |
| 2006/0008656 A1 | 1/2006 | Veerasamy |
| 2006/0017707 A1 * | 1/2006 | Fukui .................... G06F 3/045 345/173 |
| 2006/0019119 A1 | 1/2006 | Spitsberg et al. |
| 2006/0093833 A1 | 5/2006 | Meyer et al. |
| 2006/0134436 A1 | 6/2006 | Maschwitz |
| 2006/0139783 A1 | 6/2006 | Decroupet |
| 2006/0154044 A1 | 7/2006 | Yamada et al. |
| 2006/0165963 A1 | 7/2006 | Fleury et al. |

(56) References Cited

U.S. PATENT DOCUMENTS

| | | |
|---|---|---|
| 2006/0197096 A1 | 9/2006 | Kerdiles et al. |
| 2006/0222863 A1 | 10/2006 | Nadaud et al. |
| 2006/0240266 A1 | 10/2006 | Schicht et al. |
| 2007/0018871 A1 | 1/2007 | Riley |
| 2007/0030569 A1 | 2/2007 | Lu et al. |
| 2007/0128528 A1 | 6/2007 | Hess et al. |
| 2007/0146887 A1 | 6/2007 | Ikeda et al. |
| 2007/0237918 A1 | 10/2007 | Jonza et al. |
| 2007/0285776 A1 | 12/2007 | Nakamura et al. |
| 2008/0024867 A1 | 1/2008 | Kawashima et al. |
| 2008/0032157 A1 | 2/2008 | Koekert et al. |
| 2009/0017314 A1 | 1/2009 | Nadaud et al. |
| 2009/0052041 A1 | 2/2009 | Watanabe et al. |
| 2009/0086778 A1 | 4/2009 | Kameyama et al. |
| 2009/0086783 A1 | 4/2009 | Kameyama et al. |
| 2009/0104385 A1 | 4/2009 | Reymond et al. |
| 2009/0141357 A1 | 6/2009 | Kamura et al. |
| 2009/0155490 A1 | 6/2009 | Bicker et al. |
| 2009/0195865 A1 | 8/2009 | Kleideiter et al. |
| 2009/0197048 A1 | 8/2009 | Amin et al. |
| 2009/0217968 A1 | 9/2009 | Joshi et al. |
| 2009/0223437 A1 | 9/2009 | Ballard |
| 2009/0297877 A1 | 12/2009 | Chang et al. |
| 2009/0298669 A1 | 12/2009 | Akiba et al. |
| 2009/0324844 A1 | 12/2009 | Haoto et al. |
| 2010/0009154 A1 | 1/2010 | Allan et al. |
| 2010/0027383 A1 | 2/2010 | Suzuki et al. |
| 2010/0028607 A1 | 2/2010 | Lee et al. |
| 2010/0047521 A1 | 2/2010 | Amin et al. |
| 2010/0062245 A1 | 3/2010 | Martin et al. |
| 2010/0119486 A1 | 5/2010 | Sakamoto et al. |
| 2010/0127154 A1 | 5/2010 | Kameyama |
| 2010/0183857 A1 | 7/2010 | Nouvelot et al. |
| 2010/0196685 A1 | 8/2010 | Murata et al. |
| 2010/0215950 A1 | 8/2010 | Schultz et al. |
| 2010/0247745 A1 | 9/2010 | Rudmann et al. |
| 2010/0291353 A1 | 11/2010 | Dejneka et al. |
| 2010/0304090 A1 | 12/2010 | Henn et al. |
| 2010/0311868 A1 | 12/2010 | Bekiarian et al. |
| 2010/0313875 A1 | 12/2010 | Kennedy |
| 2011/0033635 A1 | 2/2011 | Nishimoto et al. |
| 2011/0033681 A1 | 2/2011 | Adachi et al. |
| 2011/0043719 A1 | 2/2011 | Thunhorst et al. |
| 2011/0114160 A1 | 5/2011 | Murashige et al. |
| 2011/0120554 A1 | 5/2011 | Chhajed et al. |
| 2011/0151173 A1 | 6/2011 | Ramadas et al. |
| 2011/0157703 A1 | 6/2011 | Broadway et al. |
| 2011/0177241 A1 | 7/2011 | Lee et al. |
| 2011/0235181 A1 | 9/2011 | Hayashibe et al. |
| 2011/0262742 A1 | 10/2011 | Takeuchi et al. |
| 2011/0262754 A1 | 10/2011 | Zehentmaier et al. |
| 2012/0008217 A1 | 1/2012 | Ishak et al. |
| 2012/0027968 A1 | 2/2012 | Chang et al. |
| 2012/0040179 A1 | 2/2012 | Dave |
| 2012/0052271 A1 | 3/2012 | Gomez et al. |
| 2012/0099323 A1 | 4/2012 | Thompson |
| 2012/0107607 A1 | 5/2012 | Takaki et al. |
| 2012/0135153 A1 | 5/2012 | Osakabe et al. |
| 2012/0196103 A1 | 8/2012 | Murashige et al. |
| 2012/0212826 A1 | 8/2012 | Henn et al. |
| 2012/0219792 A1 | 8/2012 | Yamamoto et al. |
| 2012/0247152 A1 | 10/2012 | Ohara et al. |
| 2012/0250314 A1 | 10/2012 | Maikowski et al. |
| 2012/0301676 A1 | 11/2012 | Ushida et al. |
| 2012/0321898 A1 | 12/2012 | Meinhardt et al. |
| 2012/0327568 A1 | 12/2012 | Shedletsky et al. |
| 2013/0013574 A1 | 1/2013 | Wu |
| 2013/0021669 A1 | 1/2013 | Xi et al. |
| 2013/0022798 A1 | 1/2013 | Fukavva et al. |
| 2013/0029118 A1 | 1/2013 | Kishi et al. |
| 2013/0057950 A1 | 3/2013 | Lin et al. |
| 2013/0059137 A1 | 3/2013 | Hevesi et al. |
| 2013/0120842 A1 | 5/2013 | Moens et al. |
| 2013/0128342 A1 | 5/2013 | Mitarai et al. |
| 2013/0170044 A1 | 7/2013 | Mont et al. |
| 2013/0176615 A1 | 7/2013 | Uefuji et al. |
| 2013/0177751 A1 | 7/2013 | Oh et al. |
| 2013/0183489 A1 | 7/2013 | Cremer et al. |
| 2013/0187185 A1 | 7/2013 | Dehazer et al. |
| 2013/0209762 A1 | 8/2013 | Damm et al. |
| 2013/0260115 A1 | 10/2013 | Suzuki et al. |
| 2013/0263784 A1 | 10/2013 | Lee et al. |
| 2013/0271836 A1* | 10/2013 | Fukaya .............. G02B 1/11 359/507 |
| 2013/0334031 A1 | 12/2013 | Lee et al. |
| 2014/0022630 A1 | 1/2014 | Reymond et al. |
| 2014/0036175 A1 | 2/2014 | Morishima et al. |
| 2014/0087101 A1 | 3/2014 | Tixhon et al. |
| 2014/0090864 A1 | 4/2014 | Paulson |
| 2014/0090974 A1* | 4/2014 | Ballet ............... C03C 17/007 204/192.15 |
| 2014/0093711 A1 | 4/2014 | Paulson |
| 2014/0106141 A1 | 4/2014 | Bellman et al. |
| 2014/0106146 A1 | 4/2014 | Decker et al. |
| 2014/0106150 A1 | 4/2014 | Decker et al. |
| 2014/0111859 A1 | 4/2014 | Duraes et al. |
| 2014/0113083 A1 | 4/2014 | Lee et al. |
| 2014/0113120 A1 | 4/2014 | Thiel |
| 2014/0139978 A1 | 5/2014 | Kwong |
| 2014/0186615 A1 | 7/2014 | An et al. |
| 2014/0220327 A1 | 8/2014 | Adib et al. |
| 2014/0233106 A1 | 8/2014 | Vergoehl et al. |
| 2014/0255616 A1 | 9/2014 | Paulson |
| 2014/0261615 A1 | 9/2014 | Nair et al. |
| 2014/0295330 A1 | 10/2014 | Pruneri et al. |
| 2014/0334006 A1 | 11/2014 | Adib et al. |
| 2014/0335330 A1 | 11/2014 | Bellman et al. |
| 2014/0362444 A1 | 12/2014 | Paulson |
| 2014/0368029 A1 | 12/2014 | Park |
| 2014/0370264 A1 | 12/2014 | Ohara et al. |
| 2014/0376094 A1 | 12/2014 | Bellman et al. |
| 2014/0377522 A1* | 12/2014 | Koch ................ G02B 1/105 428/213 |
| 2015/0037554 A1 | 2/2015 | Gao et al. |
| 2015/0062710 A1 | 3/2015 | Grillmayer et al. |
| 2015/0079398 A1 | 3/2015 | Amin et al. |
| 2015/0083464 A1 | 3/2015 | Zilbauer et al. |
| 2015/0219798 A1 | 8/2015 | Sonoda et al. |
| 2015/0284840 A1 | 10/2015 | Henn et al. |
| 2015/0322270 A1 | 11/2015 | Amin et al. |
| 2015/0323705 A1 | 11/2015 | Hart et al. |
| 2015/0376057 A1 | 12/2015 | Koch, III et al. |
| 2016/0076135 A1 | 3/2016 | Cheah et al. |
| 2017/0075039 A1 | 3/2017 | Hart et al. |
| 2017/0087144 A1 | 3/2017 | Rowe et al. |
| 2017/0184762 A1 | 6/2017 | Fujii et al. |
| 2017/0199307 A1 | 7/2017 | Hart et al. |
| 2019/0077352 A1 | 3/2019 | Bhatia et al. |

FOREIGN PATENT DOCUMENTS

| | | |
|---|---|---|
| CN | 100360449 C | 1/2008 |
| CN | 101236264 A | 8/2008 |
| CN | 101295030 A | 10/2008 |
| CN | 101349769 A | 1/2009 |
| CN | 101356455 A | 1/2009 |
| CN | 102681042 A | 9/2012 |
| CN | 102736136 A | 10/2012 |
| CN | 202661651 U | 1/2013 |
| CN | 102967947 A | 3/2013 |
| CN | 103073196 A | 5/2013 |
| CN | 103395247 A | 11/2013 |
| CN | 103499852 A | 1/2014 |
| CN | 103508678 A | 1/2014 |
| CN | 103707578 A | 4/2014 |
| CN | 104422971 A | 3/2015 |
| DE | 102015114877 A1 | 3/2017 |
| EP | 2628818 A1 | 8/2013 |
| JP | 63238260 A | 10/1988 |
| JP | 04250834 A | 9/1992 |
| JP | 07035267 A | 4/1995 |
| JP | 09068602 A | 3/1997 |
| JP | 02974879 B2 | 11/1999 |
| JP | 11311702 A | 11/1999 |

(56) References Cited

FOREIGN PATENT DOCUMENTS

| | | |
|---|---|---|
| JP | 2000171601 A | 6/2000 |
| JP | 2000171605 A | 6/2000 |
| JP | 2000214302 A | 8/2000 |
| JP | 2001303246 A | 10/2001 |
| JP | 2002174810 A | 6/2002 |
| JP | 2003131011 A | 5/2003 |
| JP | 2003285343 A | 10/2003 |
| JP | 2004138662 A | 5/2004 |
| JP | 2005114649 A | 4/2005 |
| JP | 2005219223 A | 8/2005 |
| JP | 2006208726 A | 8/2006 |
| JP | 2007099557 A | 4/2007 |
| JP | 2007156017 A | 6/2007 |
| JP | 2007527328 A | 9/2007 |
| JP | 2007271958 A | 10/2007 |
| JP | 2008033348 A | 2/2008 |
| JP | 2009109850 A | 5/2009 |
| JP | 2009116218 A | 5/2009 |
| JP | 2009116219 A | 5/2009 |
| JP | 2009116220 A | 5/2009 |
| JP | 2009199022 A | 9/2009 |
| JP | 2009204506 A | 9/2009 |
| JP | 2009265601 A | 11/2009 |
| JP | 04421142 B2 | 2/2010 |
| JP | 2010202514 A | 9/2010 |
| JP | 04612827 B2 | 1/2011 |
| JP | 2011017782 A | 1/2011 |
| JP | 2011057547 A | 3/2011 |
| JP | 2011093728 A | 5/2011 |
| JP | 04707656 B2 | 6/2011 |
| JP | 2011133800 A | 7/2011 |
| JP | 2011134464 A | 7/2011 |
| JP | 04765069 B2 | 9/2011 |
| JP | 04790396 B2 | 10/2011 |
| JP | 2012171866 A | 9/2012 |
| JP | 2012189760 A | 10/2012 |
| JP | 2012230290 A | 11/2012 |
| JP | 2013025318 A | 2/2013 |
| JP | 2013097356 A | 5/2013 |
| JP | 2013122516 A | 6/2013 |
| JP | 2013142817 A | 7/2013 |
| JP | 2013205634 A | 10/2013 |
| JP | 2013252992 A | 12/2013 |
| JP | 2014056215 A | 3/2014 |
| JP | 2014194530 A | 10/2014 |
| JP | 2015058605 A | 3/2015 |
| KR | 1103041 B1 | 1/2012 |
| KR | 1194257 81 | 10/2012 |
| KR | 2013031689 A | 3/2013 |
| KR | 2014034172 A | 3/2014 |
| TW | 200600824 A | 1/2006 |
| WO | 1997013003 A1 | 4/1997 |
| WO | 1998037254 A2 | 8/1998 |
| WO | 200037384 A | 6/2000 |
| WO | 200242843 A | 5/2002 |
| WO | 2006099765 A1 | 9/2006 |
| WO | 2008108332 A1 | 9/2008 |
| WO | 2012144499 A1 | 10/2012 |
| WO | 2013001023 A1 | 1/2013 |
| WO | 2013088856 A1 | 6/2013 |
| WO | 2013098641 A2 | 7/2013 |
| WO | 2013160233 A1 | 10/2013 |
| WO | 2014167293 A1 | 10/2014 |
| WO | 2014182639 A1 | 11/2014 |
| WO | 2015009377 A1 | 1/2015 |
| WO | 2014041257 A1 | 3/2015 |
| WO | 2015031428 A2 | 3/2015 |
| WO | 2015076914 A1 | 5/2015 |
| WO | 2015085283 A1 | 6/2015 |
| WO | 2015142837 A1 | 9/2015 |
| WO | 2015175390 A1 | 11/2015 |
| WO | 2015179739 A1 | 11/2015 |
| WO | 2016118462 A2 | 7/2016 |

OTHER PUBLICATIONS

I.V. Afanasyev-Charkin et al., "Hard Si—N—C films with a tunable band gap produced by pulsed glow discharge deposition", Surface & Coatings Technology, 1999, pp. 38-42. (Year: 2004).*
Xiangdong Xu et al."Chennical control of physical properties in silicon nitride films", Applied Physics A: Materials Science & Processing,2012, vol. III, pp. 867-876. (Year: 2012).*
I.V.Afanasyev-Charkin et al., "Hard Si—N—C films with a tunable band gap produced by pulsed glow discharge deposition", Surface & Coatings Technology, 1999, pp. 38-42. (Year: 2004).*
Hui Lin Chang et al. "Characteristics of Si—C—N films deposited by microwave plasma CVD on Si wafers with various buffer layer materials", Diamond and Related Material, 2001, vol. 10, pp. 1910-1915, (Year: 2001).*
Xiangdong Xu et al."Chemical control of physical properties in silicon nitride films", Applied Physics A: Materials Science & Processing,2012, vol. III, pp. 867-876. (Year: 2012).*
I.V.Afanasyev-Charkin et al., "Hard Si—N—C films with a tunable band gap produced by pulsed glow discharge deposition", Surface & Coatings Technology, 1999, pp. 38-42. . (Year: 1999).*
Liaoning Provincial Popular Science Writers Association, "High Technology Around Your Life", Popular Science Press, p. 217, Oct. 1992. (Year: 1992).*
PCT/US2015/043161 Search Report dated Dec. 3, 2015.
Portinha et al., "Hard ZrO2/Al2O3 nanolamianted PVD coatings evaluated by nanoindentation", Surface & Coatings Technology 200 (2005) 765-768.
Reinhold et al; "Plasma Nitriding of Aluminum Alloys." Proceedings of the 1st International Automotive Heat Treating Conference. Jul. 13-15, 1998.
Savage; "Preparation and properties of hard crystalline materials for optical applications—a review." Journal of Crystal Growth 113 (1991) 698-715.
Schroter et al; "X-ray photoelectron diffraction on SiC and AlN epitaxial films: polytype structure and polarity." Elsevier, Journal of Electron Spectroscopy and Related Phenomena. 114-116 (2001) 443-450.
Singh et al; "Structural and optical properties of RF magnetron sputtered aluminium nitride films without external substrate heating." Elsevier, Applied Surface Sceince 257 (2011) 9568-9573.
Southwell; "Coating design using very thin high- and low-index layers," Applied Optics, vol. 24, Issue 4, pp. 457 (1985).
Tsui et al; "Effects of Adhesion on the Measurement of Thin Film Mechanical Properties by Nanoindentation." Mat. Res. Soc. Symp. Proc. vol. 473 1997.
Urushidani et al; "Etalon-Type Optical Filters, Their Modules, Spectrometers, and Optical Devices." Jpn. Kokai Tokkyo Koho, 2012.
Urushidani et al; "Optical Filters Including Optical Films Covered with Thickness-Controlled Dielectric Films, and Optical Filter Modules, Spectrometers and Optical Apparatus Containing Them." 2012.
U.S. Appl. No. 14/828,114.
Wang et al. "Tribological and optical properties of crystalline and amorphous alumina thin films grown by low temperature reactive magnetron sputter-deposition", Surface and coatings technology, pp. 146-147 (2001) p. 189-194.
Wang et al; "Roughness Improvement and Hardness Enhancement in Nanoscale AL/AlN Multilayered Thin Films." Applied Physics Letters vol. 71, No. 14, 1951-1953, Oct. 6, 1997.
Wang et al; "Study of ALON and CRON films deposited by arc ion plating as diffusion barriers." Jinshu Xuebao (2004), 40, 1, 83-87.
Watamabe et al; "Surface Oxidation of Aluminum Nitride Thin Films."Surface Modification Technologies XIII, Edited by Sudarshan, Khor, Jeandin, ASM International, Materials Park, Ohio, 1999. pp. 209-215.
Wen et al. "The AlN layer thickness dependent coherent epitaxial growth, stress and hardness in NbN/AlN nanostructured multi-layer films." Surface and Coatings Technology 235 (2013) 367-375.
Xi et al; "The Preparation and Optical properties of AlN Thin Films." Diwen Wuli Xuebao (2012), 34)6), 467-470.

(56) References Cited

OTHER PUBLICATIONS

Xu et al; "Chemical control of physical properties in silicon nitride films"; Appl Phys A (20163) 111: 867-876.
Yamamoto et al; "Manufacture of IR-Reflecting Bent Plate Glass." Jpn. Kokai Tokkyo Koho, 1988.
Yamashita et al; "Preparation and Properties of AlON-SiAlON Composites," Journal of the Ceramic Society of Japan 109, pp. 434-439, 2001.
Yan et al; "The Preparation and Properties of Y2O3/AlN Anti-Reflection Films on Chemical Vapor Deposition Diamond." Elsevier, Thin Solid Films, 520, pp. 734-738, 2011.
Yang et al; "Preparation and Properties of AlN Thin Films by Pure Nitrogen Reactive Sputtering." Rengong Jingti Xuebao, 39 (1), pp. 190-196, 2010.
Yang et al; "Preparation and Properties of C-Axis Preferred Orientation AlN Thin Films by Pure Nitrogen Reactive Sputtering." Xianjiang Daxue Xuebao, Ziran Kexueban, 26 (4), pp. 444-449, 2009.
Yun et al; "Optical and Structural Investigation of AlN Grown on Sapphire with Reactive MBE Using RF Nitrogen or Ammonia." Mat. Res. Soc. Symp. Proc., vol. 764, 2003.
Zabinski et al; "Stoichiometry and characterization of aluminium oxynitride thin films grown by ion-beam assisted pulsed laser deposition." Elsevier, Thin Solid Films, 516, pp. 6215-6219, 2008.
Zayats et al; "Optical Studies of AlN/n-Si(100) Films Obtained by the Method of High-Frequency Magnetron Sputtering.".
Corning, Corning Gorilla Glass for Large Cover-Glass Applications, 2013, pp. 1-3.
Corning, Corning Eagle2000 Glass, Material Information, Revised Aug. 2000, pp. 1-5.
Corning, Corning EAGLE XG AMLCD Glass Substrates Material Information, Mie 301, Issued: Jan. 2006, pp. 1-3.
Afanasyev-Charkin et al; "Hard Si—N—C films with a tunable band gap produced by pulsed glow discharge deposition"; Surface & Coatings Technology; 199 (2005) 38-42.
Aissa et al; "Comparison of the structural properties and residual stress of AlN films deposited by dc magnetron sputtering and high power impulse magnetron sputtering at different working pressures." Elsevier, Thin Solid Films, 550 (2014) 264-267.
Assouar et al; "Study of Acoustical and Optical Properties of AlN Films for SAW and BAW Devices: Correlation Between These Properties." Integrated Ferroelectrics, 82: 45-54, 2006.
Baek et al; "Correlations between optical properties, microstructure, and processing conditions of Aluminum nitride thin films fabricated by pulsed laser deposition." Elsevier, Thin Solid Films 515 (2007) 7096-7104.
Bitterlich et al; "Particle-reinforced SiAlONs for Cutting Tools." Materials Science Forum vol. 554 (2007) pp. 129-134.
Boichot et al; "Epitaxial growth of AlN on c-plane sapphire by High Temperature Hydride Vapor Phase Epitaxy: Inclence of the gas phase N/Al ratio and low temperature protective layer." Elsevier, Surface & Coatings Technology 237 (2013) 118-125.
Borges et al; "Optical Properties of AlNxOy Thin Films Deposited by DC Magnetron Sputtering." Proceedings of SPIE, 2011.
Caliendo et al; "Structural, optical, and acoustic characterization of high-quality AlN thick films sputtered on Al2O3 (001) at temperature for GHz-band electroacoustic devices applications." Journal of Applied Physics 96, No. 5, 2610 (2004).
Carniero et al. "Hardness Evaluation of Nanolayered PVD Coatings Using Nanoindentation", Rev. Adv. Mater. Sci., 2014 p. 83-90.
Chang et al; "Characteristics of Si—C—N films deposited by microwave plasma CVD on Si wafers with various buffer layer materials" Diamond and Related Materials; 10 (2001) 1910-1915.
Chen et al; "Optical Reflectance of Bulk AlN Crystals and AlN Epitaxial Films." AIP Conference Proceedings, 772, 297-298, 2005.
Chen et al; "Thickness-dependent structural transformation in the AlN film." Elsevier, Acta Materialia 53 (2005) 5223-5227.
Chi et al; "Cracking in coating-substrate composites with multi-layered and FGM coatings." Engineering Fracture Mechanics, vol. 70, 1227-1243, 2003.

Chinese First Office Action CN20140038909.4 dated Aug. 3, 2016.
Chinese First Office Action CN201480037881.2 dated Aug. 3, 2016.
CN201480037881.2 Office Action dated Mar. 24, 2017, China Patent Office.
CN201480061989.5 First Office Action dated Jan. 4, 2017, China Patent Office.
Corbin; Aluminum Oxynitride Spinel (ALON): A Review, Jul. 1987. Journal of the European Ceramic Society vol. 5, Issue 3, 1989, pp. 143-154.
Danylyuk et al; "Optical and Electrical Properties of Al 1-x InxN Films Grown on Sapphire (0001) by Plasma Source Molecular Beam Epitaxy." Mat. Res. Soc. Symp., vol. 639, 2001.
Easwaraljanthan et al; "Spectroellipsometric investigation of optical, morphological, and structural properties of reactively sputtered polycrystalline AlN films." J. Vac. Sci. Technology A 28 (3), pp. 495-501, May/Jun. 2010.
English Translation of JP2016512997 First Office Action dated Jul. 5, 2016; 6 Pages; Japanese Patent Office.
Gazda et al; "Formation of ALN films on Ti/TiN Arc-Layer Interface with Al-0.5% Cu Interconects evaluated by XPS and Energy-filtered-TEM." Mat. Res. Soc. Symp. Proc. vol. 589, 365-370, 2001.
Godeker et al., "Antireflection coating for sapphire with consideratino of mechanical properties", Surface & Coatings Technology, 241 (2014) 59-63.
Goldman et al; "Scale Up of Large ALON Windows", Window and Dome Technologies and Materials XIII, edited by Randal W. Tustison, Brian J. Zelinski,Proc. of SPIE vol. 8708, 870804 (Jun. 4, 2013).
Gpi: http://generalplasma.com/products/large-area-pecvd/.
Hajakbari et al; "Optical Properties of Amorphous AlN Thin Films on Glass and Silicon Substrates Grown by Single Ion Beam Sputtering." Jpn. J. Appl. Phys. 49, 095802 (2010).
Hirai et al; "Formation of Aluminum Nitride by Carbothermic Reduction of Alumina in a Flowing Nitrogen Atmosphere." Nippon Kinzoku Gakkaishi (1989, 53 (10), 1035-40.
Huang et al; "Effect of deposition conditions on mechanical properties of low-temperature PECVD silicon nitride films"; Materials Science and Engineering A 435-436 (2006) 453-459.
Huang et al; "Effects of Substrate Temperature on Aluminum Nitride Films by Reactive Magnetron Sputtering." Xiyou Jinshu, 35 (5), pp. 715-718, 2011.
Inkin et al; "Properties of aluminium nitride coating obtained by vacuum arc discharge method with plasma flow separation." Elsevier, Diamond and Related Materials, 10 (2001) 1314-1316.
International Search Report and Written Opinion PCT/US2016/051488 dated Nov. 21, 2016.
Ishiguro et al; "Solar Light Absorption Property of Sputtered Al-N Films with Enhanced Surface Roughness during Film Growth." Jpn. J. Appl. Phys. vol. 41 (2002) pp. 292-300.
Krupitskaya et al; "Optical Characatization of AlN Films Grown by Plasma Source Molecular Beam Epitaxy." Journal of Applied Physics 84, 2861-2865, 1998.
Li et al, "Low-temperature magnetron sputter deposition, hardness and electrical resistivity of amorphous and crystalline alumina thin films" Journal of Vacuum Science & Technology A 18, 2333 (2000).
Madocks et al Durable Neutral Color Anti-Reflective Coating for Mobile Displays; SVC Bulletin Fall 2014 3 pages.
Mania et al; "Magnetron Sputtering for Deposition of Aluminum Nitride Thin Films." Prace Komisji Nauk Ceramiczynych, 54, 429-433, 1997.
Martinet er al; "Deposition of SiO2 and TiO2 thin films by plasma enhanced chemical vapors deposition for antireflection coating", J. Non-Crystalline Solids; 216 (1997) 77-82.
Mccauley et al; "AlON: A brief history of its emergence and evolution." Journal of the European Ceramic Society 29 (2009), 223-236.
Miao et al "Optical Properties and Reactive Sputtering Conditions of AlN and AlSiN Thin Films for Magneto-Optical Applications." Journal of Electronic Materials, vol. 26, No. 1, 1997.
Moghal et al., "Nanomechanical study of thin film nanocomposite and PVD thin films on polymer substrate for optical applications", J. Phys. D: Appl. Phys. 46 (2013).

(56) References Cited

OTHER PUBLICATIONS

Moore; "Gradient Index Optics: A Review," Applied Optics, vol. 19, No. 7, Apr. 1, 1980.
Oliver et al. "An improved technique for determining hardness and elastic modulus using load and displacement sensing indentation experiments". J. Mater. Res., vol. 7, No. 6, 1992, 1564-1583.
Oliver et al. "Measurement of Hardness and Elastic Modulus by Instrument Indentation: Advances in Understanding and Refinements to Methodology". J. Mater. Res., vol. 19, No. 1, 2004, 3-20.
Pantano "Al2O3 Coating by Atomic Layer Deposition (ALD) on various glass substrates for Surface Strength Improvement".
PCT/2014/036872 Search report/Written Opinion.
PCT/US2014/036090 Search report/Written Opinion.
PCT/US2014/055281 PCT Search report.
PCT/US2014/055282 Search report.
PCT/US2014036873 Search Report/Written Opinion.
PCT/US2015/030116 PCT Search dated Jan. 12, 2016.
English Translation of CN201580053885.4 First Office Action dated Aug. 27, 2018, China Patent Office.
Caceres and Prieto, "Mechanical properties of sputtered silicon notride thin films" , Journal of Applied Physics 94 (12) 2003, pp. 7868-7873.
Chan et al; "Fracture Toughness Improvements of Dental Ceramic Through Use of Yttria-Stabilized Zirconia (YSZ) Thin-Film Coating" ; Dental Materials, 29 (2013) pp. 881-887.
Fischer-Cripps; "Critical Review of Analysis and Interpretation of Nanoindentation Test Data" ; Surface & Coatings Technology 200 (2006) pp. 4153-4165.
Harding et al; "Cracking During Indentation and Its Use in the Measurement of Fracture Toughness" ; Mat. Res. Soc. Symp. Proc.; vol. 356, 1995, pp. 663-668.
Hay et al; "Continuous Stiffness Measurement During Instrumented Indentation Testing" ; Experimental Techniques; May/Jun. 2010; pp. 86-94.
Hu et al; "Dynamic Fracturing of Strengthened Glass Under Biaxial Tensile Loading" ; Journal of Non-Crystalline Solids; 405 (2014); pp. 153-158.
Kittel, "Introduction to Solid State Physics." Seventh Edition, John Wiley & Sons, Inc., NY, 1996, pp. 611-627.
Park et al; "Atomic Layer Deposition of Yttria-Stabilized Zirconia Thin Films for Enhanced Reactivity and Stability of Solid Oxide Fuel Cells" ; Energy; vol. 116; (2016); pp. 170-176.
Ruddell et al; "The Effect of Deposition Parameters on the Properties of Yttria-Stabilzed Zirconia Thin Films" ; Thin Solid Films, 445 (2003) pp. 14-19.
Shackelford, "Introduction to Materials Science for Engineers," Sixth Edition, Pearson Prentice Hall, New Jersey, 2005, pp. 404-418.
Smart and Moore; "Solid State Chemistry, An Introduction," Chapman & Hall University and Professional Division, London, 1992, pp. 136-151.
Sonderby et al; "Deposition of Yttria-Stabilized Zirconia Thin Films by High Power Impulse Magnetron Sputtering and Pulsed Magnetron Sputtering" ; Surface & Coatings Technology; 240; (2014) pp. 1-6.
Wang et al; "Toward Hard Yet Tough Ceramic Coatings" ; Surface & Coatings Technology 258 (2014) pp. 1-16.
English Translation of JP2017505500 Office Action dated May 29, 2019, Japan Patent Office, 3 Pgs.
Liaoning Provincial Popular Science Writers Association, "High Technology Around Your Life" , Popular Science Press, p. 217, Oct. 1992 (English Translation Attached).
Chinese Patent Application No. 201580053885.4; English Translation of the Decision on Rejection dated Sep. 2, 2019; China Patent Office; 7 Pgs.
Corning, "Coming Gorilla Glass 5," Product Info Sheet, 2 pgs. 2016. retrieved from: https://www.corning.com/microsites/csm/gorillaglass/PI_sheets/Coming%20Gorilla%2-Glass%205%20PI%20Sheet.pdf.
Tang et al. "Optical, structural, and mechanical properties of silicon oxyynitride films sputtering by pulsed magnetron sputtering," Applied Optics 56(4) 2016, pp. C168-C174.
Invitation to Pay Additional Fees and Partial Search Report of the European International Searching Authority; PCT/US2019/058547; dated Feb. 19, 2020; 11 Pgs.

* cited by examiner

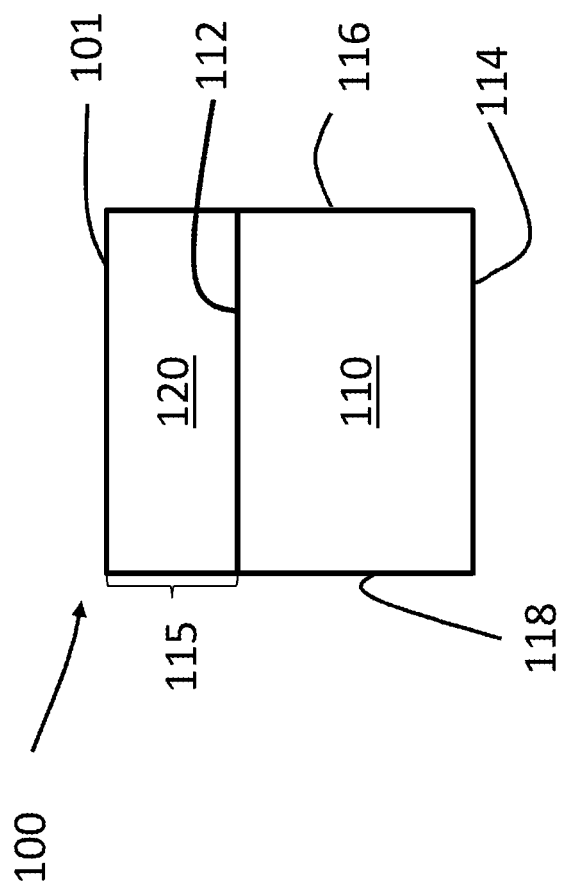

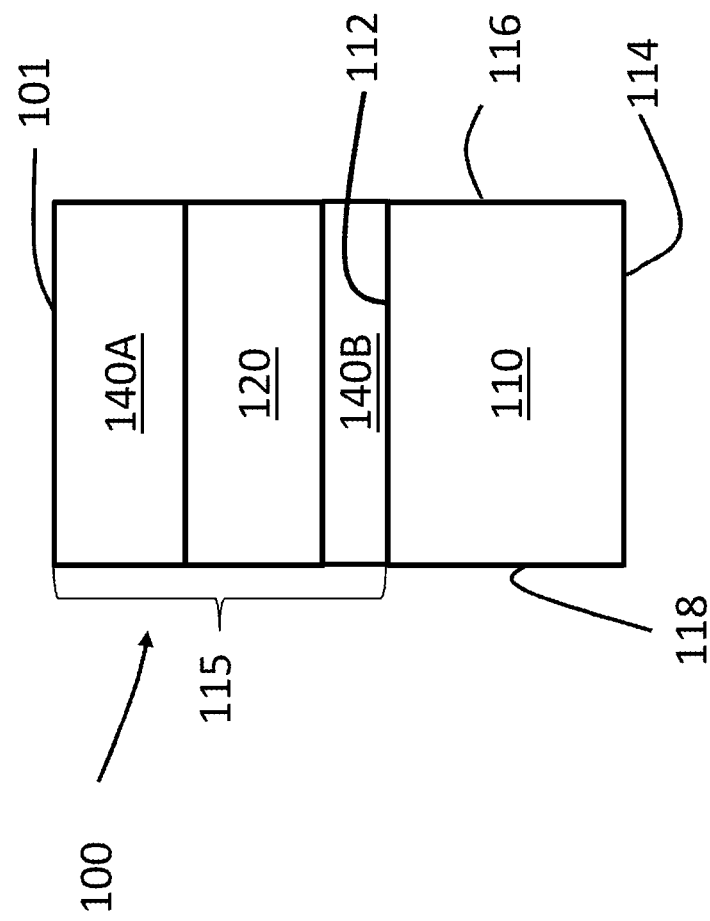

SCRATCH-RESISTANT MATERIALS AND ARTICLES INCLUDING THE SAME

CROSS-REFERENCE TO RELATED APPLICATIONS

This application is a divisional application and claims the benefit of priority under 35 U.S.C. § 120 of U.S. patent application Ser. No. 14/812,562, filed on Jul. 29, 2015, now U.S. Pat. No. 9,790,593, which in turn, claims the benefit of priority under 35 U.S.C. § 119 of U.S. Provisional Application Ser. No. 62/120,466 filed on Feb. 25, 2015, U.S. Provisional Application Ser. No. 62/068,853 filed on Oct. 27, 2014, and U.S. Provisional Application Ser. No. 62/032,073 filed on Aug. 1, 2014, the contents of each of which are relied upon and incorporated herein by reference in their entireties.

BACKGROUND

The disclosure relates to durable and/or scratch-resistant coating materials and articles including the same, and more particularly to coating materials exhibiting high hardness and a wide optical band gap, and articles including the same.

Transparent substrates are often used in displays in consumer electronic devices such as smart phones and tablets. Other applications are also possible, such as architectural, automotive, appliances and the like. For such uses, the substrate should be abrasion resistant, scratch resistant, and should provide acceptable optical transparency and color point (in transmittance and/or reflectance). In addition, when used in displays, the substrate should minimize light absorption to minimize energy use, thus prolonging the battery life in portable device. The substrate should also exhibit minimum light reflectance so the display is readable in bright, ambient light. Moreover, the transmittance and reflectance should also be optimized so that colors in the display are accurately rendered over a range of viewing angles.

The application of hard coating(s) onto the surface of substrate has been attempted to enhance at least one or more of these desirable properties. Such coatings may be formed using physical vapor deposition (PVD) processes and can include aluminum-based materials such as aluminum nitride, aluminum oxynitride, and silicon aluminum oxynitride. Such materials exhibit high hardness, and optical transparency and colorlessness; however there may be processing limitations associated with such materials.

Known sputtered or PVD-formed silicon-based materials include a hydrogen-free SiNx, which may exhibit a hardness of about 22 gigaPascals (GPa) at stoichiometric N/Si=1.33. Known RF sputtered SiNx films have shown about 93% density and a hardness of about 25 GPa. It should be noted that such sputtered silicon-based materials require long deposition times. Moreover, such materials include less than about 1 atomic % hydrogen and exhibit inferior optical properties.

A recognized alternative is forming durable and/or scratch resistant materials by chemical vapor deposition (CVD), which includes plasma enhanced chemical vapor deposition (PECVD). Accordingly, there is a need for providing durable and/or scratch resistant coating materials that may be formed by a variety of methods including CVD and PECVD methods, and which exhibit high hardness, optical transparency and colorlessness.

SUMMARY

A first aspect of the present disclosure pertains to a coating material that exhibit high hardness and wide optical band gap (e.g., about 3.5 eV or greater). The coating material may include any one or more of silicon, aluminum, nitrogen, oxygen, hydrogen, carbon, boron and fluorine. In one or more specific embodiments, the coating material includes silicon and may be characterized as silicon-based. In some embodiments, the coating material exhibits a Young's modulus of about 150 GPa or greater. The compressive stress of a layer of the coating material may be about −400 megaPascals (MPa) or greater.

In one or more embodiments, the coating material exhibits a maximum hardness of about 17 GPa or greater (or about 19 GPa or greater), as measured by a Berkovich Indenter Hardness Test along an indentation depth of about 50 nm or greater. In one or more embodiments, the coating material exhibits an optical band gap of about 3.5 eV or greater (e.g., in the range from about 3.5 eV to about 5.5 eV). The coating material may exhibit a refractive index at a wavelength of about 632 nanometers (nm) in the range from about 1.8 to about 2.1.

In one or more embodiments, the coating material includes silicon, aluminum or a combination thereof in an amount of about 35 atomic % or greater or in the range from about 37 atomic % to about 50 atomic %. The coating material may also include hydrogen and any one or more of oxygen, nitrogen, carbon, boron and fluorine. Hydrogen may be present in some embodiments in an amount in the range from about 1 atomic % to about 30 atomic %. Nitrogen may be present in an amount of about 30 atomic % or greater (e.g., from about 30 atomic % to about 45 atomic %). Where the coating material includes nitrogen and hydrogen, the hydrogen may be present in an amount in the range from about 15 atomic % to about 28 atomic %. The coating material may include a nonzero amount of oxygen of about 7.5 atomic % or less, a non-zero amount of carbon of about 10 atomic % or less, a non-zero amount of fluorine of about 5 atomic % or less, a non-zero amount of boron of about 10 atomic % or less, or combinations thereof.

In one or more embodiments, the coating material includes a compositional ratio of the amount of nitrogen (in atomic %) to the amount of silicon (in atomic %) of about 0.8 or greater. In some embodiments, the coating material includes a compositional ratio of the combined amount of carbon (in atomic %), oxygen (in atomic %) and fluorine (in atomic %) to the amount of anions of less than about 0.2.

A second aspect of this disclosure pertains to an article including a substrate having a major surface, and a coating structure disposed on the major surface forming a coated surface. The coating structure includes a layer of embodiments of the material described herein. The article of one or more embodiments exhibits an optical band gap of about 3.5 eV or greater, and a hardness of about 17 GPa or greater (up to about 35 GPa), as measured on the coated surface by a Berkovich Indenter Test along an indentation depth of about 50 nm or greater. The article of some embodiments exhibits an average transmittance of about 85% or greater (or about 92% or greater) over an optical wavelength regime in the range from about 400 nm to about 800 nm.

The coating structure of one or more embodiments may include one or more additional layers. The thickness of the coating structure may be up to and including about 5 micrometers (μm) (e.g., from about 10 nm to about 500 nm, from about 500 nm to about 1000 nm, or about 1000 or greater). The coating structure and/or the layer may be characterized as chemical vapor deposited-structure or a plasma-enhanced chemical vapor deposited-structure.

The article of one or more embodiments, exhibits an article transmittance color coordinates in the (L*, a*, b*)

colorimetry system exhibiting a reference point color shift of less than about 2 from a reference point as measured at the coated surface, and/or an article reflectance color coordinates in the (L*, a*, b*) colorimetry system exhibiting a reference point color shift of less than about 5 from a reference point as measured at the coated surface, the reference point. The reference point may include at least one of the color coordinates (a*=0, b*=0), the color coordinates (a*=−2, b*=−2), and the reflectance color coordinates of the substrate.

The article of one or more embodiments exhibits an angular color shift of about 5 or less at an incident illumination angle that is 20 degrees or greater from a reference incident illumination angle, under an International Commission on Illumination illuminant selected from the group consisting of A series illuminants, B series illuminants, C series illuminants, D series illuminants, and F series illuminants, wherein the angular color shift is calculated using the equation $\sqrt{((a^*_2-a^*_1)^2+(b^*_2-b^*_1)^2)}$, with $a^*_1$, and $b^*_1$ representing the coordinates of the article when viewed at a reference incident illumination angle and $a^*_2$, and $b^*_2$ representing the coordinates of the article when viewed at the incident illumination angle.

A third aspect of this disclosure pertains to a method of forming the coating material described herein. The method includes comprising introducing a source gas into a chamber, and forming the coating material by chemical vapor deposition on a substrate, wherein the coating material exhibits an optical band gap of about 3.5 eV or greater, and a hardness of about 17 GPa or greater, as measured by a Berkovich Indenter Test along an indentation depth of about 50 nm or greater. In one or more embodiments, the source gas can include any one or more of a silicon source gas, aluminum source gas and a nitrogen source gas. The silicon source gas may include silane. The nitrogen source gas may include nitrogen, nitrous oxide, ammonia or combinations thereof. The method of one or more embodiments may further include introducing a hydrogen source gas, oxygen gas, a carbon source gas, a boron source gas, a fluorine source gas or combinations thereof into the chamber. The hydrogen source gas may include silane, hydrogen or a combination thereof. The carbon source gas may include carbon monoxide, carbon dioxide, acetylene, butane, methane or a combination thereof. The fluorine source gas may include silicon tetrafluoride, fluorocarbon or a combination thereof.

In one or more embodiments, the coating material may be formed at a temperature of about 400° C. or less. The method may optionally include selectively etching any one or more of a portion of the coating material and the chamber when forming the material.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 2 is a side-view illustration of an article including a substrate and a layer of the material disposed on the substrate, according to one or more embodiments;

FIG. 3C is side-view illustration of the article of FIG. 1, with a first additional layer disposed on the layer and a second additional layer disposed between the layer and the substrate;

DETAILED DESCRIPTION

Figure 1:
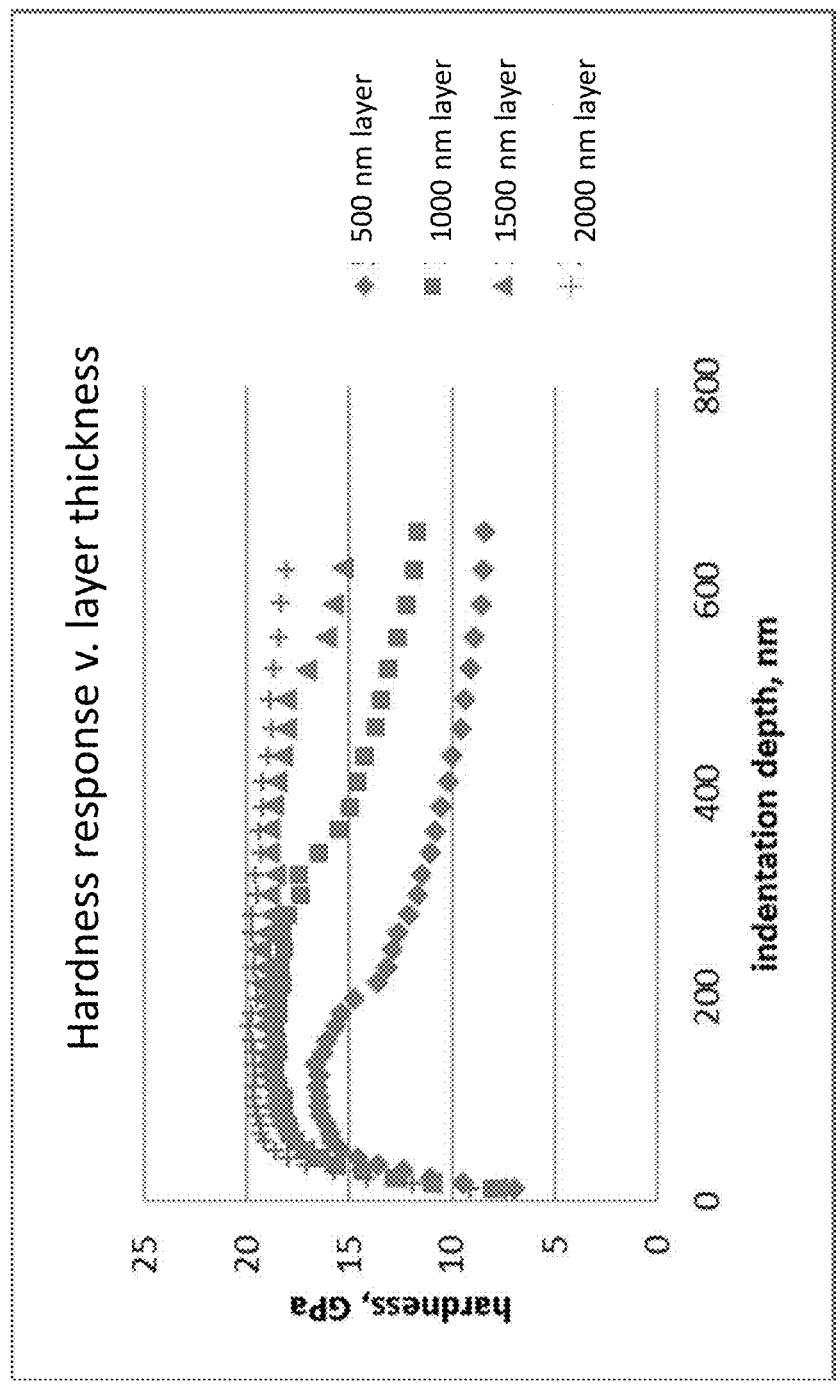
FIG. 1 is a graph illustrating hardness, as measured with a Berkovich indenter as a function of the indentation depth.

Reference will now be made in detail to various embodiment(s), examples of which are illustrated in the accompanying drawings.

A first aspect of the present disclosure pertains to a coating material exhibiting a hardness of about 17 GPa or greater, as measured by a Berkovich Indenter Hardness Test (as described herein). In one or more embodiments, the coating material exhibits an optical band gap of about 3.5 eV or greater. The coating material of some embodiments may exhibit low absorption (i.e., k values of less than about 0.001), and high transmittance and low reflectance values over an optical wavelength regime. As used herein, the "optical wavelength regime" includes the wavelength range from about 400 nm to about 800 nm. As used herein, the optical band gap, thicknesses and refractive index values of the coating materials or layers incorporating the coating material were measured using an n&k analyzer, supplied by n&k Technology, Inc., having an address of 80 Las Colinas Lane, San Jose, Calif. 95119. The reflectance and transmission spectra or values described herein were fitted with a Forouhi-Bloomer model for amorphous dielectric, in accordance with A. R. Forouhi and I. Bloomer, Physical Review B, 34 (10) 7018 (1986)).

The coating material described herein can be distinguished from known silicon-based materials. For example, $Si_3N_4$ is a known high temperature ceramic that can achieve high hardness values; however, when such materials are formed by PECVD, they often exhibit hardness values of less than about 17 GPa. Moreover, silicon nitride materials formed by PECVD methods do not have the composition $Si_3N_4$, but rather have the composition $SiH_xN_yH_z$ where a substantial amount of hydrogen (i.e., up to about 30 atomic %) is incorporated as Si—H, Si—$H_2$, N—H species. The hydrogen is introduced by the precursors used in PECVD deposition processes. For example, the most common process for PECVD-formed SiNx includes $SiH_4$+ $NH_3$→$SiH_yN_xH_z$ at 250° C.-400° C.

Typical PECVD-formed silicon nitride materials are unsuitable as scratch resistant layers for transparent substrates because they lack one of more of required attributes of hardness, optical band gap, and low stress. Typical semiconductor nitride films are have a yellow appearance due to low optical band gap (e.g., about 3 eV or less). Moreover, typical silicon nitride materials used for flat panel displays can be clear, with a refractive index of about 1.85 and optical band gap of about 4 eV; however, such materials have hardness values in the range from about 10 GPa to about 15 GPa.

The coating material described herein maximizes hardness and various optical properties by providing a specific combination of elements (and relative amounts of such elements), and an increase in certain bonds over other bonds. For example, as will be described herein, the coating material of one or more embodiments maximizes Si—N bonds over other bonds.

In one or more embodiments, the coating material may include silicon and hydrogen. The coating material may also include any one or more of oxygen, nitrogen, carbon, boron, and fluorine. In some embodiments, aluminum may also be included (in addition to silicon or instead of silicon).

In one or more embodiments, the coating material may include silicon in an amount of about 35 atomic % or greater. In specific embodiments, the amount of silicon, in atomic %, is in the range from about 35 to about 60, from about 35 to about 58, from about 35 to about 56, from about 35 to about 54, from about 35 to about 52, from about 35 to about 50, from about 35 to about 48, from about 35 to about 46, about 35 to about 50, about 36 to about 50, about 37 to about 50, about 38 to about 50, about 39 to about 50, about 40 to about 50, about from about 41 to about 50, from about 42 to about 50, from about 43 to about 50, from about 44 to about 50, from about 45 to about 50, from about 46 to about 50, from about 47 to about 50, from about 35 to about 49, from about 35 to about 48, from about 35 to about 46, from about 35 to about 44, from about 35 to about 48, from about 35 to about 47, from about 35 to about 46, from about 35 to about 46, from about 35 to about 45, from about 37 to about 45, from about 37 to about 44, or from about 37 to about 43, and all ranges and sub-ranges therebetween.

In one or more embodiments, the coating material may include hydrogen in an amount in the range from about 1 atomic % to about 30 atomic %. In some embodiments, the amount of hydrogen, in atomic %, is in the range from about 1 to about 29, from about 1 to about 28, from about 1 to about 27, from about 1 to about 26, from about 1 to about 25, from about 1 to about 24, from about 1 to about 22, from about 1 to about 20, from about 1 to about 18, from about 1 to about 16, from about 1 to about 14, from about 1 to about 12, from about 2 to about 30, from about 4 to about 30, from about 6 to about 30, from about 8 to about 30, from about 10 to about 30, from about 12 to about 30, from about 14 to about 30, from about 15 to about 30, from about 16 to about 30, from about 18 to about 30, from about 20 to about 30, from about 10 to about 28, from about 12 to about 28, from about 14 to about 28, or from about 15 to about 28, and all ranges and sub-ranges therebetween.

In one or more embodiments, the hydrogen content of the coating material is typically lower in embodiments of coating material that include oxygen as compared to embodiments of the coating material that are substantially free of oxygen. As used herein, the phrase "substantially free" in relation to a component or element of the coating material (e.g., silicon, aluminum, hydrogen, nitrogen, oxygen, carbon, boron, or fluorine) includes less than about 0.01 atomic % of that component or means the component is not intentionally added to the coating material. Without being bound by theory, it is believed that higher hardness values are exhibited by embodiments of the coating material having lower amounts of hydrogen, even when the temperature at which the coating material is formed is higher. A reduced hydrogen content in the coating material is believed to increase the silicon and nitrogen content. The hydrogen content of the coating material is a function of the deposition temperature at which the coating material is formed, the precursor chemistry, composition of the resulting coating material, and plasma source. In addition, hydrogen is present in silicon oxycarbonitride compositions as Si—H, Si—$H_2$, N—H, N—$H_2$, C—H, C—$H_2$, and O—H species. The connectivity of the species in this amorphous network is thus determined by the hydrogen content. In the absence of metal-metal bonding, a silicon atom with no bound hydrogen is bonded to four anions while a silicon with a bound hydrogen is bonded to three anions, thus playing the role of aluminum in a glass network. Similarly a nitrogen with a bound hydrogen plays the role of oxygen in a glass network. The composition at which the maximum fraction of silicon to nitrogen bonding (which is also the observed and measured maximum hardness), is then a function not only of hydrogen content but also hydrogen speciation.

In one or more embodiments, the coating material may include nitrogen. In such embodiments, nitrogen may be present in an amount of about 30 atomic % or greater. In one or more embodiments, the amount of nitrogen, in atomic %, in the coating material may be in the range from about 30 to about 60, from about 30 to about 58, from about 30 to about 56, from about 30 to about 54, from about 30 to about 52, from about 30 to about 50, from about 30 to about 48, from about 30 to about 46, from about 30 to about 45, from about 30 to about 44, from about 30 to about 42, from about 30 to about 40, from about 35 to about 60, from about 35 to about 58, from about 35 to about 56, from about 35 to about 54, from about 35 to about 52, from about 35 to about 50, from about 35 to about 48, from about 35 to about 46, from about 35 to about 44, from about 35 to about 42, from about 35 to about 40, and all ranges and sub-ranges therebetween. In one or more embodiments, the coating material may be substantially free of nitrogen.

Where nitrogen is present in the coating material, the hydrogen content may be in the range from about 15 atomic % to about 30 atomic % (e.g., from about 15 atomic % to about 25 atomic %, from about 15 atomic % to about 20 atomic %, from about 20 atomic % to about 30 atomic %, or from about 25 atomic % to about 30 atomic %). In one or more embodiments, the compositional ratio of the amount of nitrogen (in atomic %) and the amount of silicon (in atomic %) may be about 0.8 or greater. In some embodiments, this ratio may be about 0.85 or greater, about 0.9 or greater, about 0.95 or greater, about 1 or greater, about 1.05 or greater, about 1.1 or greater, or about 1.15 or greater, and all ranges and sub-ranges therebetween. In some embodiments, the upper limit of the composition ratio of the amount of nitrogen (in atomic %) and the amount of silicon (in atomic %) may be about 1.2 or less (e.g., 1.18 or less, 1.16 or less, 1.14 or less, 1.12 or less, or about 1.1 or less).

In one or more embodiments, the coating material may include oxygen. In some embodiments, the coating material is substantially free of oxygen. Where oxygen is included, it may be present in a non-zero amount of about 7.5 atomic % or less. In one or more embodiments, oxygen may be present in the coating material, in an amount, in atomic %, in the range from about 0.1 to about 7.5, from about 0.1 to about 7, from about 0.1 to about 6.5, from about 0.1 to about 6, from about 0.1 to about 5.5, from about 0.1 to about 5, from about 0.1 to about 4.5, from about 0.1 to about 4, from about 0.5 to about 7.5, from about 1 to about 7.5, from about 1.5 to about 7.5, from about 2 to about 7.5, from about 2.5 to about 7.5, from about 3 to about 7.5, from about 3.5 to about 7.5, from about 4 to about 7.5, from about 4.5 to about 7.5, or from about 5 to about 7.5, and all ranges and sub-ranges therebetween.

In one or more embodiments, the coating material may include carbon. In some embodiments, the coating material is substantially free of carbon. Where carbon is included, it may be present in a non-zero amount of about 10 atomic % or less. In one or more embodiments, carbon may be present in the coating material, in an amount, in atomic %, in the range from about 0.1 to about 10, from about 0.1 to about 9.5, from about 0.1 to about 9, from about 0.1 to about 8.5, from about 0.1 to about 8, from about 0.1 to about 7.5, from about 0.1 to about 7, from about 0.1 to about 6.5, from about 0.1 to about 6, from about 0.1 to about 5.5, from about 0.1 to about 5, from about 0.1 to about 4.5, from about 0.1 to about 4, from about 0.5 to about 10, from about 1 to about 10, from about 1.5 to about 10, from about 2 to about 10, from about 2.5 to about 10, from about 3 to about 10, from about 3.5 to about 10, from about 4 to about 10, from about 4.5 to about 10, from about 5 to about 10, from about 5.5 to about 10, from about 6 to about 10, from about 6.5 to about 10, from about 7 to about 10, and all ranges and sub-ranges therebetween.

In one or more embodiments, the coating material includes fluorine. In such embodiments, the amount of fluorine may be present in a non-zero amount of about 5 atomic % or less. In some embodiments, fluorine may be present (in atomic %) in the range from about 0.1 to about 4, from about 0.1 to about 3, from about 0.1 to about 2, from about 0.1 to about 1.5, from about 0.1 to about 1, from about 0.5 to about 5, from about 0.75 to about 5, from about 1 to about 5, from about 2 to about 5, from about 3 to about 5, from about 0.01 to about 2, from about 0.01 to about 1.5, from about 0.01 to about 1, or from about 0.01 to about 0.5, and all ranges and sub-ranges therebetween. In some embodiments, the coating material is substantially free of fluorine. Where the coating material is substantially free of fluorine or includes less than about 1 atomic % or less than about 0.5 atomic % of fluorine, residual fluorine present from the formation process (including any in-situ plasma cleaning processes) may be minimized or eliminated by modifying cleaning processes and implementing conditioning steps, known in the art (e.g., $H_2$ plasma treatment).

In some variants, the coating material includes any one or more or two or more of oxygen, carbon and fluorine. The compositional ratio of the combined amount of carbon (in atomic %), oxygen (in atomic %) and fluorine (in atomic %) to the amount of anions in the coating material may be less than about 0.2 (e.g., less than about 0.19, less than about 0.18, less than about 0.17, less than about 0.16, less than about 0.15, less than about 0.1, less than about 0.05, less than about 0.02, or less than about 0.01). In other words, the combined carbon, oxygen and fluorine content of one or more embodiments comprises less than about 18 atomic % of the anions in the coating material. As used in this particular relationship, the word "anions" refers to the sum of the amount (in atomic %) of carbon, oxygen, nitrogen and fluorine in the coating material. In some embodiments, the composition ratio of the combined amount of carbon (in atomic %), oxygen (in atomic %) and fluorine (in atomic %) to the amount of anions in the coating material may be expressed as: [C atomic %+O atomic %+F atomic %]/[C atomic %+O atomic %+F atomic %+N atomic %], where applicable. Without being bound by theory, it is believed that hardness of the coating material decreases as the amount of nitrogen decreases.

In one or more embodiments, aluminum may be included in the coating material. In some instances, the coating material may be substantially free of aluminum. Where aluminum is included, it may be present in an amount of about 10 atomic % or less. In some instances, the amount of aluminum, in atomic %, is in the range from about 35 to about 60, from about 35 to about 58, from about 35 to about 56, from about 35 to about 54, from about 35 to about 52, from about 35 to about 50, from about 35 to about 48, from about 35 to about 46, about 35 to about 50, about 36 to about 50, about 37 to about 50, about 38 to about 50, about 39 to about 50, about 40 to about 50, about from about 41 to about 50, from about 42 to about 50, from about 43 to about 50, from about 44 to about 50, from about 45 to about 50, from about 46 to about 50, from about 47 to about 50, from about 35 to about 49, from about 35 to about 48, from about 35 to about 46, from about 35 to about 44, from about 35 to about 48, from about 35 to about 47, from about 35 to about 46, from about 35 to about 46, from about 35 to about 45, from about 37 to about 45, from about 37 to about 44, or from about 37 to about 43, and all ranges and sub-ranges therebetween. In one or more embodiments, where aluminum is present in the coating material, the coating material may be substantially free of carbon, may be substantially free of silicon or may be substantially free of carbon and silicon.

In one or more embodiments, the coating material may include boron. In some instances, the amount of boron can be tailored to modify or reduce the coefficient of friction (COF) of the coating material (and thus improve or increase the lubricity to of the coating material). In one or more embodiments, boron may be present in a non-zero amount of about 10 atomic % or less. In some embodiments, boron may be present in an amount, in atomic %, in the range from about 0.01 to about 10, from about 0.01 to about 9, from about 0.01 to about 8, from about 0.01 to about 7, from about 0.01 to about 6, from about 0.01 to about 5, from about 0.01 to about 4, from about 0.01 to about 3, from about 0.01 to about 2, from about 0.01 to about 1, from about 0.01 to about 0.1, from about 0.1 to about 10, from about 1 to about 10, from about 2 to about 10, from about 3 to about 10, from about 4 to about 10, from about 5 to about 10, from about 6 to about 10, from about 7 to about 10, from about 8 to about 10, or from about 9 to about 10, and all ranges and sub-ranges therebetween.

In one or more embodiments, the coating material exhibits a high hardness. The hardness of the coating material may be characterized by a Berkovich Indenter Hardness Test, which is a nanoindentation test used to determine the maximum hardness of the coating material. As used herein, the "Berkovich Indenter Hardness Test" includes measuring the hardness of a material by indenting a surface thereof with a diamond Berkovich indenter. The Berkovich Indenter Hardness Test includes indenting the surface of the material or coating material with the diamond Berkovich indenter to form an indent having an indentation depth in the range from about 50 nm to the entire thickness of the material and measuring the maximum hardness from this indentation along the entire indentation depth range or a segment of this indentation depth (e.g., in the range from about 100 nm to about 600 nm). The hardness may be measured generally using the methods set forth in Oliver, W. C.; Pharr, G. M. An improved technique for determining hardness and elastic modulus using load and displacement sensing indentation experiments. *J. Mater. Res.*, Vol. 7, No. 6, 1992, 1564-1583; and Oliver, W. C.; Pharr, G. M. Measurement of Hardness and Elastic Modulus by Instrument Indentation: Advances in Understanding and Refinements to Methodology. *J. Mater. Res.*, Vol. 19, No. 1, 2004, 3-20. In some embodiments, the thickness of the material used to measure hardness may be about 1000 nm or greater. The indentation depth is made and measured from the surface of the material. As used herein, hardness refers to a maximum hardness, and not an average hardness.

The Berkovich Indenter Hardness Test may be used to determine the hardness of a layer of the coating material or an article including a layer of the coating material (with or without other additional layers, as described herein). In such instances, surface of the layer or the coated surface of the article (101, in FIGS. 2 and 3A-3C) would be indented, as will be described herein.

In one or more embodiments, the coating material exhibits a hardness of about 17 GPa or greater, as measured by the Berkovich Indenter Hardness Test. In some embodiments, the hardness may be in the range from about 17 GPa to about 50 GPa, from about 18 GPa to about 50 GPa, from about 19 GPa to about 50 GPa, from about 20 GPa to about 50 GPa, from about 21 GPa to about 50 GPa, from about 22 GPa to about 50 GPa, from about 23 GPa to about 50 GPa, from about 24 GPa to about 50 GPa, from about 25 GPa to about 50 GPa, from about 26 GPa to about 50 GPa, from about 27 GPa to about 50 GPa, from about 28 GPa to about 50 GPa, from about 17 GPa to about 45 GPa, from about 17 GPa to about 40 GPa, from about 17 GPa to about 35 GPa, from about 17 GPa to about 33 GPa, from about 17 GPa to about 32 GPa, from about 17 GPa to about 30 GPa, from about 17 GPa to about 25 GPa, from about 18 GPa to about 24 GPa, and all ranges and sub-ranges therebetween. In one or more embodiments, these hardness values are present along indentation depths in the range from about 50 nm to about 300 nm, from about 50 nm to about 400 nm, from about 50 nm to about 500 nm, from about 50 nm to about 600 nm, from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm. In one or more embodiments, these hardness values are present along indentation depths of about 0.3 times or about 0.1 times the thickness of the coating material or less.

In one or more embodiments, the coating material may include silicon, hydrogen and nitrogen and optional other elements (e.g., carbon, oxygen, fluorine, boron or combinations thereof). In such embodiments, the number of Si—N bonds may comprise a majority of the bonds in the coating material. The bond energy for Si—N bonds is about 470 kJ/mol, the bond energy for Si—Si bonds is about 327 kJ/mol and the bond energy of Si—H is about 299.2 kJ/mol. Using this information, maximizing hardness in the absence of hydrogen should require stoichiometric nitride, as was shown by known references. Based on this, a similar trend was expected for embodiments of the coating material described herein that are formed by PECVD; however, the role of hydrogen in such materials was not clear as hydrogen could be bonded either to the silicon or to the nitrogen. Moreover, the role of hydrogen is further complicated where oxygen and/or carbon are included in the coating material. Surprisingly, the embodiments described herein achieve higher Si—N bonding even where hydrogen is present.

In one or more embodiments, the coating material may exhibit a Young's modulus of about 150 GPa or greater. In some embodiments, the coating material may have a Young's modulus of about 152 GPa or greater, about 154 GPa or greater, about 156 GPa or greater, about 158 GPa or greater, about 160 GPa or greater, about 162 GPa or greater, about 164 GPa or greater, about 166 GPa or greater and all ranges and sub-ranges therebetween. In some instances, the upper limit of the modulus may be about 300 GPa (or about 280 GPa, about 260 GPa, about 240 GPa, or about 220 GPa).

In some embodiments, the coating material may be characterized by the ratio of hardness (H) to Young's modulus (E) (i.e., WE). In some embodiments, this ratio may be inverted (i.e., E/H). The ratio WE of some embodiments of the coating material may be in the range from about 0.09 to about 0.11. In some instances, the inverse ratio of E/H may be in the range from about 9 to about 11.

The coating material of some embodiments exhibits low stress, when formed. In some embodiments, the layer of the coating material exhibits a compressive stress of about −400 MPa or greater (e.g., from about −400 MPa to about 0 MPa). In some embodiments, these values were obtained when the coating material was formed using a PECVD process at 150° C.

The coating material of one or more embodiments exhibits an optical band gap of about 3.5 eV or greater. In some embodiments, the coating material exhibits an optical band gap in the range from about 3.5 eV to about 6 eV. In some instances, the optical band gap may be in the range from about 3.6 eV to about 6 eV, from about 3.7 eV to about 6 eV, from about 3.8 eV to about 6 eV, from about 3.9 eV to about 6 eV, from about 4 eV to about 6 eV, from about 4.1 eV to about 6 eV, from about 4.2 eV to about 6 eV, from about 3.5 eV to about 5.8 eV, from about 3.5 eV to about 5.6 eV, from about 3.5 eV to about 5.4 eV, from about 3.5 eV to about 5.2 eV, from about 3.5 eV to about 5 eV, from about 3.5 eV to about 4.8 eV, from about 3.5 eV to about 4.6 eV, from about 3.5 eV to about 4.4 eV, from about 5 eV to about 6 eV, from about 5 eV to about 5.5 eV, or from about 5.5 eV to about 6 eV, and all ranges and sub-ranges therebetween.

The coating material of one or more embodiments may exhibit a refractive index at 632 nm in the range from about 1.6 to about 2.5. In some instances the refractive index at 632 nm may be in the range from about 1.8 to about 2.1. In some embodiments, the coating material exhibits low absorption by exhibiting a k value of about 0.001 or less. The coating material exhibits an absorptive coefficient ($\alpha=4\pi k/\lambda$) of about 0.002 or less (e.g., about 0.0019 or less, about 0.0018 or less or about 0.0017 or less), at a wavelength of about 632 nm.

In some embodiments, the coating material may be disposed on various substrates, as will be described herein, and exhibits sufficient adhesion to prevent delamination. In some embodiments, the coating material may be disposed in a layer having low stress and high film toughness, as described by a load required to cause fracture in the layer.

In some instances, the coating material may exhibit a COF of about 0.2 or less, when measured against steel wool. In some instances, the COF may be about 0.15 or less, about 0.1 or less, about 0.09 or less, about 0.08 or less, about 0.07 or less, about 0.06 or less, or about 0.05 or less, and all ranges and sub-ranges therebetween.

A second aspect of this disclosure pertains to an article including the coating material described herein. As shown in FIG. 2, the article 100 may include a substrate 110, and a coating structure 115 disposed on the substrate. The coating structure 115 forms a coated surface 101. The substrate 110 includes opposing major surfaces 112, 114 and opposing minor surfaces 116, 118. The coating structure 115 includes a layer 120, which is shown in FIG. 2 as being disposed on a first opposing major surface 112; however, the coating structure may be disposed on the second opposing major surface 114 and/or one or both of the opposing minor surfaces, in addition to or instead of being disposed on the first opposing major surface 112.

The coating structure of one or more embodiments may include only the layer 120 or may include the layer 120 and one or more additional layers 140. The layer 120 may include embodiments of the coating material described herein. The layer may include only the coating material described herein or may a mixture of one or more additional materials, in addition to the coating material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

As used herein, the term "dispose" includes coating, depositing and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer, as defined herein.

With respect to measuring the maximum hardness of the articles described herein, typically in nanoindentation measurement methods (such as by the Berkovich Indenter Hardness Test) of a coating material or layer that is harder than the underlying substrate, the measured hardness may appear to increase initially due to development of the plastic zone at shallow indentation depths and then increases and reaches a maximum value or plateau at deeper indentation depths. Thereafter, hardness begins to decrease at even deeper indentation depths due to the effect of the underlying the substrate. Where the coating or layer is less hard than the underlying substrate, the measured hardness may increase after reaching a maximum value or plateau (related to the hardness of the coating), and thereafter increase at deeper indentation depths due to the effect of the underlying substrate.

The indentation depth range and the hardness values at certain indentation depth range(s) may be selected to identify a particular hardness response of the articles, described herein, without the effect of the underlying substrate. When measuring hardness of the article with a Berkovich indenter, the region of permanent deformation (plastic zone) of a coating material is associated with the hardness of the coating material. During indentation, an elastic stress field extends well beyond this region of permanent deformation. As indentation depth increases, the apparent hardness and modulus are influenced by stress field interactions with the underlying substrate. The substrate influence on hardness occurs at deeper indentation depths (i.e., typically at depths greater than about 10% of the layer thickness). Moreover, a further complication is that the hardness response requires a certain minimum load to develop full plasticity during the indentation process. Prior to that certain minimum load, the hardness shows a generally increasing trend.

At small indentation depths (which also may be characterized as small loads) (e.g., up to about 100 nm, or less than about 70 nm) of an article, the apparent hardness of a coating material appears to increase dramatically versus indentation depth. This small indentation depth regime does not represent a true metric of hardness but instead, reflects the development of the aforementioned plastic zone, which is related to the finite radius of curvature of the indenter. At intermediate indentation depths, the apparent hardness approaches maximum levels. At deeper indentation depths, the influence of the substrate becomes more pronounced as the indentation depth increases. Hardness begins to drop dramatically once the indentation depth exceeds about 30% of the layer thickness.

FIG. 1 includes the hardness values as a function of indentation depth for a known article including a substrate and a layer of a known material having different thicknesses. As shown in FIG. 1, the hardness measurement at intermediate indentation depths (at which hardness approaches and is maintained at maximum levels) and at deeper indentation depths depends on the thickness of the layer of the known material. The 500 nm-thick layer of known material exhibited its maximum hardness at indentation depths from about 100 nm to 180 nm, followed by a dramatic decrease in hardness at indentation depths from about 180 nm to about 200 nm, indicating the hardness of the substrate influencing the hardness measurement. The 1000 nm-thick layer of known material exhibited a maximum hardness at indentation depths from about 100 nm to about 300 nm, followed by a dramatic decrease in hardness at indentation depths greater than about 300 nm. The 1500 nm-thick layer of known material exhibited a maximum hardness at indentation depths from about 100 nm to about 550 nm and the 2000-nm thick layer of known material exhibited a maximum hardness at indentation depths from about 100 nm to about 600 nm.

In some embodiments, the maximum hardness of the coating material may be defined along indentation depths of about 50 nm or greater. For example, where the coating material has at thickness of about 1000 nm or less or is part of a coating structure (having a plurality of layers) having a thickness of about 1000 nm or less, the coating material or coating structure may exhibit a maximum hardness along an indentation depth of about 50 nm to about 1000 nm or along an indentation depth that is 0.3 times the thickness less (e.g., 300 nm or less) or about 0.1 times the thickness or less (e.g., 100 nm or less). In some embodiments, the coating material exhibits a maximum hardness at indentation depths greater than about 100 nm. In one or more specific embodiments, this maximum hardness at indentation depths greater than about 100 nm may be present where the coating material has a thickness greater than about 1000 nm or comprises a layer in a coating structure (having a plurality of layers) having a thickness of greater than 1000 nm. The maximum hardness along a defined indentation depth or depth range may be specified depending on the thickness of the coating material or thickness of the layer(s) of the coating material and additional layers (as described herein). In some embodiments, the coating material may exhibit a maximum hardness at depths sufficient to provide resistance to specific scratches such as microductile scratches (which typically have depths of about 200 nm to about 400 nm). As used herein, the phrase "microductile scratch" includes a single groove in a material having unlimited length.

In one or more embodiments, the article 100 exhibits a maximum hardness of about 17 GPa or greater, as measured on the coated surface 101 by the Berkovich Indenter Hardness Test along an indentation depth range. In some embodiments, the maximum hardness of the article 100 may be in the range from about 17 GPa to about 50 GPa, from about 18 GPa to about 50 GPa, from about 19 GPa to about 50 GPa, from about 20 GPa to about 50 GPa, from about 21 GPa to about 50 GPa, from about 22 GPa to about 50 GPa, from about 23 GPa to about 50 GPa, from about 24 GPa to about 50 GPa, from about 25 GPa to about 50 GPa, from about 26 GPa to about 50 GPa, from about 27 GPa to about 50 GPa, from about 28 GPa to about 50 GPa, from about 17 GPa to about 45 GPa, from about 17 GPa to about 40 GPa, from about 17 GPa to about 35 GPa, from about 17 GPa to about 30 GPa, from about 17 GPa to about 25 GPa, from about 18 GPa to about 24 GPa, and all ranges and sub-ranges therebetween. In one or more embodiments, these maximum hardness values are exhibited along indentation depths in the range from about 50 nm to about 300 nm, from about 50 nm to about 400 nm, from about 50 nm to about 500 nm, from about 50 nm to about 600 nm, from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm. Such indentation depths may be used where the coating structure 115 (including the layer 120 alone or in combination with the additional layers 140) has a thickness greater than about 1000 nm. In one or more embodiments, these hardness values are present along indentation depths of about 0.3 times or about 0.1 times the thickness of the coating material (or the coating structure that includes a layer of the coating material) or less. In such embodiments, the coating structure 115 (including the layer 120 alone or in combination with the additional layers 140) has a thickness of about 1000 nm or less.

In one or more embodiments, the coating structure 115 and/or article 100 exhibits scratch resistance that is characterized by a reduction in scratch depth. Specifically, one or more embodiments of the article may exhibit a reduction in scratch depth, when compared to the scratch depth in the substrate 110 without the coating structure 115. When the article 100 is scratched using a Berkovich indenter, using a load of 160 mN at a speed of 10 µm/second for a length of at least 100 µm along the coated surface 101, the resulting scratch has a depth that less than the depth of a scratch formed identically (i.e., using the same indenter, load, speed, and length) on an substrate 110 (without the coating structure disposed thereon) by at least about 30%, at least about 31%, at least about 32%, at least about 33%, at least about 34%, at least about 35%, at least about 36%, at least about 37%, at least about 38%, at least about 39%, at least about 40%, at least about 41%, at least about 42%, at least about 43%, at least about 44%, at least about 45%, at least about 46%, at least about 47%, at least about 48%, at least about 49%, at least about 50%, at least about 51%, at least about 52%, at least about 53%, at least about 54%, at least about 55%, at least about 56%, at least about 57%, at least about 58%, at least about 59%, at least about 60% (and all ranges and sub-ranges therebetween). This scratch resistant property of the coating structure 115 and/or article 100 may be present where the article utilizes an amorphous substrate (e.g., strengthened glass substrate and/or a non-strengthened glass substrate), a crystalline substrate (e.g., a strengthened glass ceramic substrate, a non-strengthened glass ceramic glass substrate, and a single crystal substrate such as sapphire) or a combination thereof. In some embodiments, the scratch resistance may be present where the substrate is polymeric. In addition, this scratch resistant property of the coating structure 115 and/or article 100 may be present when the coated surface 101 article is scratched using the Berkovich indenter, at a speed of 10 µm/second for a length of at least 1 mm, at least 2 mm, at least 3 mm, at least 4 mm or at least 5 mm. Comparison between the article 100 and the bare substrate may be performed on the same article, where the coated surface 101 is tested to evaluate the scratch depth of the article and the opposite surface of the substrate (e.g., 114, in FIG. 1) is tested evaluate the scratch depth of the bare substrate; the resulting scratch depths may be compared to determine the scratch depth reduction on the coated surface 101 with respect to the bare substrate. In one or more embodiments, the article 100 exhibits the improved reduction in scratch depth in comparison with a bare substrate having a hardness in the range from about 7 GPa to about 8 GPa, as measured by the Berkovich Indenter Hardness Test.

In one or more embodiments, when the article 100 is scratched by a Berkovich indenter using a load of 160 mN at a speed of 10 µm/seconds for at least a length of 100 µm along the coated surface 101, the resulting scratch has a scratch depth of less than 250 nm, less than 240 nm, less than 230 nm, less than 220 nm, or less than about 200 nm. The scratch depths described herein may be measured from the original and undisturbed surface of the coated surface. In other words, the scratch depth does not include any amount of coating structure 115 that may be built up around the edges of the scratch due to displacement of the coating structure materials caused by the penetration of the Berkovich indenter into the coating structure.

In one or more embodiments, the coating structure 115 and/or article 100 exhibits scratch resistance that is characterized by a reduction in scratch width. Specifically, one or more embodiments of the article 100 may exhibit a reduction in scratch width, when compared to the scratch depth in the substrate 110 without the coating structure 115. When the article 100 is scratched using a Berkovich indenter, using a load of 160 mN at a speed of 10 µm/second for a length of at least 100 µm along the coated surface 101, the resulting scratch has a width that is at least about 30%, at least about 31%, at least about 32%, at least about 33%, at least about 34%, at least about 35%, at least about 36%, at least about 37%, at least about 38%, at least about 39%, at least about 40%, at least about 41%, at least about 42%, at least about 43%, at least about 44%, at least about 45% (and all ranges and sub-ranges therebetween) less than the width of a scratch formed identically (i.e., using the same indenter, load, speed, and length) on a substrate 110, without the coating structure 115 disposed thereon. This scratch resistant property of the coating structure 115 and/or article 100 may be present where the article utilizes an amorphous substrate (e.g., strengthened glass substrate and/or a non-strengthened glass substrate), a crystalline substrate (e.g., a strengthened glass ceramic substrate, a non-strengthened glass ceramic glass substrate, and a single crystal substrate such as sapphire) or a combination thereof. In one or more alternative embodiments, this scratch resistance may be present where the substrate is polymeric. In addition, this scratch resistance may be present when the coated surface 101 of the article is scratched using the Berkovich indenter, at a speed of 10 µm/second for a length of at least 1 mm, at least 2 mm, at least 3 mm, at least 4 mm or at least 5 mm. Comparison between the article 100 and the bare substrate 110 may be performed on the same article, where the coated surface 101 is tested to evaluate the scratch width of the article and the opposite surface of the substrate (e.g., 114, in FIG. 2) is tested evaluate the scratch depth of the bare substrate; the resulting scratch widths may be compared to determine the scratch width reduction on the coated surface 101 with respect to the bare substrate. In one or more embodiments, the article 100 exhibits the improved reduction in scratch width in comparison with a bare substrate having a hardness in the range from about 7 GPa to about 8 GPa, as measured by the Berkovich Indenter Hardness Test.

In one or more embodiments, when an article is scratched by a Berkovich indenter using a load of 160 mN at a speed of 10 µm/seconds for at least a length of 100 µm along the coated surface 101, the resulting scratch has a scratch width of less than about 10 µm. In some embodiments, the resulting scratch has a scratch width in the range from about 1 µm to about 10 µm, from about 2 µm to about 10 µm, from about 3 µm to about 10 µm, from about 4 µm to about 10 µm, from about 5 µm to about 10 µm, from about 1 µm to about 9 µm, from about 1 µm to about 8 µm, from about 1 µm to about 7 µm, from about 1 µm to about 6 µm, from about 2 µm to about 8 µm, from about 2 µm to about 6 µm, from about 2 µm to about 5 µm, or from about 2 µm to about 4 µm and all ranges and sub-ranges therebetween. The scratch widths described herein may be measured from the original and undisturbed coated surface 101. In other words, the scratch width does not include any amount of coating structure 115 that may be built up around the edges of the scratch due to displacement of the coating structure caused by the penetration of the Berkovich indenter.

The article 100 of one or more embodiments exhibits a Vickers indentation fracture threshold of about 1000 grams or greater, or about 2000 grams or greater.

In one or more embodiments, the article 100 exhibits an average transmittance of about 85% or greater (e.g., about 86% or greater, about 88% or greater, about 90% or greater, about 92% or greater, or even about 94% or greater) over the optical wavelength regime, as measured from the coated surface 101. The total reflectance of the article 100, as measured at the coated surface 101, may be about 15% or less, over the optical wavelength regime. In some embodiments, the article 100 exhibits a total reflectance, as measured at the coated surface 101, of about 1% or less, or about 0.5% or less, over the optical wavelength regime. As used herein, the term "transmittance" is defined as the percentage of incident optical power within a given wavelength range transmitted through a material (e.g., the coating material, a layer of such coating material, and/or the article 100). The term "reflectance" is similarly defined as the percentage of incident optical power within a given wavelength range that is reflected from a material (e.g., the coating material, a layer of such coating material, and/or the article 100). Transmittance and reflectance are measured using a specific linewidth. In one or more embodiments, the spectral resolution of the characterization of the transmittance and reflectance is less than 5 nm or 0.02 eV. In some embodiments, the article 100 exhibits an average reflectance (as measured from the coated surface 101) of about 11% or less, as measured on only the coated surface 101 over the optical wavelength regime.

The thickness of the coating structure 115 and/or of the layer 120 may be up to about 5 micrometers (µm). In some embodiments, the thickness of the coating structure 115 and/or layer 120 may be in the range from about 100 nanometers (nm) to about 5 micrometers (µm), 200 nanometers (nm) to about 5 micrometers (µm), 300 nanometers (nm) to about 5 micrometers (µm), 400 nanometers (nm) to about 5 micrometers (µm), 500 nanometers (nm) to about 5 micrometers (µm), from about 600 nm to about 5 micrometers (µm), from about 700 nm to about 5 micrometers (µm), from about 800 nm to about 5 micrometers (µm), from about 900 nm to about 5 micrometers (µm), from about 1 micrometer (µm) to about 5 micrometers (µm), from about 1.1 micrometers (µm) to about 5 micrometers (µm), from about 1.2 micrometers (µm) to about 5 micrometers (µm), from about 1.3 micrometers (µm) to about 5 micrometers (µm), from about 1.4 micrometers (µm) to about 5 micrometers (μm), from about 1.5 micrometers (μm) to about 5 micrometers (μm), from about 1.6 micrometers (μm) to about 5 micrometers (μm), from about 1.7 micrometers (μm) to about 5 micrometers (μm), from about 1.8 micrometers (μm) to about 5 micrometers (μm), from about 1.9 micrometers (μm) to about 5 micrometers (μm), from about 2 micrometers (μm) to about 5 micrometers (μm), 1 micrometer (μm) to about 3 um, from about 1 micrometer (μm) to about 2.8 micrometers (μm), from about 1.5 micrometers (μm) to about 2.6 micrometers (μm), from about 1.5 micrometers (μm) to about 2.4 micrometers (μm), from about 1.5 micrometers (μm) to about 2.2 micrometers (μm), from about 1.5 micrometers (μm) to about 2 micrometers (μm), from about 1.6 micrometers (μm) to about 3 micrometers (μm), from about 1.7 micrometers (μm) to about 3 micrometers (μm), from about 1.8 micrometers (μm) to about 3 micrometers (μm), from about 1.9 micrometers (μm) to about 3 micrometers (μm), from about 2 micrometers (μm) to about 3 micrometers (μm), from about 2.1 micrometers (μm) to about 3 micrometers (μm), from about 2.2 micrometers (μm) to about 3 micrometers (μm), from about 2.3 micrometers (μm) to about 3 micrometers (μm), and all ranges and sub-ranges therebetween. In some embodiments, the physical thickness of the coating structure 115 and/or layer 120 may be in the range from about 0.1 micrometers (μm) to about 2 micrometers (μm), or from about 0.1 μm to about 1 micrometers (μm), or from 0.2 micrometers (μm) to about 1 micrometers (μm). In some embodiments, the thickness of the coating structure 115 and/or layer 120 may be about 500 nm or less (e.g., about 400 nm or less, about 300 nm or less, about 200 nm or less, about 100 nm or less).

Figure 3A:
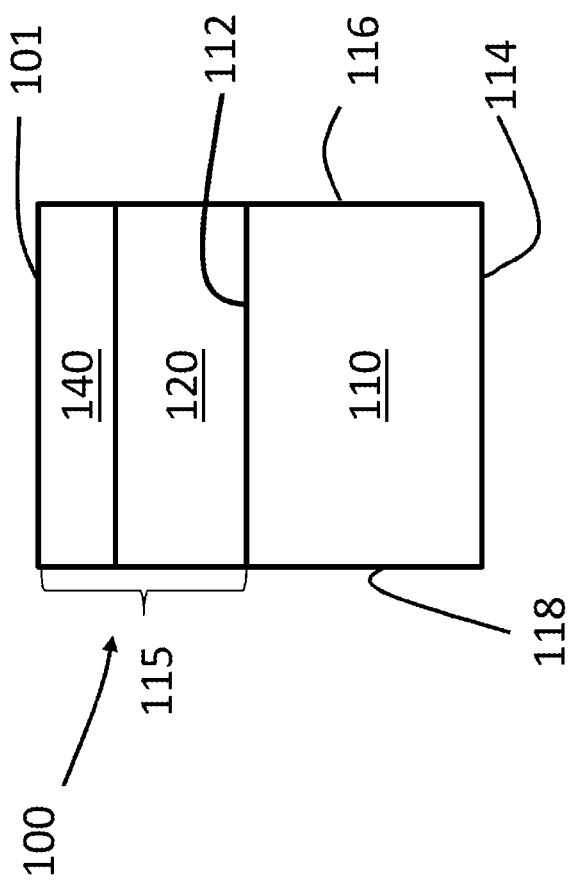
FIG. 3A is a side-view illustration of the article of FIG. 1 with an additional layer disposed on the layer.
Figure 3B:
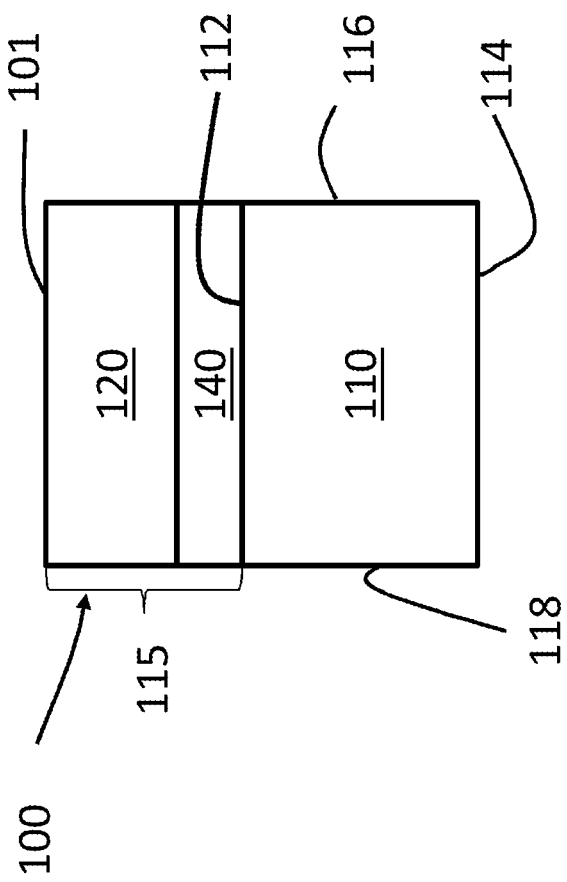
FIG. 3B is a side-view illustration of the article of FIG. 1, with an additional layer disposed between the layer and the substrate.

The coating structure 115 may also include one or more additional layers 140, as shown in FIGS. 3A-3C. In one option, an additional layer 140 may be disposed on the layer 120 (FIG. 3A). In another option, the additional layer 140 may be disposed between the layer 120 and the substrate 110 (FIG. 3B). In yet another option, one additional layer 140A may be disposed on the layer 120 and a second additional layer 140B may be disposed between the layer 120 and the substrate 110 (FIG. 3C). The additional layer(s) 140 may include one or more sub-layers as described herein. It should be noted that any one or more of the additional layer 140 used in the embodiments described herein may be formed by methods that differ from the layer 120. For example, the additional layer(s) 140 may be formed by chemical vapor deposition (e.g., plasma enhanced chemical vapor deposition), physical vapor deposition (e.g., reactive or nonreactive sputtering or laser ablation), thermal or e-beam evaporation and/or atomic layer deposition. The additional layer(s) may provide or enhance the scratch-resistance, optical properties, anti-fingerprint properties, strength retention or other attributes of the article 100. For example, the layer 120 may be alternated with the additional layers 140 forming an alternating layer structure of high and low refractive index materials. The coating structure 115 may also include more than one layer 120. The thicknesses of the individual layer 120 and additional layers 140 and combined thickness of all of the layer 120 and all of the additional layer 140 may be tuned to achieve desirable properties. Exemplary materials for use in the additional layer 140 include: $SiO_2$, $Al_2O_3$, $GeO_2$, SiO, AlOxNy, AlN, $Si_3N_4$, $SiO_xN_y$, $Si_uAl_vO_xN_y$, $Si_xC_y$, $Si_xO_yC_z$, $Ta_2O_5$, $Nb_2O_5$, $TiO_2$, $TiO_xN_y$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, organosilicates (e.g., $SrF_3$, $LaF_3$, $GdF_3$ and the like), diamond, diamond-like carbon, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, and combinations thereof. The layer 120/or the additional layer 140 may be characterized as PECVD-deposited layers.

An exemplary coating structure 115 disposed on substrate 110 is shown in Table A.

TABLE A

Exemplary coating structure 1:

| | Refractive Index | Physical Thickness | Quarter-wave Optical Thickness (QWOT) |
|---|---|---|---|
| Additional sub-layer 140G | Low | | 0.1-0.25 |
| Layer 120 | High | 2000 nm | |
| Additional sub-layer 140F | Low | | 0.07-0.13 |
| Additional sub-layer 140E | High | | 0.5-0.65 |
| Additional sub-layer 140D | Low | | 0.25-0.38 |
| Additional sub-layer 140C | High | | 0.32-0.37 |
| Additional sub-layer 140B | Low | | 0.5-0.6 |
| Additional sub-layer 140A | High | | 0.1-0.13 |
| Substrate | | | |

In some embodiments, the low refractive index materials used for the additional layers 140B, D, F, and G may have a refractive index (at a wavelength of about 550 nm) may be in the range from about 1.45 to about 1.50 and an absorption (k) at a wavelength of about 400 nm of less than about $1^{-4}$.

In some embodiments, the high refractive index materials used for the additional layers 140A, C, and E may have a refractive index (at a wavelength of about 550 nm) may be in the range from about 1.85 to about 2.05 and an absorption (k) at a wavelength of about 400 nm of less than about $3^{-4}$. In some embodiments, the layer 120 of the coating structure shown in Table A may include SiOxNyCz and may exhibit a refractive index (at a wavelength of about 550 nm) in the range from about 1.85 to about 2.05 and an absorption (k) at a wavelength of about 400 nm of less than about $3^{-4}$.

Other examples of coating structure 115 are shown in Tables B and C.

TABLE B

Exemplary coating structure 2.
Coating Structure 2

| Deposition method | Substrate | Material Glass | Physical thickness (nm) | Refractive Index (at 550 nm) |
|---|---|---|---|---|
| PVD | Additional layer 140A | SiNx | 9.1 | 1.871 |
| PVD | Additional layer 140B | $SiO_2$ | 51.9 | 1.48 |
| PVD | Additional layer 140C | SiNx | 26.9 | 1.871 |
| PVD | Additional layer 140D | $SiO_2$ | 31.0 | 1.48 |
| PVD | Additional layer 140E | SiNx | 45.2 | 1.871 |
| PVD | Additional layer 140F | $SiO_2$ | 10 | 1.48 |
| PECVD | Layer 120 | SiNx | 2000 | 1.904 |
| PVD or PECVD | Additional layer 140G | $SiO_2$ | 21.4 | 1.48 |

TABLE C

Exemplary coating structure 3.
Coating Structure 3

| Deposition method | Substrate | Material Glass | Physical thickness (nm) | Refractive Index (at 550 nm) |
| --- | --- | --- | --- | --- |
| PVD | Additional layer 140A | AlOxNy | 7.1 | 2.063 |
| PVD | Additional layer 140B | $SiO_2$ | 54.1 | 1.482 |
| PVD | Additional layer 140C | AlOxNy | 21.9 | 2.063 |
| PVD | Additional layer 140D | $SiO_2$ | 34.6 | 1.482 |
| PVD | Additional layer 140E | AlOxNy | 33.7 | 2.063 |
| PVD | Additional layer 140F | $SiO_2$ | 11.9 | 1.482 |
| PECVD | Layer 120 | SiNx | 2000 | 2.062 |
| PVD or PECVD | Additional layer 140G | $SiO_2$ | 12 | 1.482 |

In some embodiments, the additional layer 140 may include a thin layer of boron that is disposed on the layer 120. In some instances, this additional layer of boron may have a thickness of about 100 nm or less (e.g., about 90 nm or less, about 80 nm or less, about 70 nm or less, about 60 nm or less, about 50 nm or less, about 40 nm or less, about 30 nm or less, about 20 nm or less or about 10 nm or less. In some instances, this additional layer of boron may be the outermost layer of the article 100 and thus, may form the coated surface 101. In some instances, the layer 120 may have a non-homogenous composition such that the outermost portion of the layer 120 includes boron, while the remaining portion of the layer 120 is free of boron.

The coating structure 115 or the surface thereof may exhibit a smooth surface. In some embodiments, the surface may have a roughness Rq of about 8 nm or less. In some embodiments, the coating structure 115 or any of the layers thereof (e.g., 120, 140 etc.) may exhibit about 40 or less defects (having an average longest cross-sectional dimension in the range form about 1 micrometer to about 5 micrometers) per square millimeter area. In some embodiments, the coating structure 115 or any of the layers thereof (e.g., 120, 140 etc.) may exhibit about 10 or less, about 5 or less, or about 1 or less defects (having an average longest cross-sectional dimension in the range from 50 micrometer or greater) per square millimeter area. The coating structure 115 or any layers thereof (e.g., 120, 140 etc.) may exhibit a uniformity in refractive index and/or thickness. In some embodiments, the refractive index and/or thickness of the coating structure 115 or any layers thereof varies by less than about 1% across the surface thereof.

In some embodiments, the coating structure 115 or any layers thereof (e.g., 120, 140 etc.) exhibit a compressive stress of about −350 MPa or less (e.g., in the range from about 0 MPa to about −350 MPa, 0 MPa to about −300 MPa, or 0 MPa to about 250 MPa).

The article 100 of one or more embodiments may exhibit a colorlessness. The colorlessness described herein is with reference to the (L, a*, b*) colorimetry system, using an illuminant. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting).

In some examples, the article exhibits an article color transmittance having transmittance color coordinates at normal incidence in the CIE (L*, a*, b*) colorimetry system such that the distance between the article transmittance color coordinates and a reference point (also measured at normal incidence) is less than about 5 (e.g., less than about 4, less than about 3, less than about 2, less than about 1 or less than about 0.5). This distance may be referred to as "a reference point color shift". In one or more embodiments, the article exhibits an article color reflectance having reflectance color coordinates at normal incidence in the (L*, a*, b*) colorimetry system such that the distance between the article reflectance color coordinates and a reference point (also measured at normal incidence) is less than about 5 (e.g., less than about 4, less than about 3, less than about 2, less than about 1 or less than about 0.5). This distance may be referred to as "a reference point color shift". The article reflectance and/or transmittance color coordinates of the article are measured from the coated surface 101 at normal incidence. In one or more embodiments, the reference point may be the origin (0, 0) or (−2, −2) in the L*a*b* color space (or the color coordinates a*=0, b*=0 or a*=−2, b*=−2) or the transmittance color coordinates or reflectance color coordinates of the substrate 110. Where the reference point color shift of the article 100 is defined with respect to the substrate, the transmittance color coordinates of the article are compared to the transmittance color coordinates of the substrate and the reflectance color coordinates of the article are compared to the reflectance color coordinates of the substrate. In one or more specific embodiments, the reference point color shift of the article transmittance color and/or the article reflectance color with respect to the reference point may be less than 1 or even less than 0.5. In one or more specific embodiments, the reference point color shift for the article transmittance color and/or the article reflectance color with respect to the reference point may be 1.8, 1.6, 1.4, 1.2, 0.8, 0.6, 0.4, 0.2, 0 and all ranges and sub-ranges therebetween. Where the reference point is the color coordinates a*=0, b*=0, the color shift is calculated by the equation, color coordinate distance=$\sqrt{((a*)^2+(b*)^2)}$. Where the reference point is the color coordinates a*=−2, b*=−2, the color shift is defined by $\sqrt{((a*_{article}+2)^2+(b*_{article}+2)^2)}$ Where the reference point is the color coordinates of the substrate 110, the color shift is calculated by the equation, color coordinate distance=$\sqrt{((a*_{article}-a*_{substrate})^2 (b*_{article}-b*_{substrate})^2)}$.

In one or more embodiments, the article 100 may exhibit an angular color shift (in transmittance or reflectance) of less than about 5, when viewed at an incident illumination angle away from a reference incident illumination angle under an illuminant. As used herein, the phrase "angular color shift" with respect to viewing angle refers to the change in both a* and b*, under the CIE (L*, a*, b*) colorimetry system.

The angular color shifts in reflection with viewing angle due to a shift in the spectral reflectance oscillations with incident illumination angle. Angular color shifts in transmittance with viewing angle are also due to the same shift in the spectral transmittance oscillation with incident illumination angle. The observed color and angular color shifts with incident illumination angle are often distracting or objectionable to device users, particularly under illumination with sharp spectral features such as fluorescent lighting and some LED lighting. Angular color shifts in transmission may also play a factor in color shift in reflection and vice versa. Factors in angular color shifts in transmission and/or reflection may also include angular color shifts due to viewing angle or angular color shifts away from a certain white point that may be caused by material absorption (somewhat independent of angle) defined by a particular illuminant or test system.

The reflectance and/or transmittance angular color coordinates of the article are measured from the coated surface 101. Color shift with respect to viewing angle may be determined using the following equation: $\sqrt{((a^*_2-a^*_1)^2+(b^*_2-b^*_1)^2)}$, $a^*$ and $b^*$ coordinates (in transmittance or reflectance) of the article when viewed at a reference incident illumination angle (which may include normal incidence or about 6 degrees from normal incidence) (i.e., $a^*_1$, and $b^*_1$) and at an incident illumination angle away from the reference incident illumination angle (i.e., $a^*_2$, and $b^*_2$), provided that the incident illumination angle is different from the reference incident illumination angle and in some cases differs from the reference incident illumination angle by at least about 2 degrees or about 5 degrees. In some instances, a color shift of about 5 or less is exhibited by the article when viewed at various incident illumination angles from the reference incident illumination angle, under an illuminant. In some instances the color shift is about 4 or less, 3 or less, 2.5 or less, 2 or less, 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less. In some embodiments, the color shift may be about 0.

The illuminant used to measure angular color shift can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting). In specific examples, the articles exhibit an angular color shift in reflectance and/or transmittance of about 5 or less when viewed at incident illumination angle from the reference illumination angle under a CIE F2, F10, F11, F12 or D65 illuminant, or more specifically, under a CIE F2 illuminant.

The reference illumination angle may include normal incidence, 5 degrees from normal incidence, 6 degrees from normal incidence, 10 degrees from normal incidence, 15 degrees from normal incidence, 20 degrees from normal incidence, 25 degrees from normal incidence, 30 degrees from normal incidence, 35 degrees from normal incidence, 40 degrees from normal incidence, 50 degrees from normal incidence, 55 degrees from normal incidence, or 60 degrees from normal incidence, provided the difference between the reference illumination angle and the incident illumination angle is at least about 1 degree, 2 degrees or about 5 degrees. The incident illumination angle may be, with respect to the reference illumination angle, in the range from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween, away from the reference illumination angle. The article may exhibit the angular color shifts in reflectance and/or transmittance described herein at and along all the incident illumination angles in the range from about 2 degrees to about 80 degrees (or from about 10 degrees to about 80 degrees, or from about 20 degrees to about 80 degrees), when the reference illumination angle is normal incidence. In some embodiments, the article may exhibit the angular color shifts in reflectance and/or transmittance described herein at and along all the incident illumination angles in the range from about 2 degrees to about 80 degrees (or from about 10 degrees to about 80 degrees, or from about 20 degrees to about 80 degrees), when the difference between the incident illumination angle and the reference illumination angle is at least about 1 degree, 2 degrees or about 5 degrees. In one example, the article may exhibit an angular color shift in reflectance and/or transmittance of 5 or less (e.g., 4 or less, 3 or less or about 2 or less) at any incident illumination angle in the range from about 2 degrees to about 60 degrees, from about 5 degrees to about 60 degrees, or from about 10 degrees to about 60 degrees away from a reference illumination angle equal to normal incidence. In other examples, the article may exhibit an angular color shift in reflectance and/or transmittance of 5 or less (e.g., 4 or less, 3 or less or about 2 or less) when the reference illumination angle is 10 degrees and the incident illumination angle is any angle in the range from about 12 degrees to about 60 degrees, from about 15 degrees to about 60 degrees, or from about 20 degrees to about 60 degrees away from the reference illumination angle.

In some embodiments, the angular color shift may be measured at all angles between a reference illumination angle (e.g., normal incidence) and an incident illumination angle in the range from about 20 degrees to about 80 degrees. In other words, the angular color shift may be measured and may be less than about 5 or less than about 2, at all angles in the range from about 0 degrees and 20 degrees, from about 0 degrees to about 30 degrees, from about 0 degrees to about 40 degrees, from about 0 degrees to about 50 degrees, from about 0 degrees to about 60 degrees or from about 0 degrees to about 80 degrees.

In some instances, the article transmittance color shift, article reflectance color shift and/or angular color shift may be defined in terms of a radius of 1 or less, 0.5 or less, or about 0.2 or less from a reference point that is determined by the illuminant used. Where D65 is utilized, and the radius may be determined from a reference point of ($L^*$=96.9 $a^*$=−0.01, $b^*$=0.15) and at an incident illumination angle of about 10 degrees. In another embodiment, where F2 is utilized, the radius may be determined from a reference point of ($L^*$=33.8, $a^*$=0.07, $b^*$=−0.52) at an incident illumination angle in the range from about 5 degrees to about 60 degrees.

The substrate 110 may be inorganic and may include an amorphous substrate, a crystalline substrate or a combination thereof. In some specific embodiments, the substrate 110 may specifically exclude plastic and/or metal substrates. In some embodiments, the substrate 110 may be organic and specifically polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In one or more embodiments, the substrate exhibits a refractive index in the range from about 1.45 to about 1.55. In specific embodiments, the substrate 110 may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the substrate 110 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the substrate 110 may be amorphous and may include glass, which may be strengthened or non-strengthened. Examples of suitable glass include soda lime glass, alkali-free glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 may be substantially planar or sheet-like, although other embodiments may utilize a curved or otherwise shaped or sculpted substrate. The substrate 110 may be substantially optically clear, transparent and free from light scattering. In such embodiments, the substrate may exhibit an average transmittance over the optical wavelength regime of about 85% or greater, about 86% or greater, about 87% or greater, about 88% or greater, about 89% or greater, about 90% or greater, about 91% or greater or about 92% or greater. In one or more alternative embodiments, the substrate 110 may be opaque or exhibit an average transmittance over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In substrate 110 may optionally exhibit a color, such as white, black, red, blue, green, yellow, orange etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the article 100.

The substrate 110 may be provided using a variety of different processes. For instance, where the substrate 110 includes an amorphous substrate such as glass, various forming methods can include float glass processes and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, and depth of layer (DOL). Surface CS may be measured near the surface or within the strengthened glass at various depths. A maximum CS value may include the measured CS at the surface ($CS_s$) of the strengthened substrate. The CT, which is computed for the inner region adjacent the compressive stress layer within a glass substrate, can be calculated from the CS, the physical thickness t, and the DOL. CS and DOL are measured using those means known in the art. Such means include, but are not limited to, measurement of surface stress (FSM) using commercially available instruments such as the FSM-6000, manufactured by Luceo Co., Ltd. (Tokyo, Japan), or the like, and methods of measuring CS and DOL are described in ASTM 1422C-99, entitled "Standard Specification for Chemically Strengthened Flat Glass," and ASTM 1279.19779 "Standard Test Method for Non-Destructive Photoelastic Measurement of Edge and Surface Stresses in Annealed, Heat-Strengthened, and Fully-Tempered Flat Glass," the contents of which are incorporated herein by reference in their entirety. Surface stress measurements rely upon the accurate measurement of the stress optical coefficient (SOC), which is related to the birefringence of the glass substrate. SOC in turn is measured by those methods that are known in the art, such as fiber and four point bend methods, both of which are described in ASTM standard C770-98 (2008), entitled "Standard Test Method for Measurement of Glass Stress-Optical Coefficient," the contents of which are incorporated herein by reference in their entirety, and a bulk cylinder method. The relationship between CS and CT is given by the expression (1):

$$CT=(CS \cdot DOL)/(t-2DOL) \quad (1),$$

wherein t is the physical thickness (μm) of the glass article. In various sections of the disclosure, CT and CS are expressed herein in megaPascals (MPa), physical thickness t is expressed in either micrometers (μm) or millimeters (mm) and DOL is expressed in micrometers (μm).

In one embodiment, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOL of 10 μm or greater, 15 μm or greater, 20 μm or greater (e.g., 25 μm, 30 μm, 35 μm, 40 μm, 45 μm, 50 μm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate has one or more of the following: a surface CS greater than 500 MPa, a DOL greater than 15 μm, and a CT greater than 18 MPa.

Example glasses that may be used in the substrate may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $1K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq (MgO+CaO) \leq 7$ mol. %.

In a particular embodiment, an alkali aluminosilicate glass composition suitable for the substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $$\frac{Al_2O_3 + B_2O_3}{\sum \text{modifiers}} > 1,$$

where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $$\frac{Al_2O_3 + B_2O_3}{\sum \text{modifiers}} > 1.$$

In still another embodiment, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % $\leq SiO_2+B_2O_3+CaO \leq 69$ mol. %; $Na_2O+K_2O+B_2O_3+MgO+CaO+SrO>10$ mol. %; 5 mol. % $\leq MgO+CaO+SrO \leq 8$ mol. %; $(Na_2O+B_2O_3)-Al_2O_3 \leq 2$ mol. %; 2 mol. % $\leq Na_2O-Al_2O_3 \leq 6$ mol. %; and 4 mol. % $\leq (Na_2O+K_2O)-Al_2O_3 \leq 10$ mol. %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable crystalline materials include polycrystalline alumina layer and/or spinel ($MgAl_2O_4$).

Optionally, the crystalline substrate 110 may include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ system (i.e. MAS-System) glass ceramics, and/or glass ceramics that include a predominant crystal phase including β-quartz solid solution, β-spodumeness, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

The substrate 110 according to one or more embodiments can have a physical thickness ranging from about 100 μm to about 5 mm. Example substrate 110 physical thicknesses range from about 100 µm to about 500 µm (e.g., 100, 200, 300, 400 or 500 µm). Further example substrate 110 physical thicknesses range from about 500 µm to about 1000 µm (e.g., 500, 600, 700, 800, 900 or 1000 µm). The substrate 110 may have a physical thickness greater than about 1 mm (e.g., about 2, 3, 4, or 5 mm). In one or more specific embodiments, the substrate 110 may have a physical thickness of 2 mm or less or less than 1 mm. The substrate 110 may be acid polished or otherwise treated to remove or reduce the effect of surface flaws.

A third aspect of this disclosure pertains to a method of forming the coating materials described herein. In one or more embodiments, the method includes forming the coating material using a chemical vapor deposition process. In specific embodiments, a plasma-enhanced chemical vapor deposition process may be utilized to form the coating materials. Without being bound by theory, such processes allow for a greater or faster deposition rate, as compared to rates typically achieved by physical vapor deposition processes. In addition, the methods described herein may include selectively etching the formed coating material, the deposition chamber or both during formation of the coating material. In such embodiments, the resulting coating material exhibits lower defects in terms of size, type and frequency of defects. The material may be formed in one or more layers, as described herein.

In one or more embodiments, the method includes introducing a source gas into a chamber, and forming the coating material as described herein by chemical vapor deposition on a substrate. The method may include generating a plasma in the chamber by inductively coupled plasma (ICP) methods, electron cyclotron resonance (ECR) or capacitively coupled parallel plate methods. The source gas can include any one or more of a silicon source gas, an aluminum source gas and a nitrogen source gas. In one or more embodiments, the silicon source gas may include silane, the aluminum source gas may include $AlCl_3$, trimethylaluminum $Al_2(CH_3)_6$, or other known aluminum source gases, and the nitrogen source gas may include nitrogen, nitrous oxide, ammonia or a combination thereof. In some embodiments, additional gases may be introduced into the chambers such as a hydrogen source gas (e.g., silane or hydrogen), a carbon source gas (e.g., carbon monoxide, carbon dioxide, acetylene, butane, and methane), oxygen, a fluorine source gas (e.g., silicon tetrafluoride, and a fluorocarbon), a boron source gas (e.g., $B_2H_6$, $BF_3$ or other known boron sources), or a combination thereof. The deposition composition may be about 550° C. or less or about 150° C. or less. In one or more embodiments, the method may include introducing a substrate into the chamber before forming the coating material. The method may include forming one or more additional layers between the coating material and the substrate or on top of the coating material. Optionally, the method may include one or more cleaning steps before forming the coating material and/or any one or more of the additional layers.

EXAMPLES

Various embodiments will be further clarified by the following examples.

In the following examples, layers of coating materials according to the embodiments described herein and a known material were formed on substrates available under the trademark Eagle XG™, from Corning Incorporated. The thickness, index, and optical band gap of the layers was measured with an n&k analyzer (n&k Technology, Inc., San Jose Calif.) using single F-K oscillator model included accompanying software. Hardness was measured according to the Berkovich Indenter Hardness Test and Young's modulus was measured using a Berkovich indenter using known methods in the art.

The hydrogen content of the layers was measured by nuclear reaction analysis (NRA) using a 2 µC of charge of $^{15}N$ beam at 6.38 MeV. The composition of the layers for components other than hydrogen was determined by x-ray photoelectron spectroscopy (XPS) using a PHI-Quantum 2000 XPS instrument. The data were analyzed using the software package provided by the vendor of the XPS unit. For composition measurements, a region measuring 2 mm×2 mm were selected from the surface of the layer; a point measuring 0.2 mm in diameter was selected at the center of the 2 mm×2 mm region and the composition of the layer at the 0.2 mm diameter point was measured. The 2 mm×2 mm region was then sputtered for a certain period of time ranging from a fraction of a minute to several minutes using $Ar^+$ ions accelerated at 4 kV resulting in current at the surface of approximately 15 W. Following the sputter step, the composition of the 0.2 mm point at the center of the 2 mm×2 mm sputtered in the same manner and the region was measured again. This process was repeated numerous times until the entire depth of the layer was sputtered and substrate was exposed. In this manner, depth profiles of concentrations of the different elements as a function of layer thickness were obtained. The layer compositions were calculated by averaging the concentrations of each element in the bulk of the layer, avoiding the surface region, typically ranging from a depth from about 20 nm to about 200 nm into the layer and extending to the underlying substrate. The precision of this method of calculating the composition, as measured by the standard deviation of composition of the multiple depths, is approximately ±0.5 atomic %. Sputter depth profiling using Ar ions may result in preferential sputtering of certain elements such that the bulk composition measured by XPS may differ from the actual bulk composition. Correction factors accounting for preferential sputtering effects were not applied; compositions were calculated using only the methodology described above. It should be noted that a comparison of XPS depth profiles obtained as described above and bulk composition measurements using other analytical techniques for comparable oxynitride materials is available and indicates that the magnitude of variation between XPS depth profiles measured according to the methodology described herein and the composition measured by these other techniques is small (Martin, D. M., Enlund, J., Kappertz, O, Jensen, J. "Comparison of XPS and ToF-ERDA Measurement of High-k Dielectric Materials," Journal of Physics: Conference Series 100 (2008) 012036).

Example 1

In Examples 1A-1F, single layers having a thickness of 400 nm and the following coating material compositions (A-F) were formed as described above: SiNx, SiNxFy, SiOxNy, SiCxNy, SiCxOyNz, and SiOxCy. The single layers were each formed on separate substrates using a Plasma-Therm Versaline High Density Plasma ("HDP") CVD tool. The Plasma-Therm Versaline HDPCVD tool is an inductively coupled plasma ("ICP") CVD system which uses an 2 MHz inductively coupled plasma source to attain high ionization independent of substrate bias which is set by a 13.56 MHz RF supply driving the platen on which the substrate is placed. Such systems permit fully dense films to be deposited at lower substrate temperatures than a conventional parallel plate PECVD. The process conditions included using deposition gases of silane, nitrogen, hydrogen, methane, carbon dioxide, nitrous oxide, oxygen, hydrogen, and silicon tetrafluoride (as appropriate, in units of sccm, and as shown in Table 1) and a substrate temperature of about 150° C. and a pressure (P) of 12.5 or 5 mtorr, as shown in Table 1. Argon was flowed at a rate of 50 sccm and RF power was supplied to the coil at 600 W or 1500 W, as shown in Table 1. The deposition time is reported in seconds in Table 1.

TABLE 1

Examples 1A-1F deposition conditions.

| Ex. | Time | P | $SiH_4$ | $N_2$ | $H_2$ | $O_2$ | $N_2O$ | $CH_4$ | $CO_2$ | $SiF_4$ | Power | Bias | Coating material Comp. |
|---|---|---|---|---|---|---|---|---|---|---|---|---|---|
| 1A-1 | 210 | 12.5 | 29.5 | 18.5 | 29.5 | 0 | 0 | 0 | 0 | 0 | 1500 | 0 | $SiNx$ |
| 1A-2 | 210 | 12.5 | 27 | 21 | 0 | 0 | 0 | 0 | 0 | 0 | 1500 | 0 | $SiNx$ |
| 1A-3 | 210 | 12.5 | 29.5 | 18.5 | 0 | 0 | 0 | 0 | 0 | 0 | 1500 | 0 | $SiNx$ |
| 1A-4 | 210 | 12.5 | 24 | 24 | 0 | 0 | 0 | 0 | 0 | 0 | 1500 | 0 | $SiNx$ |
| 1A-5 | 210 | 12.5 | 22.6 | 17.4 | 10 | 0 | 0 | 0 | 0 | 0 | 1500 | 50 | $SiNx$ |
| 1A-6 | 210 | 12.5 | 24 | 16 | 10 | 0 | 0 | 0 | 0 | 0 | 1500 | 50 | $SiNx$ |
| 1A-7 | 210 | 12.5 | 22.6 | 17.4 | 60 | 0 | 0 | 0 | 0 | 0 | 1500 | 0 | $SiNx$ |
| 1A-8 | 210 | 12.5 | 23.3 | 16.7 | 60 | 0 | 0 | 0 | 0 | 0 | 1500 | 0 | $SiNx$ |
| 1A-9 | 210 | 12.5 | 27 | 21 | 0 | 0 | 0 | 0 | 0 | 0 | 1500 | 0 | $SiNx$ |
| 1A-10 | 272 | 12.5 | 22.6 | 17.4 | 50 | 0 | 0 | 0 | 0 | 0 | 1500 | 0 | $SiNx$ |
| 1A-11 | 232 | 12.5 | 23.7 | 16.3 | 0 | 0 | 0 | 0 | 0 | 0 | 1500 | 20 | $SiNx$ |
| 1A-12 | 236 | 12.5 | 23.7 | 16.3 | 0 | 0 | 0 | 0 | 0 | 0 | 1500 | 0 | $SiNx$ |
| 1A-13 | 210 | 12.5 | 27 | 21 | 0 | 0 | 0 | 0 | 0 | 0 | 1500 | 0 | $SiNx$ |
| 1A-14 | 221.1 | 12.5 | 25.7 | 20 | 2.4 | 0 | 0 | 0 | 0 | 0 | 1500 | 0 | $SiNx$ |
| 1A-15 | 233.3 | 12.5 | 24.3 | 18.9 | 4.8 | 0 | 0 | 0 | 0 | 0 | 1500 | 0 | $SiNx$ |
| 1A-16 | 262.5 | 12.5 | 21.6 | 16.8 | 9.6 | 0 | 0 | 0 | 0 | 0 | 1500 | 0 | $SiNx$ |
| 1A-17 | 420 | 12.5 | 13.5 | 10.5 | 24 | 0 | 0 | 0 | 0 | 0 | 1500 | 0 | $SiNx$ |
| 1B-1 | 210 | 12.5 | 24 | 21 | 0 | 0 | 0 | 0 | 0 | 3 | 1500 | 0 | $SiNxFy$ |
| 1B-2 | 210 | 12.5 | 18 | 21 | 0 | 0 | 0 | 0 | 0 | 9 | 1500 | 0 | $SiNxFy$ |
| 1B-3 | 210 | 12.5 | 13.5 | 21 | 0 | 0 | 0 | 0 | 0 | 13.5 | 1500 | 0 | $SiNxFy$ |
| 1C-1 | 240 | 12.5 | 22.6 | 17.4 | 0 | 0 | 3 | 0 | 0 | 0 | 1500 | 0 | $SiOxNy$ |
| 1C-2 | 240 | 12.5 | 22.6 | 17.4 | 0 | 0 | 5 | 0 | 0 | 0 | 1500 | 0 | $SiOxNy$ |
| 1C-3 | 240 | 12.5 | 22.6 | 17.4 | 0 | 2 | 0 | 0 | 0 | 0 | 1500 | 0 | $SiOxNy$ |
| 1C-4 | 240 | 12.5 | 22.6 | 17.4 | 0 | 10 | 0 | 0 | 0 | 0 | 1500 | 0 | $SiOxNy$ |
| 1C-5 | 210 | 12.5 | 25.9 | 20.1 | 0 | 2 | 0 | 0 | 0 | 0 | 1500 | 0 | $SiOxNy$ |
| 1C-6 | 210 | 12.5 | 24.8 | 19.3 | 0 | 4 | 0 | 0 | 0 | 0 | 1500 | 0 | $SiOxNy$ |
| 1C-7 | 210 | 12.5 | 23.6 | 18.4 | 0 | 6 | 0 | 0 | 0 | 0 | 1500 | 0 | $SiOxNy$ |
| 1D-1 | 240 | 12.5 | 22.6 | 17.4 | 0 | 0 | 0 | 5 | 0 | 0 | 1500 | 0 | $SiCxNy$ |
| 1D-2 | 240 | 12.5 | 22.6 | 17.4 | 0 | 0 | 0 | 50 | 0 | 0 | 1500 | 0 | $SiCxNy$ |
| 1D-3 | 210 | 12.5 | 25.9 | 20.1 | 0 | 0 | 0 | 2 | 0 | 0 | 1500 | 0 | $SiCxNy$ |
| 1D-4 | 210 | 12.5 | 24.8 | 19.3 | 0 | 0 | 0 | 4 | 0 | 0 | 1500 | 0 | $SiCxNy$ |
| 1D-5 | 210 | 12.5 | 21.4 | 16.6 | 0 | 0 | 0 | 10 | 0 | 0 | 1500 | 0 | $SiCxNy$ |
| 1E-1 | 240 | 12.5 | 22.6 | 17.4 | 0 | 0 | 0 | 0 | 3 | 0 | 1500 | 0 | $SiCxOyNz$ |
| 1E-2 | 240 | 12.5 | 22.6 | 17.4 | 0 | 0 | 0 | 0 | 10 | 0 | 1500 | 0 | $SiCxOyNz$ |
| 1F-1 | 300 | 5 | 15 | 0 | 0 | 0 | 0 | 20 | 10 | 0 | 600 | 30 | $SiOxCy$ |
| 1F-2 | 300 | 5 | 15 | 0 | 0 | 0 | 0 | 15 | 15 | 0 | 600 | 30 | $SiOxCy$ |
| 1F-3 | 300 | 5 | 15 | 0 | 0 | 10 | 0 | 20 | 0 | 0 | 600 | 30 | $SiOxCy$ |
| 1F-4 | 300 | 5 | 15 | 0 | 0 | 15 | 0 | 15 | 0 | 0 | 600 | 30 | $SiOxCy$ |

Figure 4:
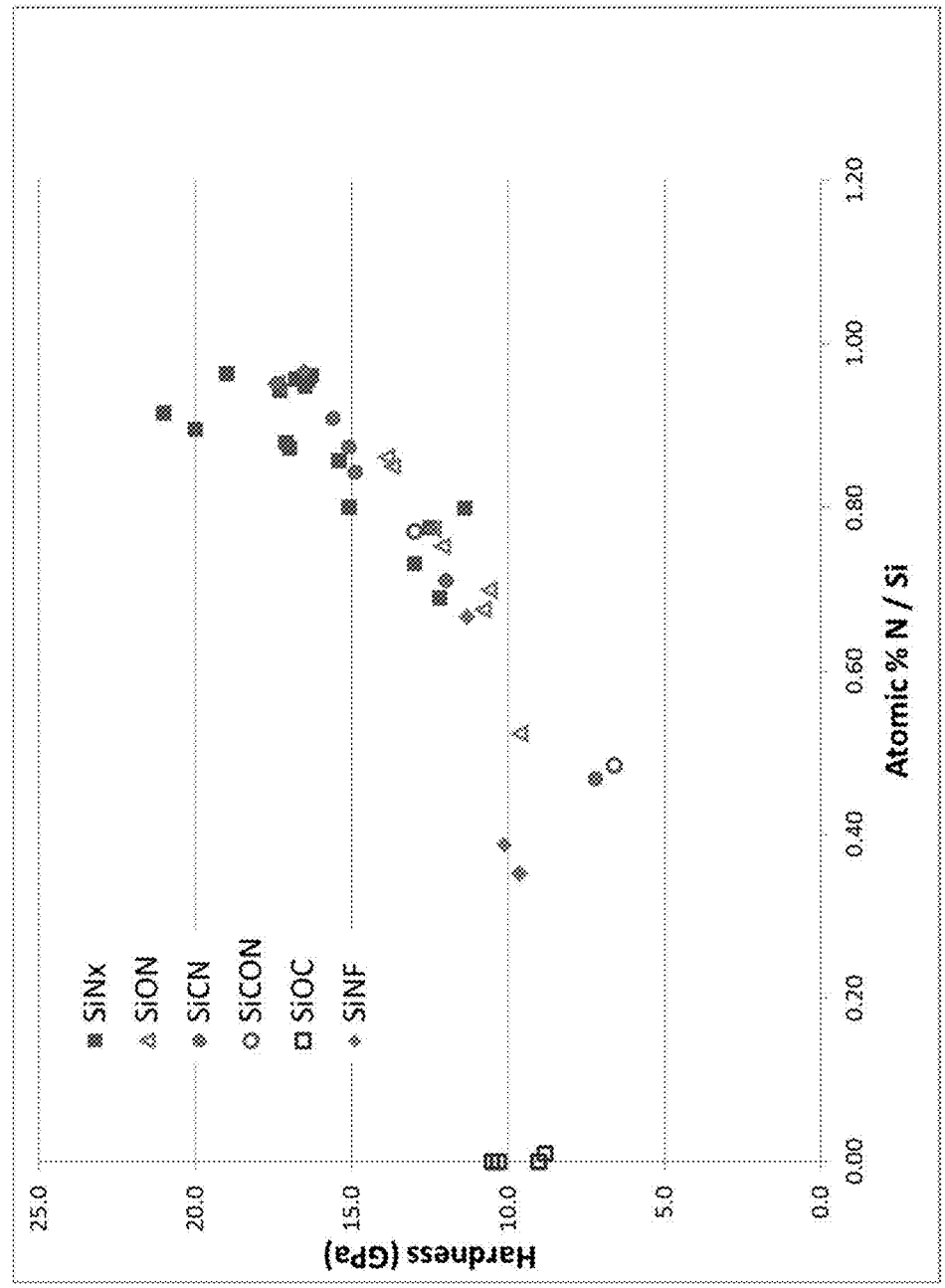
FIG. 4 is a graph showing the measured hardness of the layers of Examples 1A-1F as function of the ratio of nitrogen (atomic %) to silicon (atomic %) in the layers.

After the layers were formed on the substrates, NRA and XPS were used to measure the ranges of compositions in each layer. The hardness for each layer was then measured using the Berkovich Indenter Hardness Test. The measured hardness of the layers is plotted as a function of the compositional ratio of nitrogen (atomic %) to silicon (atomic %) in FIG. 4. As shown in FIG. 4, layers exhibiting the compositional ratio of nitrogen (in atomic %) to silicon (in atomic %) of about 0.8 or greater (or about 0.85 or greater) also exhibited a hardness of about 15 GPa or greater or about 17 GPa or greater. These values can be contrasted with SiNx layers having similar thicknesses but formed by sputtering or PVD processes. PVD-formed SiNx layers exhibit a maximum hardness when the composition ratio nitrogen (atomic %) to silicon (atomic %) is about 0.75.

Figure 5:
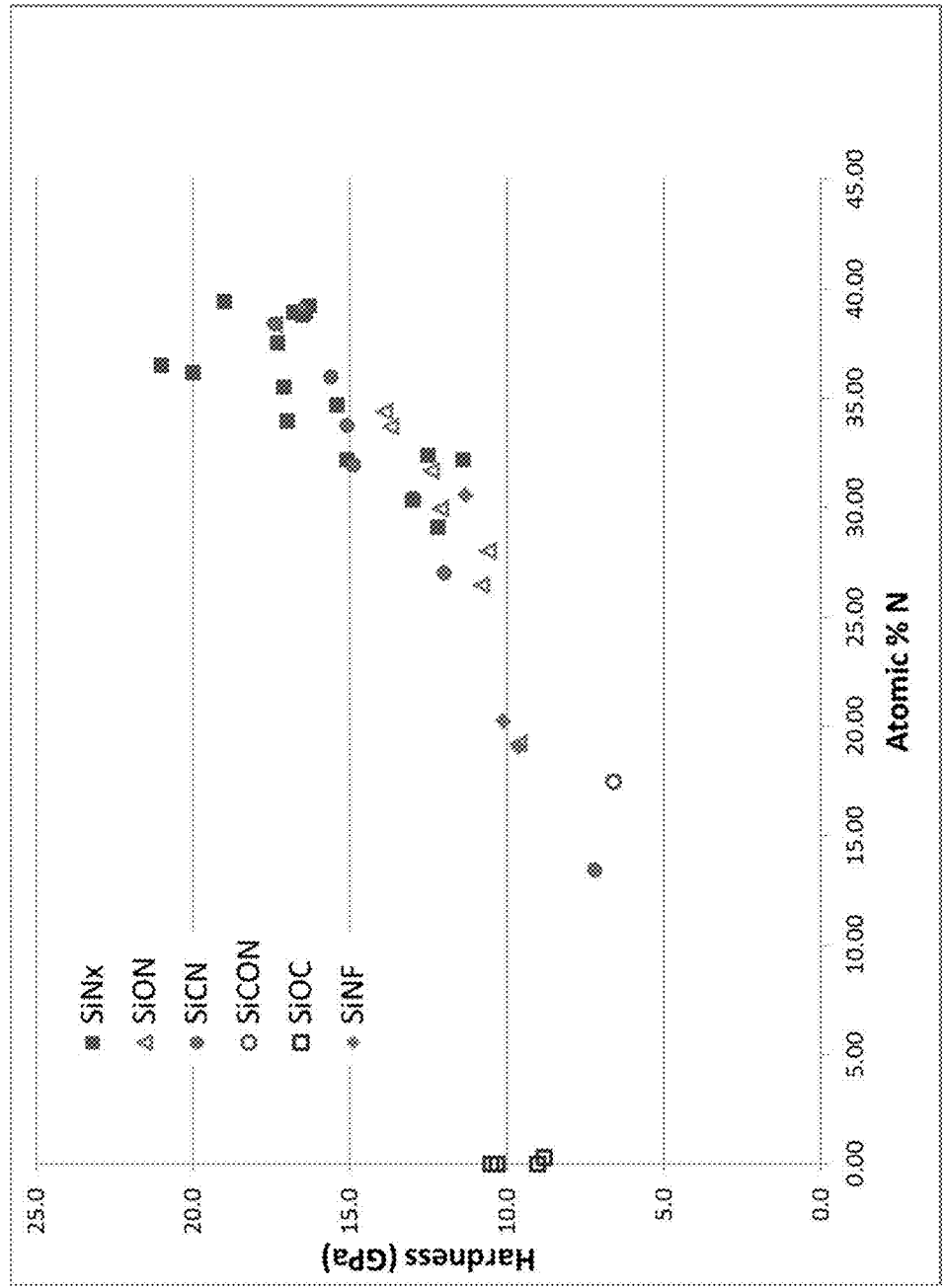
FIG. 5 is a graph showing the measured hardness as a function of the nitrogen content (in atomic %) of the layers of Examples 1A-1F.

FIG. 5 illustrates the measured hardness of the layers of Examples 1A-1F, plotted as a function of the amount of nitrogen (in atomic %). As shown in FIG. 5, layers having a nitrogen content of greater than about 30 atomic % or greater than about 35 atomic % (but less than about 40-41 atomic %) exhibited a hardness of about 17 GPa or greater.

Figure 6:
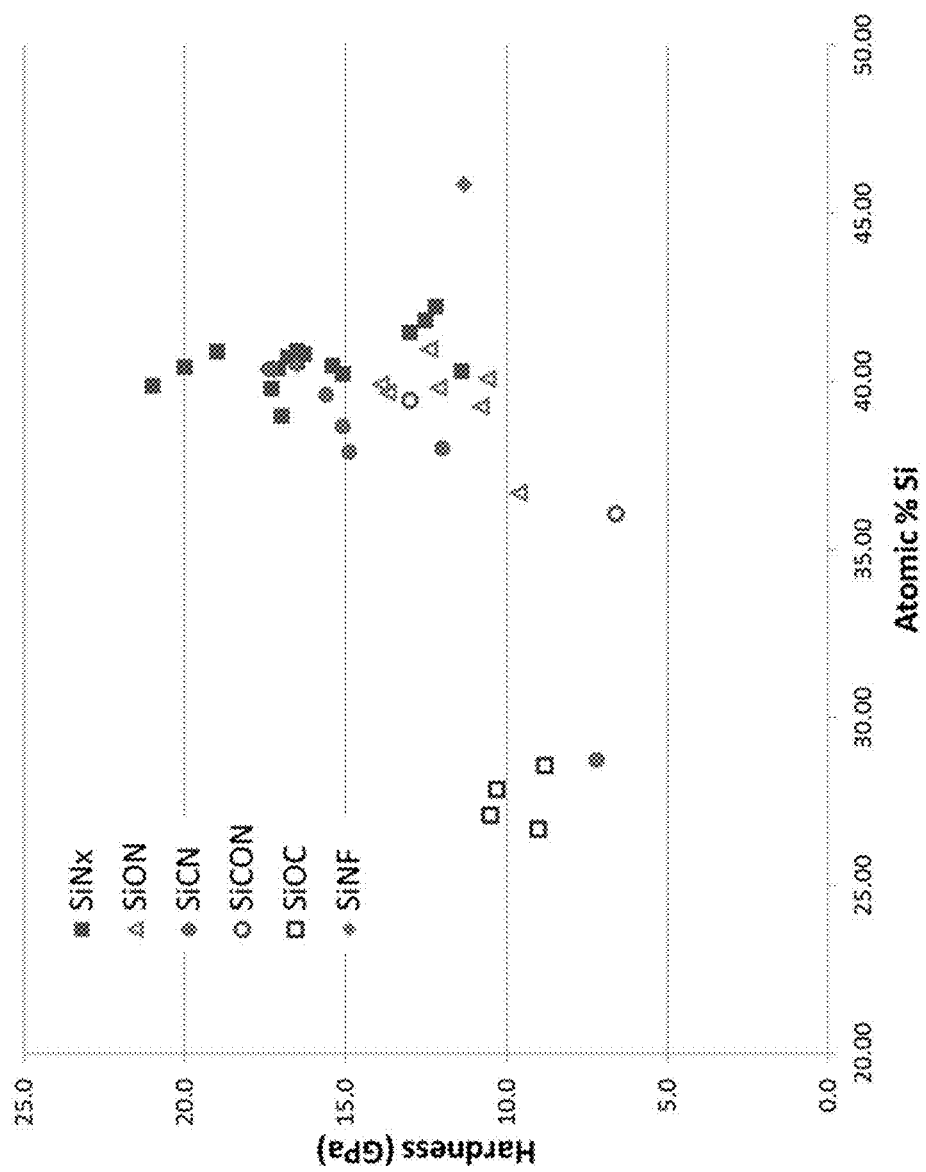
FIG. 6 is a graph showing the measured hardness as a function of the silicon content (in atomic %) of the layers of Examples 1A-1F.

The measured hardness of the layers of Examples 1A-1F is plotted as a function of the amount of silicon (in atomic %) in FIG. 6. As shown in FIG. 6, layers having a silicon content in the range from about 37 atomic % to about 43 atomic % exhibited the greatest hardness (i.e., about 27 GPa).

Figure 7:
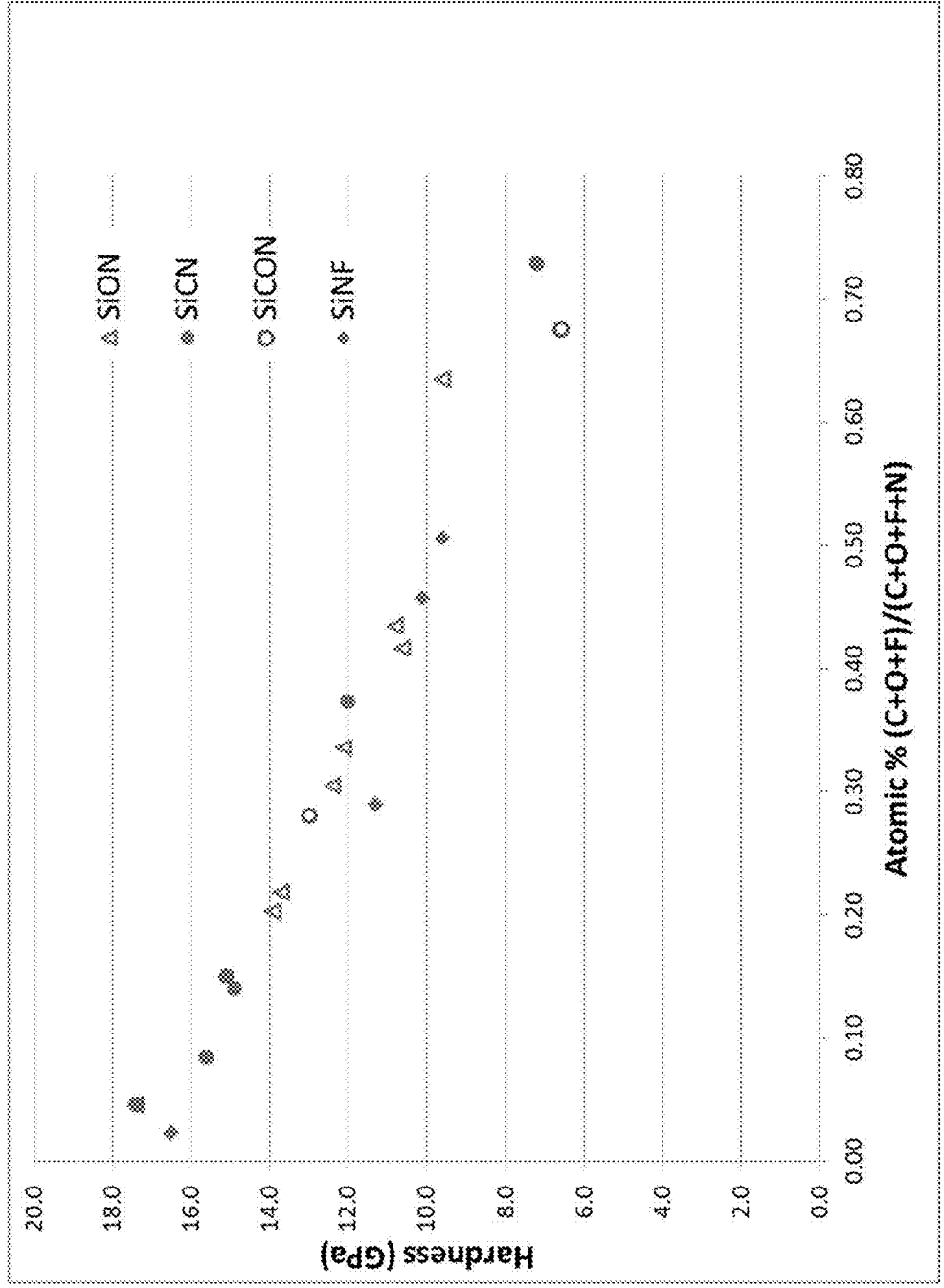
FIG. 7 is a graph showing the measured hardness as a function of the oxygen, carbon and fluorine fraction of the anions of the layers of Examples 1A-1F.

FIG. 7 is a graph illustrating the measured hardness of the layers of Examples 1B-1E as a function of the oxygen, carbon and fluorine fraction of anions (i.e., the sum of the oxygen, nitrogen, fluorine and carbon content in atomic %) in layers. As shown in FIG. 7, as the amount of nitrogen decreases, the hardness of the layers decreases. Layers having an oxygen, carbon, and/or fluorine fraction of anions of less than about 0.2 exhibited a hardness of about 15 GPa or greater.

Figure 8:
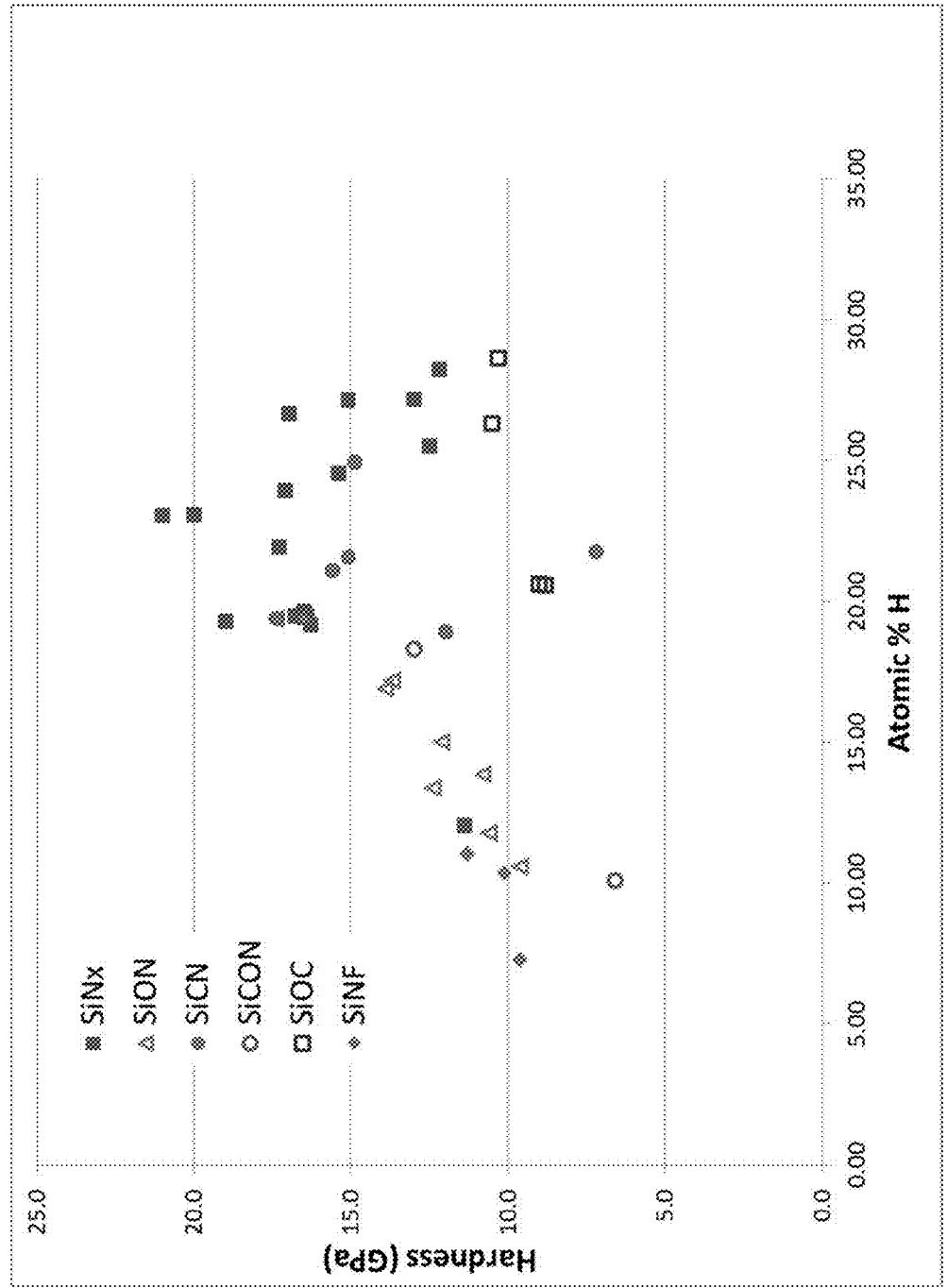
FIG. 8 is a graph showing the measured hardness as a function of the hydrogen content (in atomic %) of the layers of Examples 1A-1F.

The measured hardness of the layers of Examples 1A-1F is plotted as a function of the amount of hydrogen (in atomic %) in FIG. 8. Layers having a hydrogen content of about 18 atomic % exhibited the highest hardness, with layers having a hydrogen content in the range from about 15 atomic % to about 28 atomic % exhibiting a hardness of about 17 GPa or greater.

Figure 9:
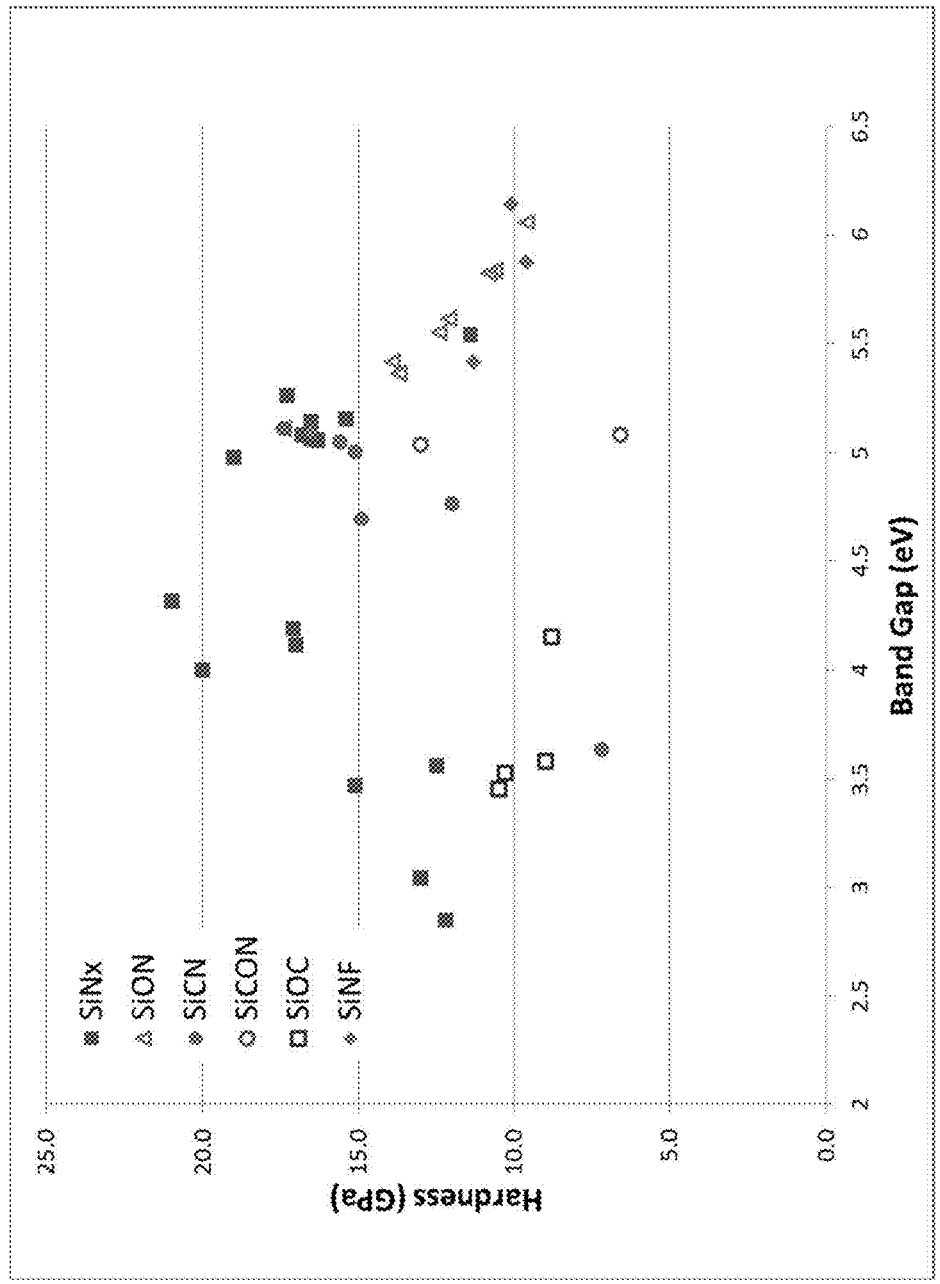
FIG. 9 is a graph showing the measured hardness as a function of measured optical band gap of the layers of Examples 1A-1F.
Figure 10:
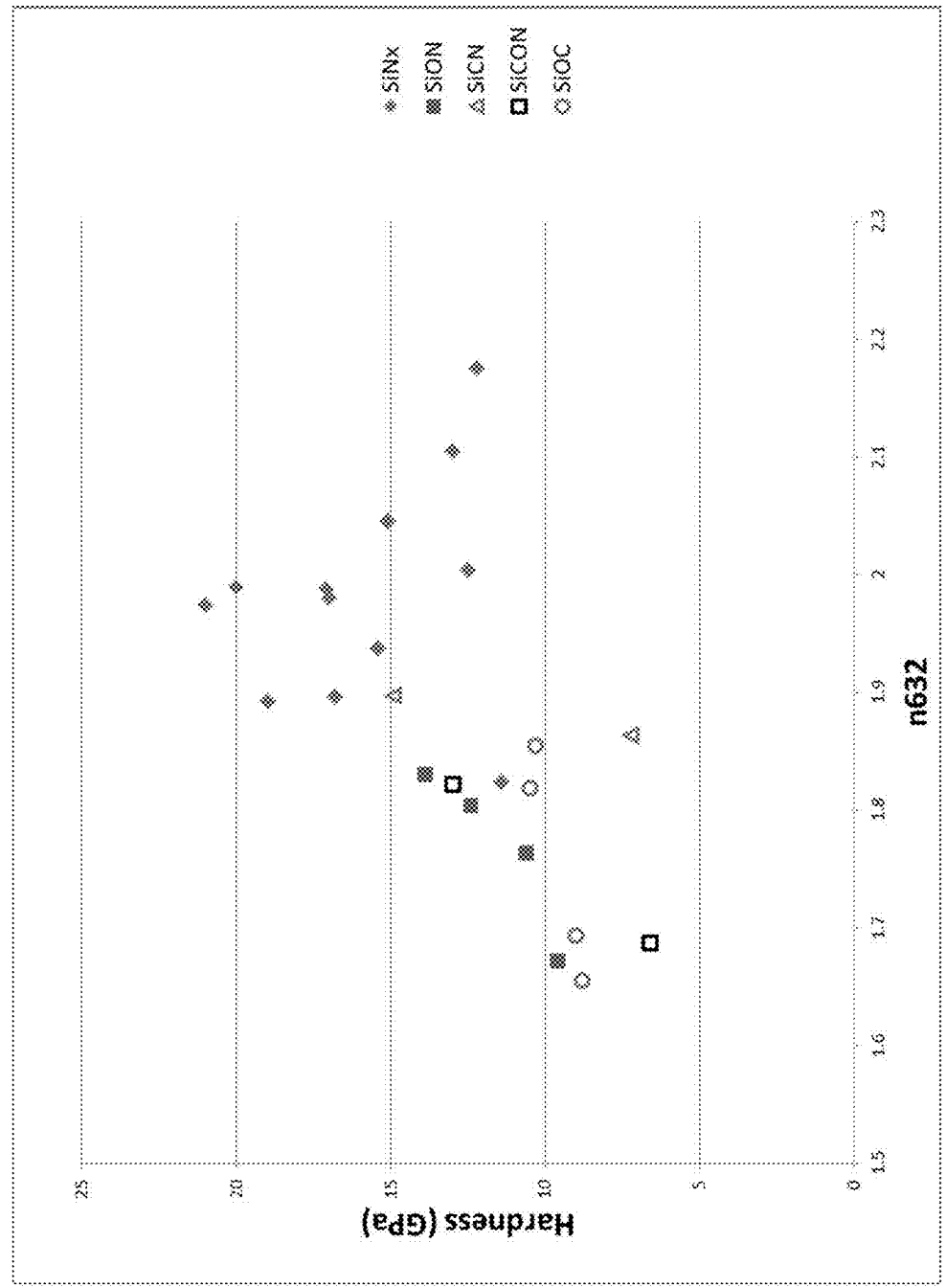
FIG. 10 is a graph showing the measured hardness as a function of the refractive index at a wavelength of 632 nm of the layers of Examples 1A, and 1C-1F.
Figure 10A:
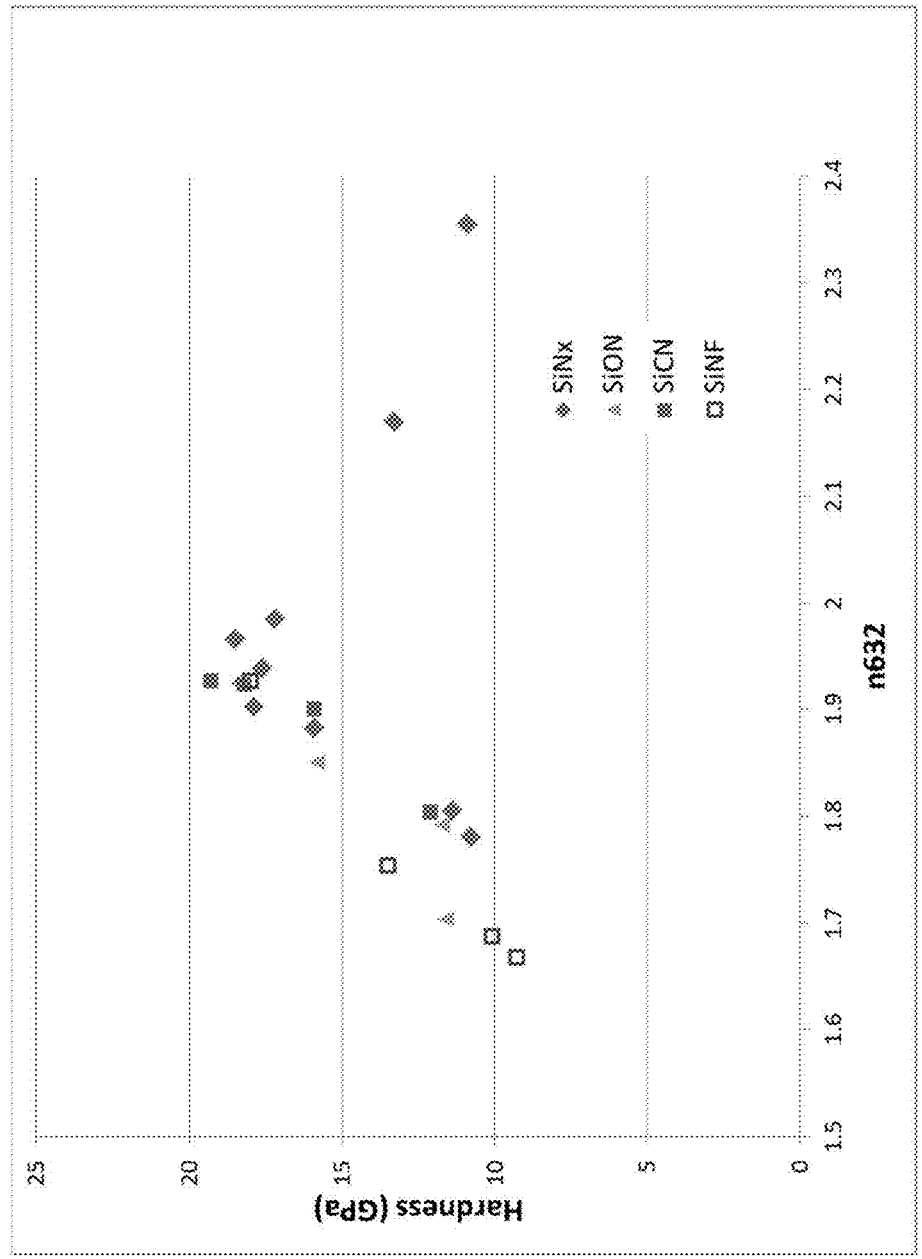
FIG. 10A is a graph showing the measured hardness as a function of the refractive index at a wavelength of 632 nm of the layers of Examples 1A-1D.
Figure 11:
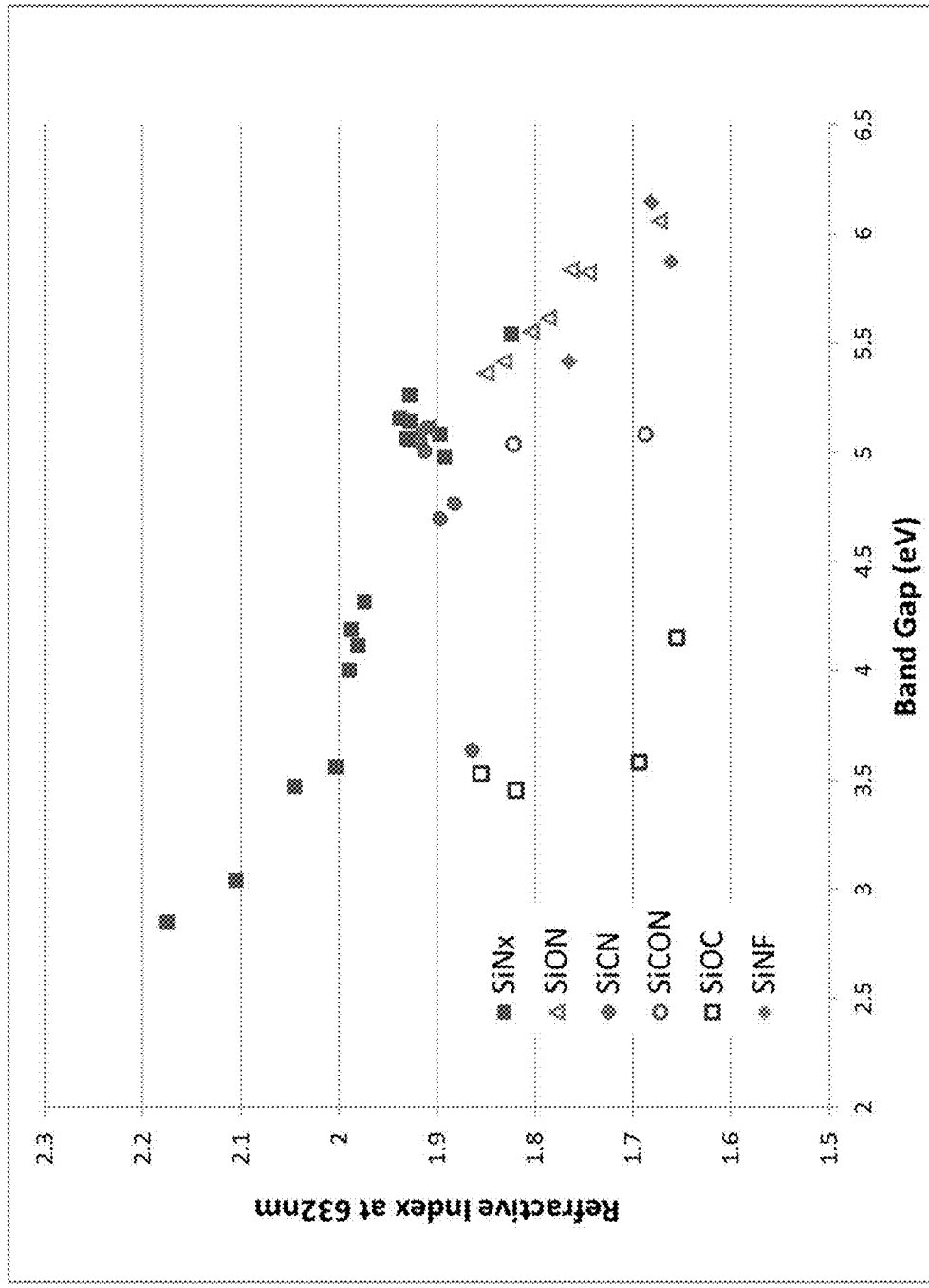
FIG. 11 is a graph showing the measured refractive index at a wavelength of 632 nm as a function of the measured optical band gap of the layers of Examples 1A-1F.

The optical band gap and refractive index values of the layers of Examples 1A-1F were measured. FIG. 9 shows the measured hardness of the layers as a function of optical band gap. In general, coating materials exhibiting an optical band gap of about 3.5 eV or greater (3.5 eV being a wavelength of about 354 nm) will also exhibits a minimum of optical absorption across at least a portion of the optical wavelength regime (e.g., from about 380 nm to about 700 nm or 3.26 to 1.77 eV). These coating materials therefore transmit the full visible spectrum without significant absorption and appear colorless. FIG. 9 shows that layers with a hardness above 15 GPa have an optical band gap of 3.5 to 5 eV. FIG. 10 and FIG. 10A each plots the measured hardness against the measured refractive index at a wavelength of 632 nm of Examples 1A-1F. The measured hardness reached a maximum value at a refractive index range from about 1.90 to about 1.95. Layers exhibiting a hardness of greater than about 15 GPa also exhibited refractive index values in the range from about 1.8 to 2.1. FIG. 11 shows refractive index at 632 nm as a function of optical band gap. SiNx, SiOxNy, and SiNxFy layers were observed to lie in a line. Carbon containing layers exhibited a lower refractive index for a given band gap range, or lower band gap for a given refractive index. This is consistent with hardness results which seem to indicate that layers with carbon exhibited a lower density. Without being bound by theory, it is believed that a sudden drop in optical band gap indicates the increase of Si—Si or C—C bonds over the number of Si—N bonds in the material. Accordingly, a reduction in hardness and a reduction of optical band gap was observed in such materials.

Example 2

In Examples 2A-2D, single layers having a thickness of about 2000 nm and the following coating material compositions (A-D) were formed as described above: SiNx, SiNxFy, and SiOxNy, SiCxNy. The single layers were each formed on separate substrates using a Plasma-Therm Versaline HDP tool. The process conditions included the using deposition gases of silane, nitrogen, hydrogen, methane, oxygen, and silicon tetrafluoride (in units of sccm as appropriate, and shown in Table 2) at a substrate temperature of about 150° C. and a pressure of 12.5 mtorr, as shown in Table 2. Argon was flowed at a rate of 50 sccm and RF power was supplied to the coil at 600 W or 1500 W, as shown in Table 2. The deposition time is reported in seconds in Table 2.

TABLE 2

Examples 2A-2D deposition conditions.

| Example | Time | Pressure | SiH$_4$ | N$_2$ | H$_2$ | Coating material Comp. |
|---|---|---|---|---|---|---|
| 2A-1 | 1100 | 12.5 | 28 | 20 | 0 | SiNx |
| 2A-2 | 1100 | 12.5 | 27.5 | 20.5 | 0 | SiNx |
| 2A-3 | 1100 | 12.5 | 27 | 21 | 0 | SiNx |
| 2A-4 | 1100 | 12.5 | 26.5 | 21.5 | 0 | SiNx |
| 2A-5 | 1100 | 12.5 | 26 | 22 | 0 | SiNx |
| 2A-6 | 1100 | 12.5 | 30 | 18 | 0 | SiNx |
| 2A-7 | 1100 | 12.5 | 32 | 16 | 0 | SiNx |
| 2A-8 | 1100 | 12.5 | 24 | 24 | 0 | SiNx |
| 2A-9 | 1100 | 12.5 | 22 | 26 | 0 | SiNx |

TABLE 2-continued

Examples 2A-2D deposition conditions.

| Example | Time | Pressure | SiH$_4$ | N$_2$ | SiF$_4$ | Coating material Comp. |
|---|---|---|---|---|---|---|
| 2B-1 | 1080.7 | 12.5 | 27 | 21 | 0 | SiNx |
| 2B-2 | 945.6 | 12.5 | 24 | 21 | 3 | SiNxFy |
| 2B-3 | 634.7 | 12.5 | 18 | 21 | 9 | SiNxFy |
| 2B-4 | 529.1 | 12.5 | 13.5 | 21 | 13.5 | SiNxFy |

| Example | Time | Pressure | SiH$_4$ | N$_2$ | O$_2$ | Coating material Comp. |
|---|---|---|---|---|---|---|
| 2C-1 | 1071.2 | 12.5 | 27 | 21 | 0 | SiNx |
| 2C-2 | 1059.1 | 12.5 | 25.9 | 20.1 | 2 | SiOxNy |
| 2C-3 | 1032.4 | 12.5 | 24.8 | 19.3 | 4 | SiOxNy |
| 2C-4 | 1063.5 | 12.5 | 23.6 | 18.4 | 6 | SiOxNy |

| Example | Time | Pressure | SiH$_4$ | N$_2$ | CH$_4$ | Coating material Comp. |
|---|---|---|---|---|---|---|
| 2D-1 | 1071.2 | 12.5 | 27 | 21 | 0 | SiNx |
| 2D-2 | 1105 | 12.5 | 25.9 | 20.1 | 2 | SiCxNy |
| 2D-3 | 1115.7 | 12.5 | 24.8 | 19.3 | 4 | SiCxNy |
| 2D-4 | 1105 | 12.5 | 21.4 | 16.6 | 10 | SiCxNy |

Figure 12:
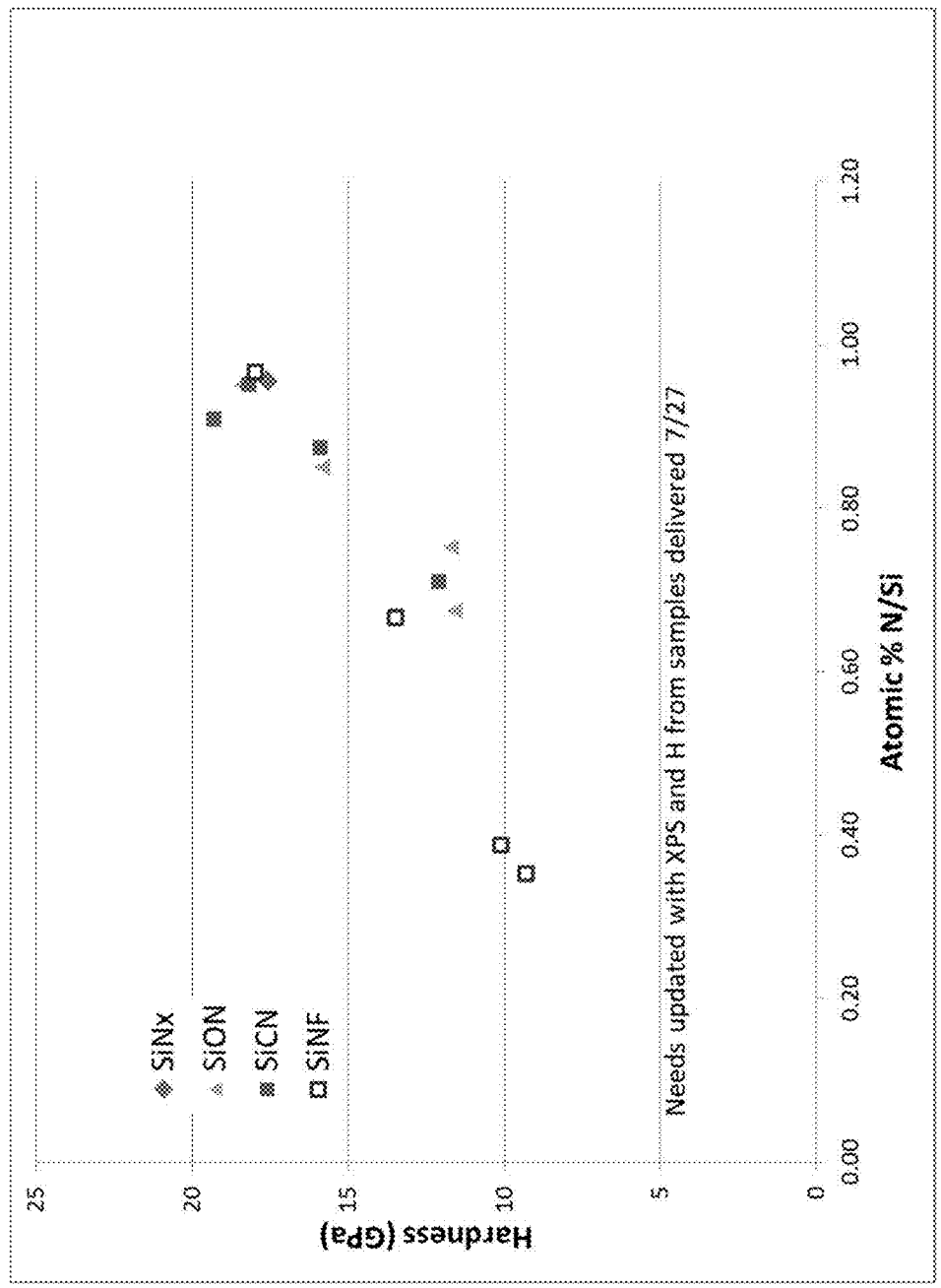
FIG. 12 is a graph showing the measured hardness as a function of the compositional ratio nitrogen (in atomic %) to silicon (in atomic %) of the layers of Examples 2A-2D.

After the layers of Examples 2A-2D were formed on the substrates, NRA and XPS were used to measure the compositions of each layer. The hardness for each layer was then measured using the Berkovich Indenter Hardness Test. FIG. 12 is a graph plotting the measured hardness values for Examples 2A-2D against the compositional ratio of nitrogen (atomic %) to silicon (atomic %). As shown in FIG. 12, layers including the compositional ratio N:Si (in atomic %) of about 0.8 or greater (or about 0.85 or greater) exhibited a hardness of about 15 GPa or greater or about 17 GPa or greater. As with Examples 1A-1F, these compositional ratio values can be contrasted with known SiNx layers having similar thicknesses but formed by sputtering or PVD processes. PVD-formed SiNx layers exhibit a maximum hardness when the composition ratio nitrogen (atomic %) to silicon (atomic %) is about 0.75.

Figure 13:
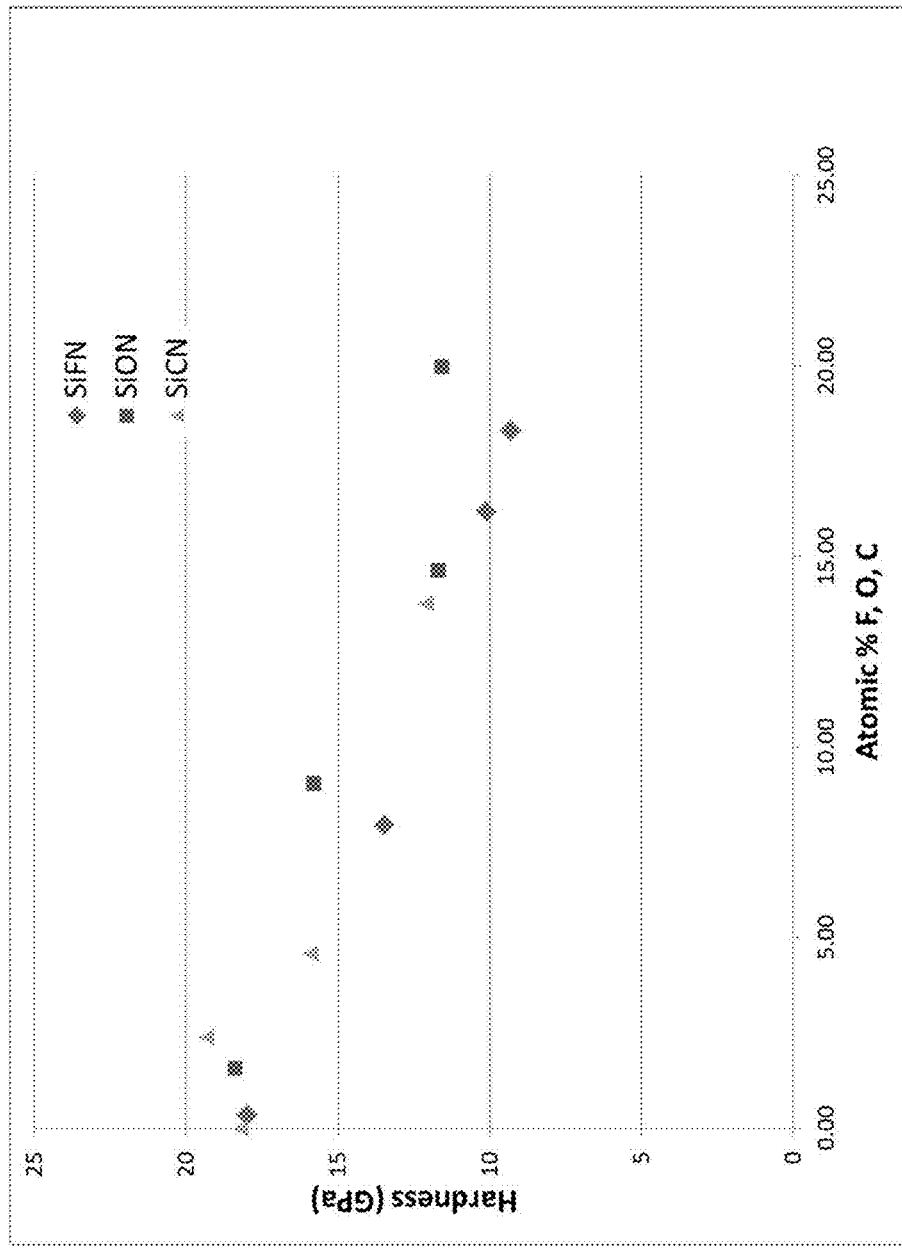
FIG. 13 is a graph showing the measured hardness as a function of the amounts of fluorine, oxygen and carbon (in atomic %) in the layers of Examples 2B-2D.

FIG. 13 is a graph showing the measured hardness values of Examples 2B-2D against the amount (in atomic %) of fluorine, oxygen, and carbon in the layers. Layers having less than about 7 atomic % of any one or more of fluorine, oxygen and carbon exhibited a hardness of about 17 GPa or greater. Without being bound by theory, it appears as though the inclusion of a small amount of carbon can increase hardness to a greater degree than similarly small amounts of fluorine or oxygen additions. Thus, in some embodiments, the coating material may include up to about 4 atomic % carbon.

Figure 14:
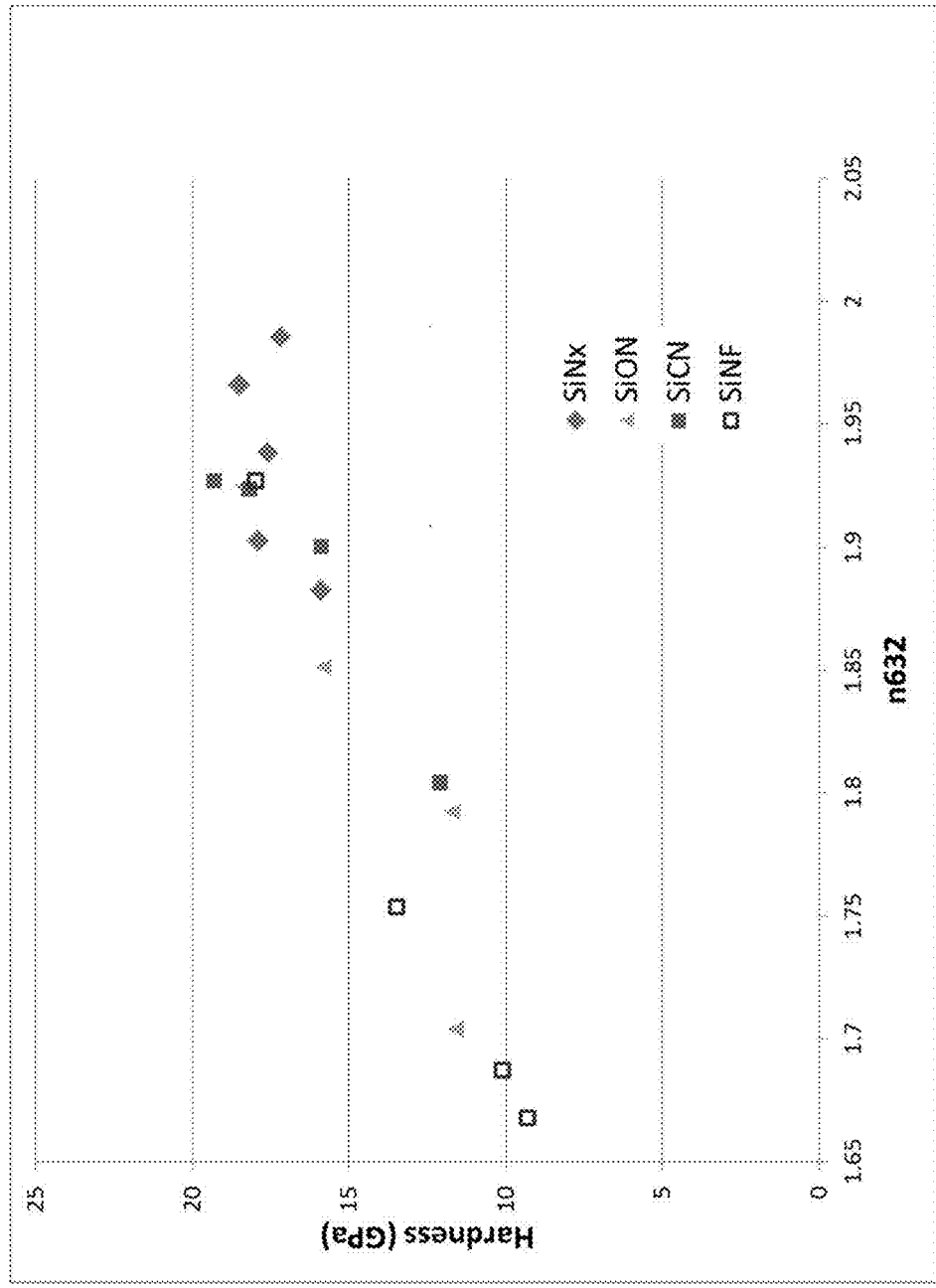
FIG. 14 is a graph showing the measured hardness as a function of the measured refractive index at a wavelength of 632 nm of the layers of Examples 2A-2D.

FIG. 14 is a graph showing the measured hardness versus the measured refractive index at a wavelength of about 632 nm of the layers of examples 2A-2D. Layers having a hardness greater than 17 GPa also exhibited refractive index values in the range from about 1.85 to about 2.05.

Example 3

In Examples 3A-3H, single layers having a thickness of about 2000 nm and a composition of SiNx were each formed on separate substrates using a Plasma-Therm Versaline HDP tools, with the addition of a substrate bias and/or hydrogen. The process conditions included the using deposition gases of silane, nitrogen, and hydrogen (in units of sccm as appropriate, and shown in Table 3) at a substrate temperature of about 150° C. and a pressure of 12.5 mtorr, as shown in Table 3. Argon was flowed at a rate of 50 sccm and RF power was supplied to the coil at 1500 W. The deposition time is reported in seconds in Table 3.

TABLE 3

Examples 3A-3H deposition conditions.

| Example | Time | SiH$_4$ | N$_2$ | H$_2$ | Bias | Coating material Comp. |
|---|---|---|---|---|---|---|
| 3A | 1100 | 27 | 21 | 0 | 0 | SiNx |
| 3B | 1100 | 27 | 21 | 0 | 10 | SiNx |
| 3C | 1100 | 27 | 21 | 0 | 20 | SiNx |
| 3D | 1100 | 27 | 21 | 0 | 50 | SiNx |
| 3E | 1375 | 21.6 | 16.8 | 9.6 | 0 | SiNx |
| 3F | 2200 | 13.5 | 10.5 | 24 | 0 | SiNx |
| 3G | 1375 | 21.6 | 16.8 | 9.6 | 50 | SiNx |
| 3H | 2200 | 13.5 | 10.5 | 24 | 50 | SiNx |

Table 4 shows the measured stress, thickness, optical band gap, refractive index n and k values at a wavelength of about 632 nm, Young's modulus (E) and hardness (H) values of the layers. The primary impact of both substrate bias and hydrogen additions was to decrease the stress in the layers by making the stress even more compressive. It is noted that a negative value for stress indicates compressive stress and a positive value for stress indicates a tensile stress. Excessive stress in the layers can cause unacceptable bow of the underlying substrate. Such undesirable bowing may be mitigated by disposing a second layer (or "stress compensating layer") on the opposite side of the substrate, which can counteract the stress of the first layer. A stress of less than |300 GPa| (in absolute terms) is required to produce a sufficiently flat coated substrate, without a stress compensating layer. The impact of bias and hydrogen addition on other properties such as hardness, index, and band gap less pronounced. A hardness increase of about 1 GPa is possible with some decrease in refractive index and increase in optical band gap.

Example 4

In Examples 4A-4H, single layers having a thickness of about 2000 nm and a composition of SiNx having near peak hardness (as illustrated in the above examples) were each formed on separate substrates using an P5000 parallel plate CVD supplied by Applied Materials, Inc. at a substrate temperature of about 400° C. to illustrate the impact of a higher substrate temperature and lower ionization on the layer properties. The deposition process conditions used are shown in Table 5. As shown in Table 5, deposition gases silane, ammonia, hydrogen and nitrogen were utilized, with flow rates in sccm. The pressure was varied from 2 to about 6 torr, as shown in Table 5. The deposition time (in seconds), RF power (in Watts) supplied and electrode gap (mils) between the plates is also specified in Table 5.

TABLE 5

Examples 4A-4H deposition conditions.

| Example | SiH$_4$ | NH$_3$ | H$_2$ | N$_2$ | Pressure | Power (RF) | Gap | Time |
|---|---|---|---|---|---|---|---|---|
| 4A | 24 | 48 | 480 | 2713 | 6 | 800 | 400 | 952.2 |
| 4B | 8 | 64 | 480 | 2660 | 2 | 800 | 800 | 3081.2 |
| 4C | 8 | 40 | 480 | 2702 | 4 | 600 | 600 | 3013 |
| 4D | 24 | 48 | 480 | 2710 | 2 | 400 | 400 | 1418.6 |
| 4E | 40 | 160 | 480 | 2410 | 4.9 | 625 | 600 | 530 |
| 4F | 40 | 40 | 480 | 2410 | 4.9 | 625 | 600 | 530 |
| 4G | 60 | 0 | 480 | 2410 | 4.9 | 625 | 600 | 530 |
| 4H | 40 | 480 | 480 | 2410 | 4.9 | 625 | 600 | 530 |

Table 6 shows the measured thickness, optical band gap, refractive index n and k values at a wavelength of about 632 nm, Young's modulus (E) and hardness (H) values of the layers of Examples 4A-4H and of Examples 2A-1 through 2A-9 described in Example 2. Layers formed using the parallel plate PECVD at high substrate temperature (Examples 4A-4H) show a similar range of hardness/modulus and refractive index as the layers formed using ICP CVD at lower substrate temperature (150° C., Examples 2A-1 through 2A-9); however, the layers of Examples 4A-4H exhibited a slightly larger band gap than the layers of Examples 2A-1 through 2A-9.

TABLE 4

Measured Properties of Examples 3A-3H.

| Example | Stress (MPa) | thickness (Å) | Optical Band Gap (eV) | n632 | k632 | E (GPa) | H (GPa) | E/H | H/E |
|---|---|---|---|---|---|---|---|---|---|
| 3A | −272.1 | 21922 | 5.0534 | 1.9386 | 0 | 175 | 17.6 | 9.94 | 0.10 |
| 3B | −819.4 | 21690 | 5.03 | 1.9304 | 0 | 185 | 18.5 | 10 | 0.10 |
| 3C | −1018 | 22075 | 5.0298 | 1.9129 | 0 | 180 | 18.4 | 9.78 | 0.10 |
| 3D | −900.5 | 22733 | 5.2108 | 1.882 | 0 | 182 | 18.8 | 9.68 | 0.10 |
| 3E | −450.5 | 22091 | 5.0531 | 1.9243 | 0 | 178 | 17.7 | 10.06 | 0.10 |
| 3F | −696.4 | 22486 | 5.0517 | 1.9035 | 0 | 184 | 18.4 | 10 | 0.10 |
| 3G | −876.9 | 22945 | 5.7253 | 1.8738 | 0 | 172 | 17.3 | 9.94 | 0.10 |
| 3H | −763.8 | 24697 | 5.1758 | 1.7911 | 0 | 145 | 15 | 9.67 | 0.10 |

TABLE 6

Measured Properties of Examples 4A-H and Examples 2A-1 through 2A-9.

| Example | Stress (MPa) | thickness (Å) | Optical Band Gap (eV) | n632 | k632 | E (GPa) | H (GPa) | E/H | H/E |
|---|---|---|---|---|---|---|---|---|---|
| 4A | 16.18 | 24045 | 5.346 | 1.895 | 0 | 172 | 17.3 | 9.94 | 0.10 |
| 4B | 425.4 | 21504 | 5.349 | 1.852 | 0 | 195 | 19 | 10.26 | 0.10 |
| 4C | −643.6 | 25370 | 5.138 | 1.794 | 0 | 182 | 18.5 | 9.84 | 0.10 |
| 4D | −915.5 | 18031 | 5.255 | 1.859 | 0 | 211 | 21.2 | 9.95 | 0.10 |
| 4E | −636.4 | 19175 | 5.361 | 1.857 | 0 | 160 | 15.9 | 10.06 | 0.10 |
| 4F | −1171 | 14277 | 5.276 | 1.892 | 0 | 174 | 18.4 | 9.46 | 0.11 |
| 4G | −1577 | 12202 | 4.915 | 2.011 | 0 | 210 | 20 | 10.5 | 0.10 |
| 4H | −564.7 | 19631 | 5.423 | 1.83 | 0 | 156 | 15.8 | 9.87 | 0.10 |
| 2A-1 | −886.5 | 20756 | 3.859 | 1.9859 | 0 | 175 | 17.2 | 10.17 | 0.10 |
| 2A-2 | −668.6 | 21370 | 4.5979 | 1.9661 | 0 | 179 | 18.5 | 9.68 | 0.10 |
| 2A-3 | −272.1 | 21922 | 5.0534 | 1.9386 | 0 | 175 | 17.6 | 9.94 | 0.10 |
| 2A-4 | −46.85 | 23376 | 5.2124 | 1.9029 | 0 | 188 | 17.9 | 10.50 | 0.10 |
| 2A-5 | −122.4 | 22762 | 2.2687 | 1.8827 | 0 | 172 | 15.9 | 10.82 | 0.09 |
| 2A-6 | −524.4 | 21560 | 2.8816 | 2.17 | 0 | 128 | 13.3 | 9.62 | 0.10 |
| 2A-7 | −377 | 23194 | 2.603 | 2.3548 | 0 | 108 | 10.9 | 9.91 | 0.10 |
| 2A-8 | −79.2 | 22709 | 5.2847 | 1.8057 | 0 | 140 | 11.4 | 12.28 | 0.08 |
| 2A-9 | −74.8 | 21096 | 5.3957 | 1.7814 | 0 | 134 | 10.8 | 12.41 | 0.08 |

Example 4E had a hydrogen content of about 22.6 atomic %. The hardness of the layer of Example 4E, as disposed on the substrate, was measured by the Berkovich Indenter Test and was about 18.3 GPa. The layer of Example 4E had a thickness of about 453 nanometers. Comparative Example 4I included a three sub-layer structure disposed on the same substrate as Example 4E. The three sub-layer structure of Comparative Example 4I included a 113 nanometer-thick $Al_2O_3$ sub-layer disposed on the substrate, a 2-micrometer thick aluminum oxynitride sub-layer disposed on the $Al_2O_3$ layer, and a 32 nanometer-thick $SiO_2$ sub-layer disposed on the aluminum oxynitride layer. All of the sub-layers of Comparative Example 4I were formed using a sputtering process. The surface of each of Example 4E and Comparative Example 4I was indented with a Vickers indenter with a 200 gram load, a 500 gram load, a 1000 gram load and a 2000 gram load, to determine the Vickers indentation fracture threshold. Five samples each of Example 4E and Comparative Example 4I were tested at each load (i.e., a total of 20 samples each were tested). The number of samples of Example 4E that exhibited cracking are shown in Table 7. The Vickers indentation fracture threshold is reached when more than half of the samples exhibit cracking. As shown in Table 7, Example 4E did not reach the threshold at a load of 2000 g. The more than half of the samples of Example 4I exhibited cracking at a load of 100 g.

TABLE 7

Vickers indentation fracture results for Example 4E.

| | Vickers indentation load (grams) | | | |
|---|---|---|---|---|
| Example | 200 | 500 | 1000 | 2000 |
| 4E | 0 of 5 | 0 of 5 | 0 of 5 | 1 of 5 |

Figure 15:
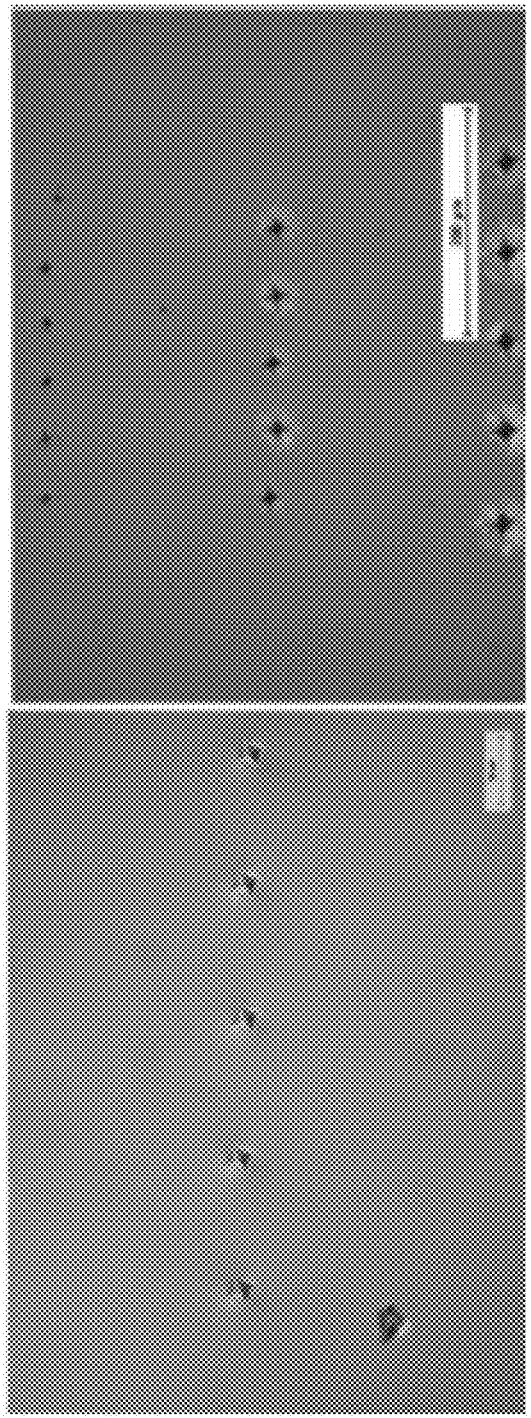
FIG. 15 shows optical micrographs of Example 4E and Comparative Example 4I, after indentation with a Vickers indenter at a 200 gram load.
Figure 16:
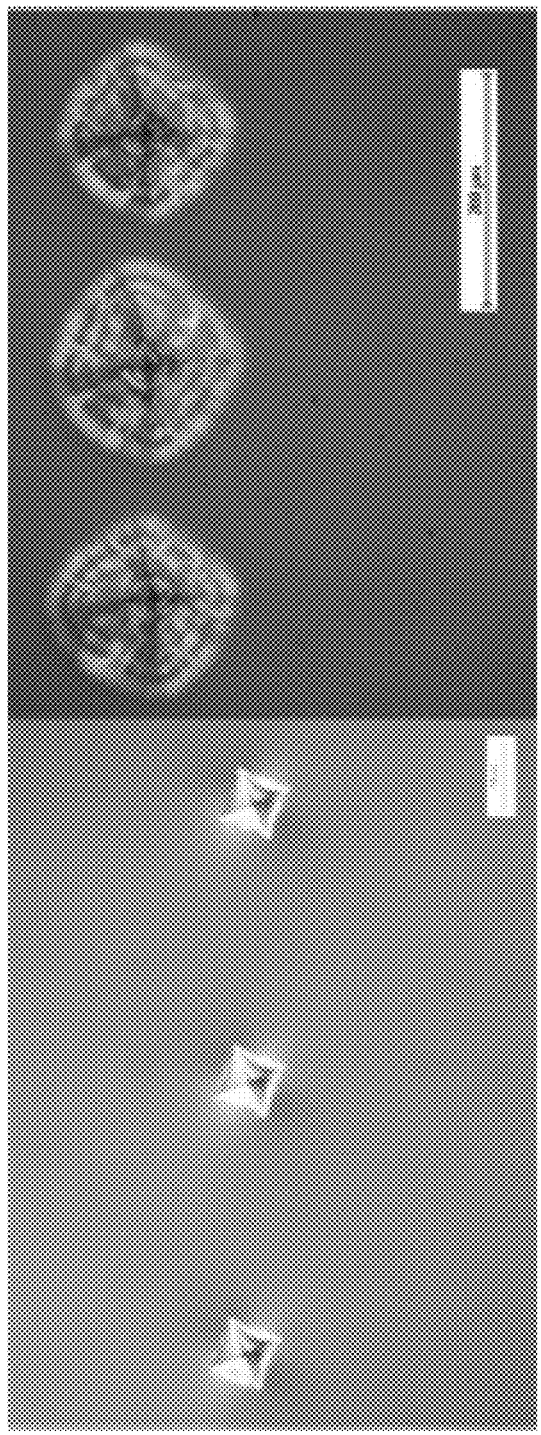
FIG. 16 shows optical micrographs of Example 4E and Comparative Example 4I, after indentation with a Vickers indenter at a 1000 gram load.

Optical micrographs (at 200× magnification) of Example 4E and Comparative Example 4I, after the 200 gram load indent are shown in FIG. 15. Optical micrographs (at 200× magnification) of Example 4E and Comparative Example 4I, after the 1000 gram load indent are shown in FIG. 16. In FIGS. 15 and 16, the scale shown in each micrograph is 200 micrometers in length.

As shown in FIGS. 15 and 16, Comparative Example 4I exhibited cracking at the corners of the indentation; while Example 4E was relatively free of such cracking, indicating that Example 4E exhibited greater fracture resistance with load than Comparative Example 4I. In addition, Comparative Example 4I exhibited such cracks at a lower load than Example 4E.

Example 5

Modeled Example 5 includes a layer having a composition of SiOxNyCz exhibiting a maximum hardness of about 19 GPa or greater, a measured by a Berkovich Indenter Test, an optical band gap of greater than about 4.5 eV, an absorption (k) at a wavelength of about 400 nm of less than about $3^{-4}$. The layer included a nitrogen content of greater than about 30 atomic %, a combined amount of silicon and aluminum of greater than about 40 atomic %, hydrogen content in the range from about 1 atomic % to about 25 atomic %, an oxygen content in the range from about 0 atomic % to about 7.5 atomic % and a carbon content in the range from about 0 atomic % to about 10 atomic %. The layer of Modeled Example 5 may optionally include fluorine and/or boron.

Example 6

In Examples 6A-6F, single layers having a thickness in the range from about 20,000 Angstroms (2000 nm) to about 30,000 Angstroms (3000 nm) and a composition of SiOxNyCz were each formed on separate substrates using an P5000 parallel plate CVD supplied by Applied Materials, Inc. at a substrate temperature of about 400° C. The deposition process conditions used are shown in Table 8. As shown in Table 8, deposition gases silane and nitrogen were utilized, with the flow rates of silane (in sccm) shown. The flow rate of nitrogen was held constant at 2000 sccm. The pressure was constant at about 4.5 torr and the RF power was also held constant at about 625 watts. The deposition time (in seconds), RF power (in Watts) supplied and electrode gap (mils) between the plates is also specified in Table 8. Table 8 also shows the band gap (eV), the refractive index (RI)_at a wavelength of 632 nm, absorption coefficient (k) at a wavelength of 632 nm, Young's modulus E (GPa) and hardness H (GPa).

TABLE 8

Examples 6A-6F deposition conditions and measured properties.

| Ex. | SiH$_4$ Gap (mils) | Time | Thickness (Å) | Gap (eV) | RI | k | E | H | E/H | H/E |
|---|---|---|---|---|---|---|---|---|---|---|
| 6A | 45 | 210 | 566 | 24465 | 2.62 | 2.142 | 0.003 | 146 | 15 | 9.733 | 0.103 |
| 6B | 30 | 210 | 756 | 20801 | 3.49 | 2.052 | 0.000 | 168 | 17 | 9.882 | 0.101 |
| 6C | 60 | 450 | 967 | 24169 | 5.49 | 1.9368 | 0.000 | 210 | 21 | 10.000 | 0.100 |
| 6D | 75 | 600 | 1407 | 29768 | 5.24 | 1.9093 | 0.000 | 190 | 18 | 10.556 | 0.095 |
| 4E | 75 | 450 | 777 | 24270 | 3.43 | 2.0055 | 0.000 | 180 | 18 | 10.000 | 0.100 |
| 6F | 45 | 600 | 2478 | 26838 | 5.47 | 1.8786 | 0.000 | 157 | 15 | 10.467 | 0.096 |

Figure 17:
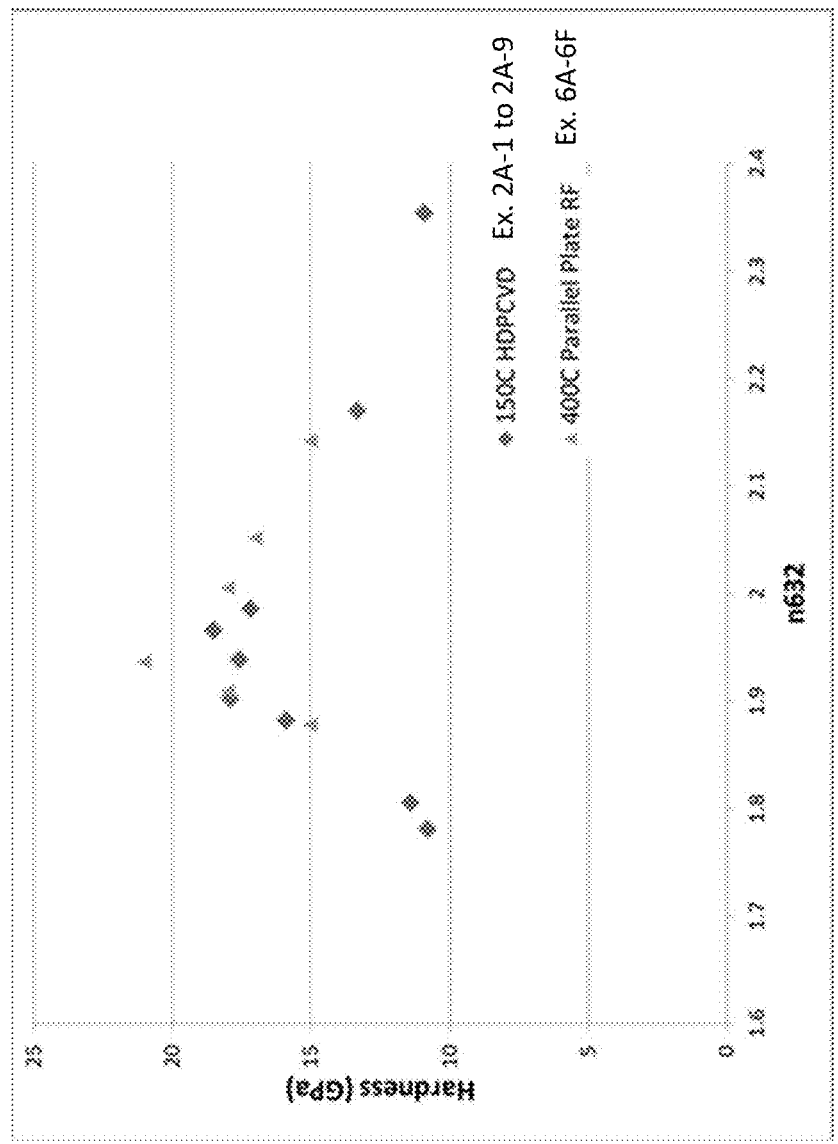
FIG. 17 is a graph showing the measured hardness as a function of refractive index at a wavelength of 632 nm of the layers of Examples 2A-1 through 2A-9 and 6A-6F.

The hardness values for Examples 6A-6F were plotted against the refractive index, in FIG. 17. In FIG. 17, the hardness values and refractive index values of Examples 2A-1 through 2A-9 (which were formed using a Plasma-Therm Versaline HDP tool and a substrate temperature of about 150° C.) were also plotted to compare the effect of substrate temperature. As shown in Table 8, Examples 6C and 6D exhibited the greatest hardness values (i.e., 21 GPa and 18 GPa, respectively), while also exhibiting the greatest band gap values (i.e., 5.49 eV and 5.24 eV, respectively). Without being bound by theory, it is believed that highest hardness occurs at maximum transparency, as higher hardness maximizes Si—N bonding.

Example 7

Example 7 included an article with a substrate having a major surface and coating structure disposed on the major surface. The substrate utilized in Example 7 included a glass substrate having a nominal composition of 58 mol % SiO$_2$, 16.5 mol % Al$_2$O$_3$, 16.7 mol % Na$_2$O, 3 mol % MgO, 6.5 mol % P$_2$O$_5$ and 0.05 mol % SnO$_2$. The substrate had a thickness of 1 mm and included a coated substrate having the coating structure shown in Table 9.

TABLE 9

Coating structure of Example 7.

| Material Glass | Physical thickness (nm) |
|---|---|
| SiN$x$ | 7.7 |
| SiO$_2$ | 44.1 |
| SiN$x$ | 22.8 |
| SiO$_2$ | 26.4 |
| SiN$x$ | 38.4 |
| SiO$_2$ | 8.5 |
| SiN$x$ | 2000 |
| SiO$_2$ | 19.2 |

Figure 18:
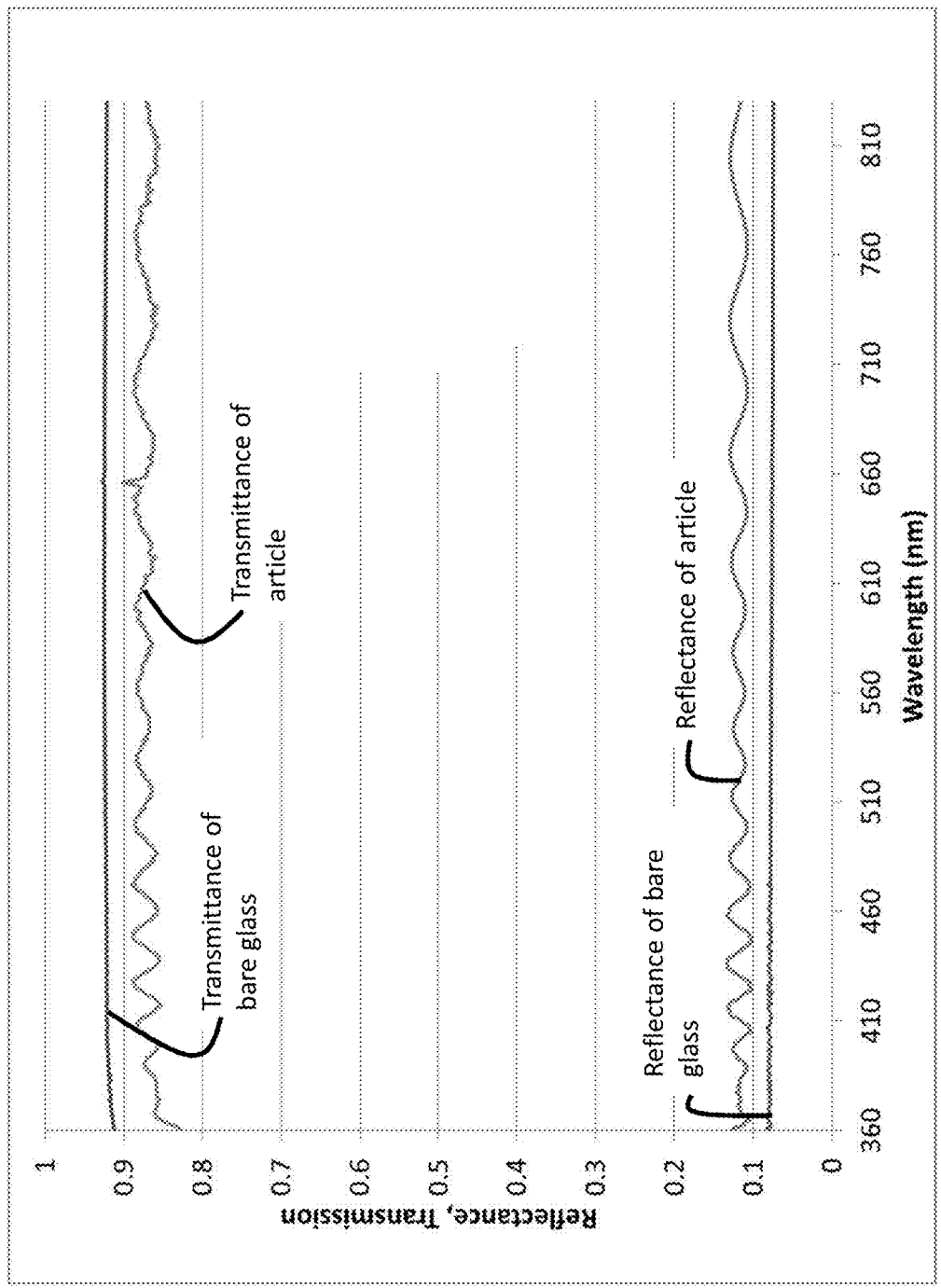
FIG. 18 is a transmittance and reflectance spectra for the article of Example 7.

The hardness and modulus of article of Example 7 was evaluated using the Berkovich Indenter Hardness Test. The article exhibited a hardness of 19.2 GPa and a modulus of 196 GPa. The roughness of the coated surface of the article was also measured and exhibited Rq of 3.09 nm and an Ra of 2.47 nm. The optical properties of the bare glass substrate and the coated article were measured, as shown in FIG. 18. As shown in FIG. 18, the transmittance and reflectance of the article approaches the transmittance and reflectance, respectively, of the bare glass substrate; however the article exhibits high hardness. The single-surface reflected color values of the article measured at various viewing angles at the coated surface using a D65 illuminant are shown in Table 10.

TABLE 10

Reflected color values of Example 7.

| Reference | Incident illumination angle | | | |
|---|---|---|---|---|
| | 6 degrees s + p pol avg | 20 degrees s + p pol avg | 40 degrees s + p pol avg | 60 degrees s + p pol avg |
| x | 0.3155 | 0.3156 | 0.3147 | 0.3139 |
| y | 0.3326 | 0.3327 | 0.3318 | 0.3310 |
| L* | 36.72 | 36.83 | 38.21 | 45.58 |
| a* | 0.04 | 0.04 | 0.03 | 0.03 |
| b* | 0.44 | 0.46 | 0.22 | 0.01 |

Example 8

Example 8 included an article with the same substrate as Example 7, having a major surface, and coating structure disposed on the major surface. The substrate included a coated substrate having the coating structure shown in Table 11.

TABLE 11

Coating structure of Example 8.

| Material Glass | Physical thickness (nm) |
|---|---|
| SiN$x$ | 16.3 |
| SiO$_2$ | 40.1 |
| SiN$x$ | 116.2 |
| SiO$_2$ | 25.6 |
| SiN$x$ | 20.6 |
| SiO$_2$ | 73.1 |
| SiN$x$ | 24.9 |
| SiO$_2$ | 25.2 |
| SiN$x$ | 82.8 |
| SiO2 | 83.1 |

Figure 19:
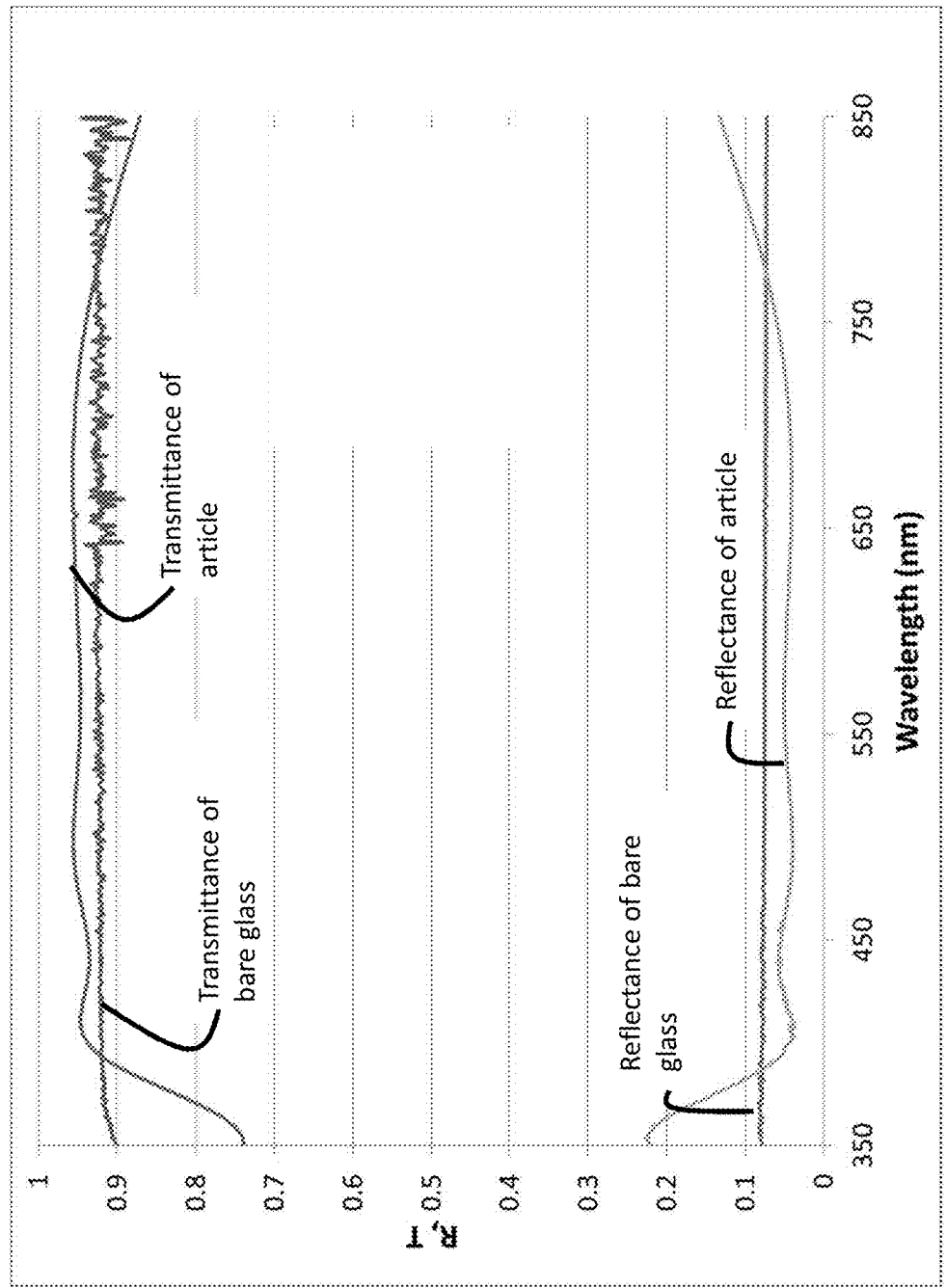
FIG. 19 is a transmittance and reflectance spectra for the article of Example 8.

The hardness and modulus of article of Example 8 was evaluated using the Berkovich Indenter Hardness Test. The article exhibited a hardness of 11.4 GPa and a modulus of 99 GPa. The roughness of the coated surface of the article was measured and exhibited Rq of 1.65 nm and an Ra of 1.31 nm. The optical properties of the bare glass substrate and the coated article were measured, as shown in FIG. 19. As shown in FIG. 19, the transmittance and reflectance of the article was even improved over the transmittance and reflectance, respectively, of the bare glass substrate. The single-surface reflected color values of the article measured at various viewing angles at the coated surface using a D65 illuminant are shown in Table 12.

TABLE 12

Reflected color values of Example 8.

| Reference | Incident illumination angle | | | |
|---|---|---|---|---|
| | 6 degrees s + p pol avg | 20 degrees s + p pol avg | 40 degrees s + p pol avg | 60 degrees s + p pol avg |
| x | 0.3175 | 0.3178 | 0.3098 | 0.3067 |
| y | 0.2674 | 0.2808 | 0.3598 | 0.3513 |
| L* | 9.41 | 9.81 | 12.5 | 25.99 |
| a* | 8.53 | 6.76 | −3.88 | −4.91 |
| b* | −5.73 | −4.46 | 2.48 | 2.32 |

Example 9

Example 9 included an article with the same substrate as Example 7, having a major surface, and coating structure disposed on the major surface. The substrate included a coated substrate having the coating structure shown in Table 13.

TABLE 13

Coating structure of Example 9.

| Material Glass | Physical thickness (nm) |
|---|---|
| SiNx | 7.7 |
| SiO$_2$ | 44.1 |
| SiNx | 22.8 |
| SiO$_2$ | 26.4 |
| SiNx | 38.4 |
| SiO$_2$ | 8.5 |
| SiNx | 2000 |
| SiO$_2$ | 17.2 |
| SiNx | 52.7 |
| SiO2 | 22.1 |
| SiNx | 154.8 |
| SiO2 | 83.2 |

Figure 20:
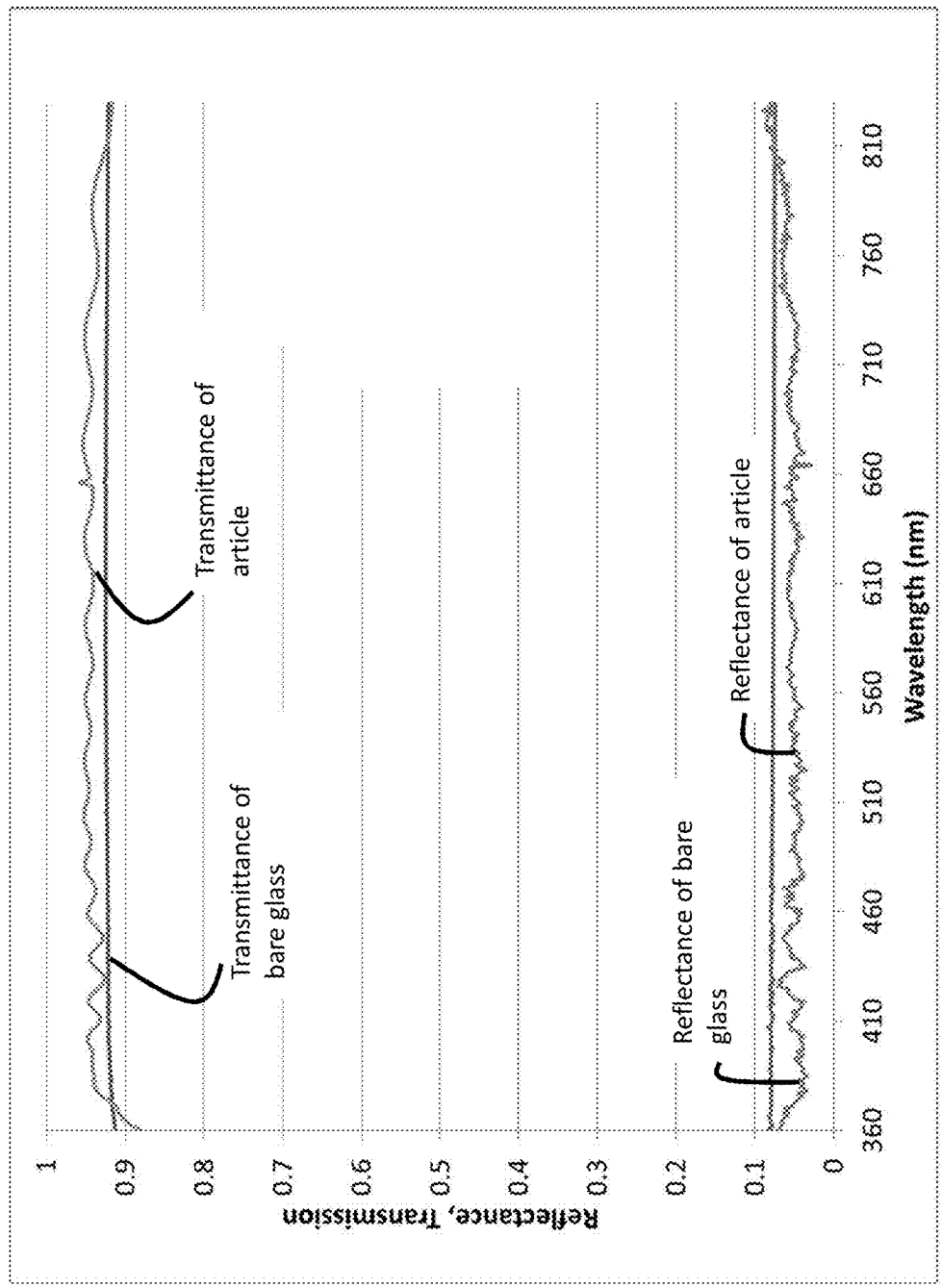
FIG. 20 is a transmittance and reflectance spectra for the article of Example 9.

The hardness and modulus of article of Example 9 was evaluated using the Berkovich Indenter Hardness Test. The article exhibited a hardness of 15.8 GPa and a modulus of 140 GPa. The roughness of the coated surface of the article was also measured and exhibited Rq of 3.31 nm and an Ra of 2.66 nm. The optical properties of the bare glass substrate and the coated article were, as shown in FIG. 20. As shown in FIG. 20, the transmittance and reflectance of the article was even improved over the transmittance and reflectance, respectively, of the bare glass substrate The single-surface reflected color values of the article measured at various viewing angles at the coated surface using a D65 illuminant are shown in Table 14.

TABLE 14

Reflected color values of Example 9.

| Reference | Incident illumination angle | | | |
|---|---|---|---|---|
| | 6 degrees s + p pol avg | 20 degrees s + p pol avg | 40 degrees s + p pol avg | 60 degrees s + p pol avg |
| x | 0.3306 | 0.3348 | 0.3379 | 0.3242 |
| y | 0.3095 | 0.3228 | 0.3585 | 0.3479 |
| L* | 12.05 | 12.67 | 16.5 | 30.77 |
| a* | 4.90 | 3.77 | −0.28 | −1.15 |
| b* | −1.31 | 0.19 | 4.25 | 3.41 |

Example 10

Example 10 included an article with the same substrate as Example 7, having a major surface, and coating structure disposed on the major surface. The substrate included a coated substrate having the coating structure shown in Table 15.

TABLE 15

Coating structure of Example 10.

| Material Glass | Physical thickness (nm) |
|---|---|
| SiNx | 9.2 |
| SiO$_2$ | 57.05 |
| SiNx | 27.89 |
| SiO$_2$ | 33.12 |
| SiNx | 51.62 |
| SiO$_2$ | 10 |
| SiNx | 2000 |
| SiO$_2$ | 10 |
| SiNx | 64.58 |
| SiO2 | 13.18 |
| SiNx | 90.15 |
| SiO2 | 10 |
| SiNx | 67.82 |
| SiO2 | 17.88 |
| SiNx | 167.3 |
| SiO2 | 80.44 |

Figure 21:
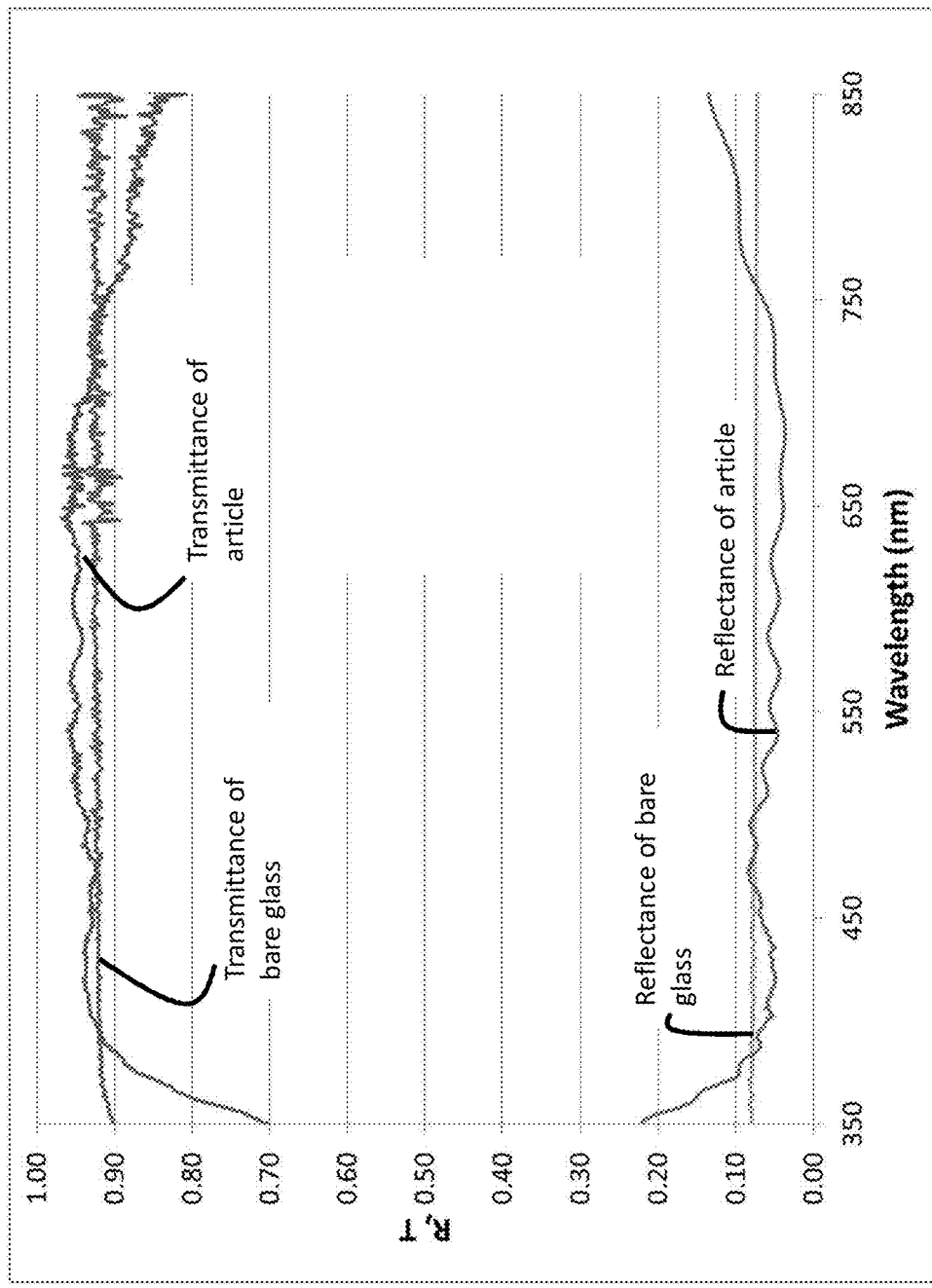
FIG. 21 is a transmittance and reflectance spectra for the article of Example 10.
Figure 22C:
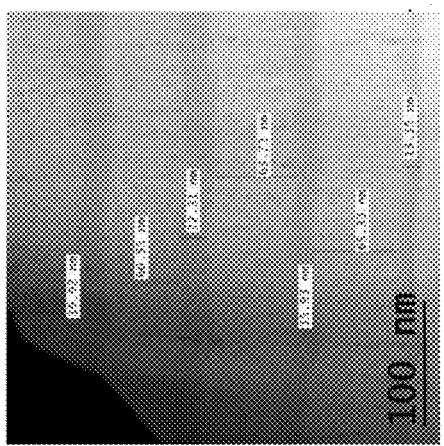
FIGS. 22A-22E are transmission electron microscopy (TEM) images of Example 10.
Figure 22B:
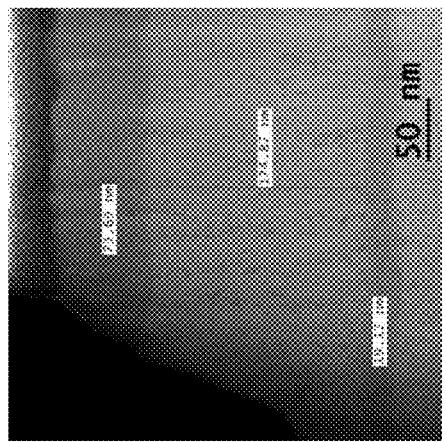
Figure 22E:
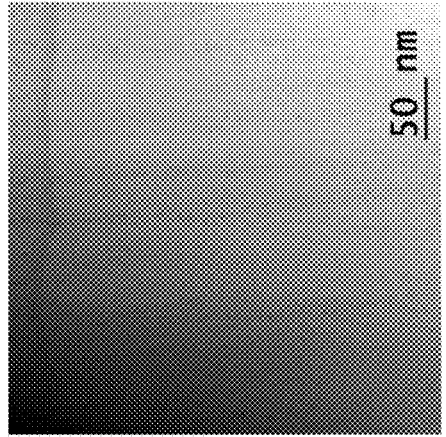
Figure 22D:
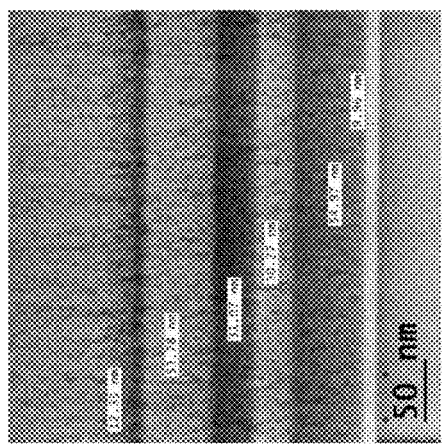
Figure 22A:
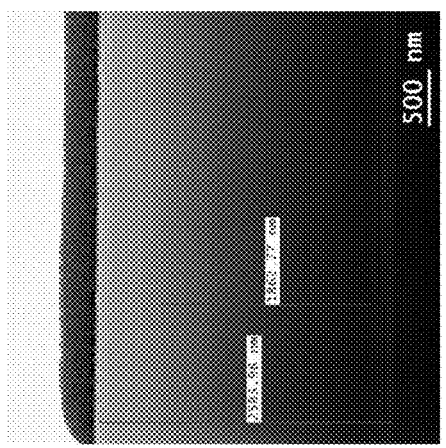

The hardness and modulus of article of Example 10 was evaluated using the Berkovich Indenter Hardness Test. The article exhibited a hardness of 16.6 GPa and a modulus of 151 GPa. The roughness of the coated surface of the article was measured and exhibited Rq of 3.65 nm and an Ra of 2.91 nm. The optical properties of the bare glass substrate and the coated article were measured, as shown in FIG. 21. As shown in FIG. 21, the transmittance and reflectance of the article is comparable with or even improved over the transmittance and reflectance, respectively, of the bare glass substrate. The single-surface reflected color values of the article measured at various viewing angles at the coated surface using a D65 illuminant are shown in Table 16.

TABLE 16

Reflected color values of Example 10.

| Reference | Incident illumination angle | | | |
|---|---|---|---|---|
| | 6 degrees s + p pol avg | 20 degrees s + p pol avg | 40 degrees s + p pol avg | 60 degrees s + p pol avg |
| x | 0.3299 | 0.3272 | 0.3178 | 0.3141 |
| y | 0.3451 | 0.3414 | 0.3367 | 0.3359 |
| L* | 18.57 | 18.96 | 21.77 | 34.06 |
| a* | 0.41 | 0.54 | −0.24 | −0.98 |
| b* | 2.54 | 1.98 | 0.96 | 0.85 |

The microstructure of the coating structure of Example 10 was evaluated using TEM. As shown in FIGS. 22A-22E, the layers were not completely dense and some pores were visible.

Figure 23:
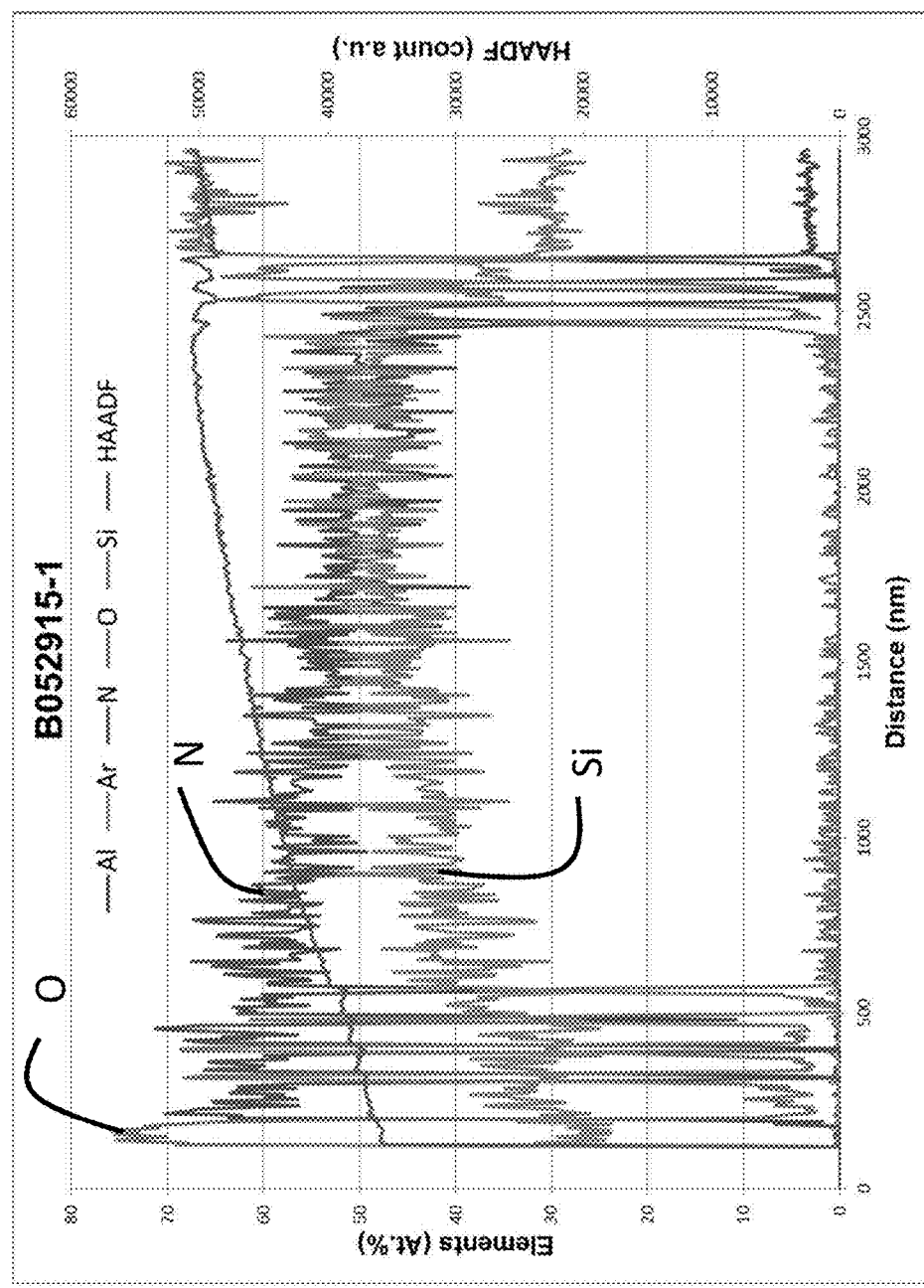
FIG. 23 is an Energy Dispersive X-Ray Spectrometry (EDS) spectra of the entire thickness of the coating structure of Example 10.
Figure 24:
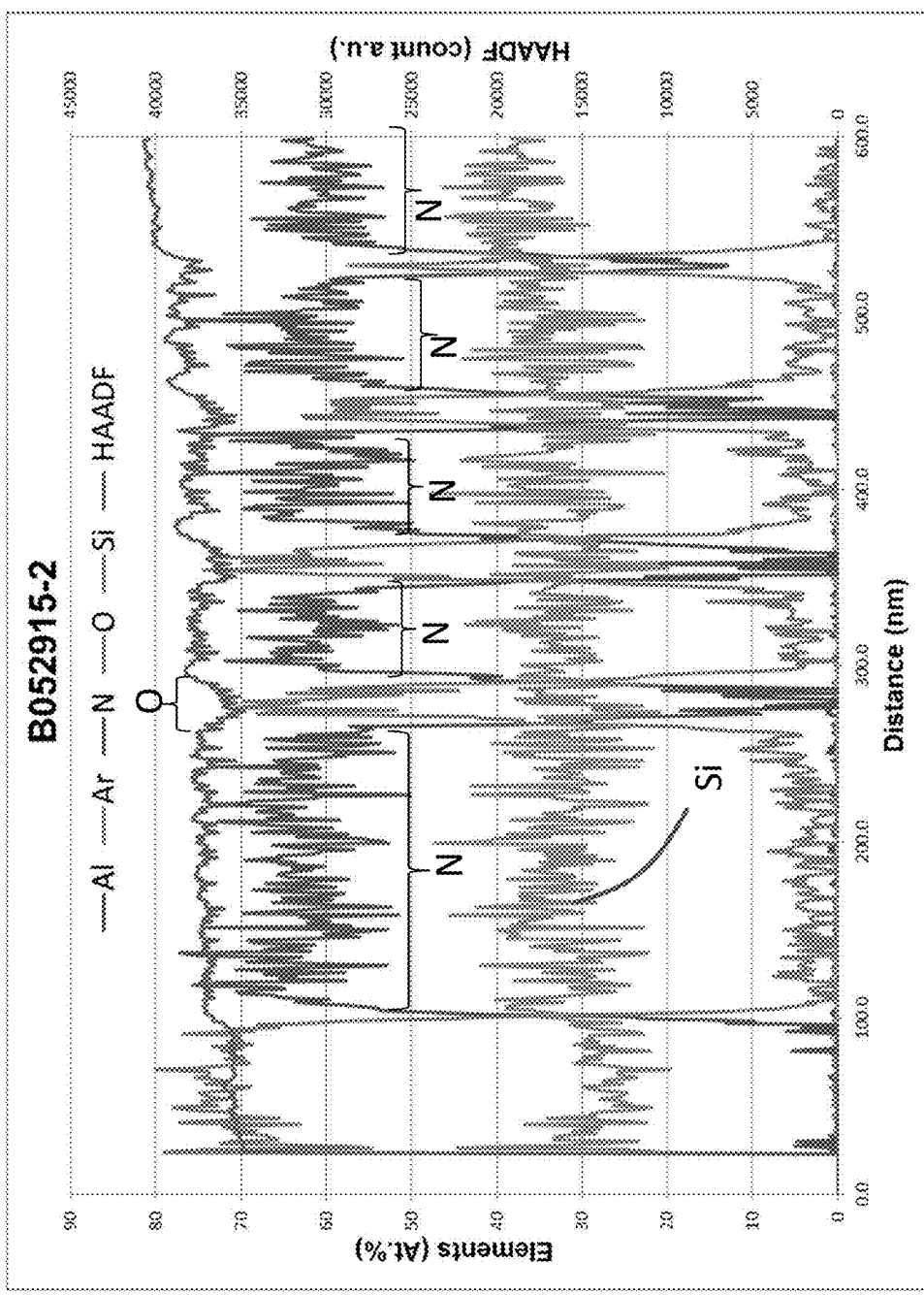
FIG. 24 is an EDS spectra of the first 600 nm thickness of the coating structure of Example 10.
Figure 25:
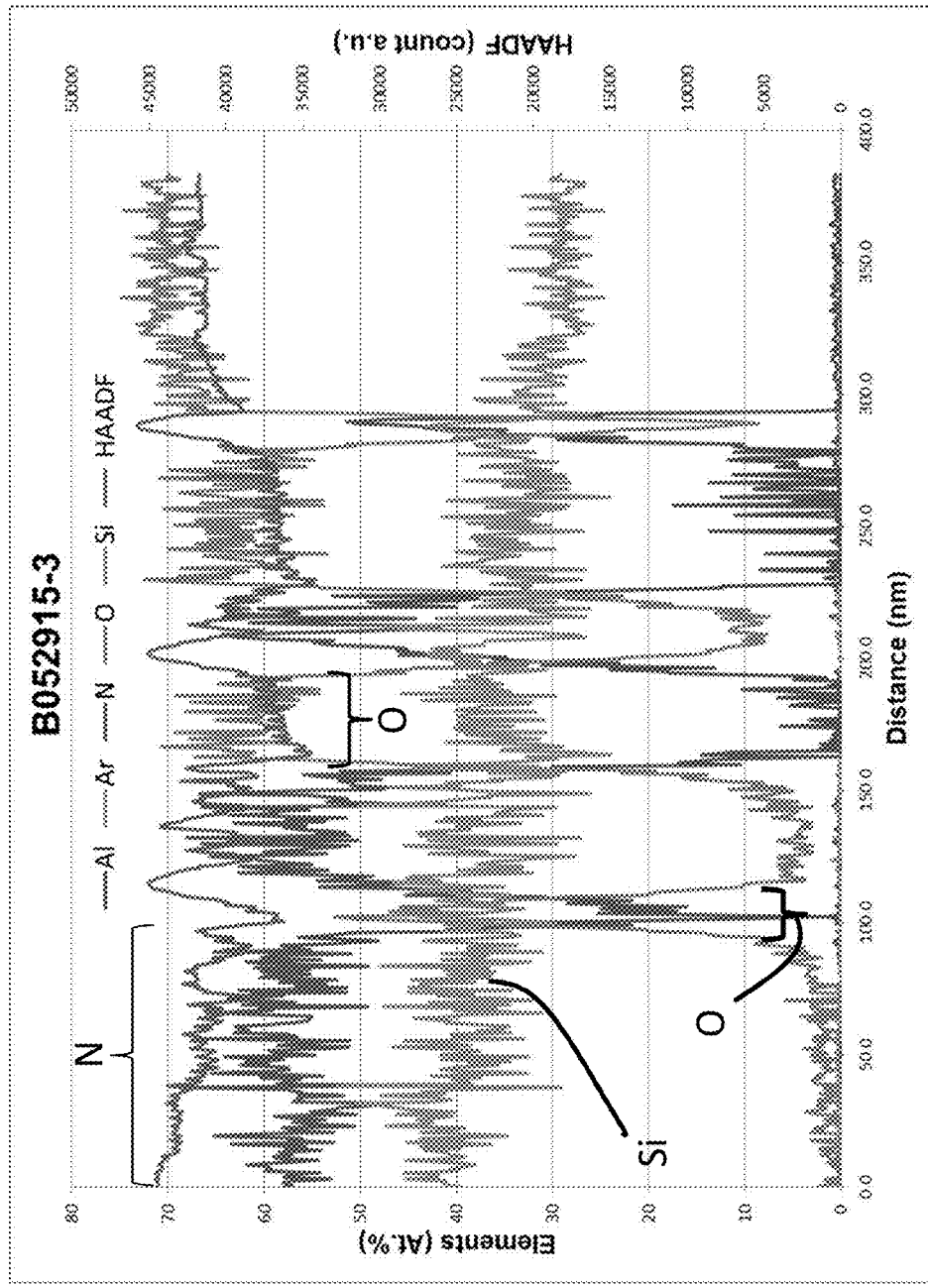
FIG. 25 is an EDS spectra of the first 400 nm thickness of the coating structure of Example 10.

The composition of the coating structure as a function of thickness was evaluated using EDS, as shown in FIGS. 23-25. FIG. 23 shows the entire thickness of the coating structure, FIG. 24 shows an enlarged view of the first 600 nm of the coating structure (from the glass) and FIG. 25 shows an enlarged view of the first 400 nm of the coating structure (from the glass). As shown more clearly in FIG. 24 and FIG. 25, the amount of Si is relatively constant along the thickness 0 nm to 600 nm. The amount of nitrogen and oxygen alternates with the different layers. For example, the first 100 nm have about 70-80 atomic % oxygen, with almost no nitrogen. Along a depth from 100 nm to about 250 nm, the amount of nitrogen is about 50-70 atomic % while the amount of oxygen is less than 10 atomic % along the same depth. The nitrogen and oxygen levels alternate in this manner as the layer compositions vary.

It will be apparent to those skilled in the art that various modifications and variations can be made without departing from the spirit or scope of the invention.

What is claimed is:

1. A coating material comprising:
   silicon, aluminum or a combination thereof;
   hydrogen; and
   at least one of oxygen, nitrogen, carbon, boron and fluorine,
   wherein the coating material exhibits a maximum hardness of about 17 GPa or greater, as measured by a Berkovich Indenter Test along an indentation depth of about 50 nm or greater, and
   wherein the coating material exhibits an optical band gap of about 3.5 eV or greater.

2. The coating material of claim 1, wherein
   the silicon, aluminum or a combination thereof is present in an amount of about 35 atomic % or greater; and
   the hydrogen is present in an amount in the range from about 1 atomic % to about 30 atomic %.

3. The coating material of claim 2, wherein the silicon is present in an amount in the range from about 37 atomic % to about 50 atomic %.

4. The coating material of claim 1, wherein the coating material comprises: nitrogen in an amount of about 30 atomic % or greater.

5. The coating material of claim 1, wherein the coating material comprises: nitrogen and, wherein hydrogen is present in an amount in the range from about 15 atomic % to about 28 atomic %.

6. The coating material of claim 1, further exhibiting a refractive index at a wavelength of about 632 nm in the range from about 1.8 to about 2.1.

7. The coating material of claim 3, further comprising the compositional ratio of the amount of nitrogen (in atomic %) to the amount of silicon (in atomic %) of about 0.8 or greater.

8. The coating material of claim 1, further comprising the compositional ratio of the combined amount of carbon (in atomic %), oxygen (in atomic %) and fluorine (in atomic %) to the amount of anions of less than about 0.2.

9. The coating material of claim 1, further comprising a non-zero amount of oxygen up to about 7.5 atomic %.

10. The coating material of claim 1, further comprising a non-zero amount of carbon up to about 10 atomic %.

11. The coating material of claim 1, further comprising a non-zero amount of fluorine up to about 5 atomic %.

12. The coating material of claim 1, further exhibiting a hardness of about 19 GPa or greater.

13. The coating material of claim 1, further exhibiting an absorptivity coefficient at a wavelength of about 632 nm or about 0.2 or less.

14. An article comprising:
    a substrate having a major surface; and
    a coating structure disposed on the major surface forming a coated surface, the coating structure comprising at least one of silicon, aluminum, hydrogen, oxygen, nitrogen, boron, fluorine and carbon,
    wherein the article or the coating structure exhibits an optical band gap of about 3.5 eV or greater, and
    wherein the article exhibits a maximum hardness of about 17 GPa or greater, as measured on the coated surface by a Berkovich Indenter Test along an indentation depth of about 50 nm or greater, and
    wherein the article exhibits an average transmittance of about 85% or greater over an optical wavelength regime in the range from about 400 nm to about 800 nm.

15. The article of claim 14, wherein the article exhibits a transmittance of about 92% or greater over the optical wavelength regime.

16. The article of claim 14, wherein the coating structure comprises a thickness of about 1000 nm or greater.

17. The article of claim 16, wherein the thickness is about 2000 nm or greater.

18. The article of claim 14, wherein the coating structure comprises a plasma-enhanced chemical vapor deposited-coating structure.

19. The article of claim 14, wherein the article exhibits one or more of:
    article transmittance color coordinates in the (L*, a*, b*) colorimetry system at normal incidence under an International Commission on Illumination illuminant exhibiting a reference point color shift of less than about 2 from a reference point as measured at the coated surface, and
    article reflectance color coordinates in the (L*, a*, b*) colorimetry system at normal incidence under an International Commission on Illumination illuminant exhibiting a reference point color shift of less than about 5 from a reference point as measured at the surface,
    wherein the reference point comprising at least one of the color coordinates (a*=0, b*=0), the color coordinates (a*=−2, b*=−2), and the reflectance color coordinates of the substrate,
    wherein, when the reference point is the color coordinates (a*=0, b*=0), the reference point color shift is defined by $\sqrt{((a^*_{article})^2+(b^*_{article})^2)}$,
    wherein, when the reference point is the color coordinates (a*=−2, b*=−2), the reference point color shift is defined by $\sqrt{((a^*_{article}+2)^2+(b^*_{article}+2)^2)}$, and
    wherein, when the reference point is the color coordinates of the substrate, the reference point color shift is defined by $\sqrt{((a^*_{article}-a^*_{substrate})^2+(b^*_{article}-b^*_{substrate})^2)}$.

20. The article of claim 14, wherein the article exhibits an angular color shift of about 5 or less at an incident illumination angle that is 20 degrees or greater, referenced to reference incident illumination angle, under an International Commission on Illumination illuminant selected from the group consisting of A series illuminants, B series illuminants, C series illuminants, D series illuminants, and F series illuminants, wherein angular color shift is calculated using the equation $\sqrt{((a^*_2-a^*_1)^2+(b^*_2-b^*_1)^2)}$, with $a^*_1$, and $b^*_1$ representing the coordinates of the article when viewed at the reference incident illumination angle and $a^*_2$, and $b^*_2$ representing the coordinates of the article when viewed at the incident illumination angle, and wherein the reference incident illumination angle is 6 degrees.

* * * * *

UNITED STATES PATENT AND TRADEMARK OFFICE
CERTIFICATE OF CORRECTION

Page 1 of 2

PATENT NO. : 10,837,103 B2
APPLICATION NO. : 15/696559
DATED : November 17, 2020
INVENTOR(S) : Kaveh Adib et al.

It is certified that error appears in the above-identified patent and that said Letters Patent is hereby corrected as shown below:

On the Title Page

In Column 2, item (56), Other Publications, Line 3, delete "Material,&npsp;" and insert -- Material,  --, therefor.

In Column 2, item (56), Other Publications, Line 6, delete "filnns"," and insert -- films", --, therefor.

On page 3, in Column 1, item (56), U.S. Patent documents, Line 69, delete "Fukavva" and insert -- Fukawa --, therefor.

On page 4, in Column 1, item (56), U.S. Patent documents, Line 48, delete "1194257 81" and insert -- 1194257 B1 --, therefor.

On page 4, in Column 2, item (56), Other Publications, Line 4, delete ""Chennical" and insert -- "Chemical --, therefor.

On page 4, in Column 2, item (56), Other Publications, Line 19, delete "38-42. ." and insert -- 38-42. --, therefor.

On page 4, in Column 2, item (56), Other Publications, Line 24, delete "nanolamianted" and insert -- nanolaminated --, therefor.

On page 4, in Column 2, item (56), Other Publications, Line 39, delete "Sceince" and insert -- Science --, therefor.

On page 4, in Column 2, item (56), Other Publications, Line 70, delete "34)6)," and insert -- 346, --, therefor.

On page 5, in Column 1, item (56), Other Publications, Line 49, delete "Incluence" and insert -- Influence --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,837,103 B2

On page 5, in Column 2, item (56), Other Publications, Line 20, delete "Interconects" and insert -- Interconnects --, therefor.

On page 5, in Column 2, item (56), Other Publications, Line 22, delete "consideratino" and insert -- consideration --, therefor.

On page 5, in Column 2, item (56), Other Publications, Line 50, delete "Characatization" and insert -- Characterization --, therefor.

On page 5, in Column 2, item (56), Other Publications, Line 51, delete "Physices" and insert -- Physics --, therefor.

On page 5, in Column 2, item (56), Other Publications, Line 59, delete "Ceramiczynych," and insert -- Ceramicznych, --, therefor.

On page 5, in Column 2, item (56), Other Publications, Line 61, delete "er" and insert -- et --, therefor.

On page 6, in Column 1, item (56), Other Publications, Line 20, delete "notride" and insert -- nitride --, therefor.

On page 6, in Column 2, item (56), Other Publications, Line 7, delete "-Stabilzed" and insert -- -Stabilized --, therefor.

On page 6, in Column 2, item (56), Other Publications, Line 34, delete "oxyynitride" and insert -- oxynitride --, therefor.